(12) United States Patent
Kimura et al.

(10) Patent No.: US 9,099,374 B2
(45) Date of Patent: Aug. 4, 2015

(54) DISPLAY DEVICE AND ELECTRONIC DEVICE

(71) Applicant: Semiconductor Energy Laboratory Co., Ltd., Kanagawa-ken (JP)

(72) Inventors: Hajime Kimura, Kanagawa (JP); Atsushi Miyaguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/962,671

(22) Filed: Aug. 8, 2013

(65) Prior Publication Data
US 2014/0014949 A1    Jan. 16, 2014

Related U.S. Application Data

(60) Continuation of application No. 13/612,351, filed on Sep. 12, 2012, now Pat. No. 8,629,612, which is a division of application No. 13/182,167, filed on Jul. 13, 2011, now Pat. No. 8,278,817, which is a division of application No. 11/527,125, filed on Sep. 26, 2006, now Pat. No. 7,982,385.

(30) Foreign Application Priority Data

Sep. 30, 2005 (JP) .................................. 2005-288373

(51) Int. Cl.
*H01L 27/15* (2006.01)
*H01L 27/32* (2006.01)
(Continued)

(52) U.S. Cl.
CPC ............ *H01L 27/15* (2013.01); *H01L 27/3213* (2013.01); *G09G 3/2003* (2013.01);
(Continued)

(58) Field of Classification Search
CPC ......... H01L 51/5152; G09G 3/20; G09G 5/02
USPC ................ 313/498–512; 315/169.3; 362/609, 362/249.02
See application file for complete search history.

(56) References Cited

U.S. PATENT DOCUMENTS 4,800,375 A    1/1989    Silverstein et al.
5,294,869 A    3/1994    Tang et al.
(Continued)

FOREIGN PATENT DOCUMENTS

CN    1637834 A    7/2005
EP    0 616 488 A2    9/1994
(Continued)

OTHER PUBLICATIONS

Office Action re Korean application No. KR 10-2006-0094536, dated Jan. 9, 2013 (with English translation).
(Continued)

*Primary Examiner* — Tracie Y Green
(74) *Attorney, Agent, or Firm* — Husch Blackwell LLP

(57) ABSTRACT

To improve color reproduction areas in a display device having light-emitting elements. A display region has a plurality of picture elements. Each picture element includes: first and second pixels each including a light-emitting element which has a chromaticity whose x-coordinate in a CIE-XY chromaticity diagram is 0.50 or more; third and fourth pixels each including a light-emitting element which has a chromaticity whose y-coordinate in the diagram is 0.55 or more; and fifth and sixth pixels each including a light-emitting element which has a chromaticity whose x-coordinate and y-coordinate in the diagram are 0.20 or less and 0.25 or less, respectively. The light-emitting elements in the first and second pixels have different emission spectrums from each other; the light-emitting elements in the third and fourth pixels have different emission spectrums from each other; and the light-emitting elements in the fifth and sixth pixels have different emission spectrums from each other.

16 Claims, 60 Drawing Sheets

(51) Int. Cl.
*G09G 3/20* (2006.01)
*G09G 3/32* (2006.01)

(52) U.S. Cl.
CPC ............ *G09G3/2074* (2013.01); *G09G 3/3208* (2013.01); *G09G 2300/0452* (2013.01); *H01L 27/326* (2013.01); *H01L 27/3216* (2013.01); *H01L 27/3218* (2013.01)

(56) References Cited

U.S. PATENT DOCUMENTS

| | | | |
|---|---|---|---|
| 5,554,911 | A | 9/1996 | Nakayama et al. |
| 6,366,025 | B1 | 4/2002 | Yamada |
| 6,589,673 | B1 | 7/2003 | Kido et al. |
| 6,610,613 | B2 | 8/2003 | Kakkad |
| 6,806,925 | B2 | 10/2004 | Ishii et al. |
| 6,810,919 | B2 | 11/2004 | Seki et al. |
| 6,842,170 | B1 * | 1/2005 | Akins et al. ............... 345/173 |
| 6,870,523 | B1 | 3/2005 | Ben-David et al. |
| 6,948,533 | B2 | 9/2005 | Seki et al. |
| 6,998,770 | B2 | 2/2006 | Chae et al. |
| 7,113,152 | B2 | 9/2006 | Ben-David et al. |
| 7,133,049 | B2 | 11/2006 | Lee et al. |
| 7,221,092 | B2 | 5/2007 | Anzai et al. |
| 7,312,099 | B2 | 12/2007 | Chae et al. |
| 7,439,667 | B2 | 10/2008 | Ohtani |
| 7,453,426 | B2 | 11/2008 | Yamazaki |
| 7,545,395 | B2 | 6/2009 | Kurumisawa |
| 7,898,166 | B2 | 3/2011 | Ohtani |
| 7,944,423 | B2 | 5/2011 | Kurumisawa |
| 7,948,162 | B2 * | 5/2011 | Smith ....................... 313/503 |
| 8,242,979 | B2 | 8/2012 | Anzai et al. |
| 8,373,629 | B2 | 2/2013 | Noguchi et al. |
| 2003/0063062 | A1 | 4/2003 | Tsumura et al. |
| 2003/0107537 | A1 | 6/2003 | Ochi et al. |
| 2004/0113875 | A1 | 6/2004 | Miller et al. |
| 2004/0246404 | A1 | 12/2004 | Elliott et al. |
| 2005/0052127 | A1 * | 3/2005 | Sakata et al. ............... 313/506 |
| 2005/0110723 | A1 | 5/2005 | Shin |
| 2005/0116615 | A1 | 6/2005 | Matsumoto et al. |
| 2005/0127380 | A1 * | 6/2005 | Kawasaki et al. ............ 257/84 |
| 2005/0127819 | A1 | 6/2005 | Ohtani |
| 2005/0142976 | A1 | 6/2005 | Suzuki |
| 2005/0173700 | A1 | 8/2005 | Liao et al. |
| 2005/0197031 | A1 | 9/2005 | Yamazaki et al. |
| 2005/0264498 | A1 | 12/2005 | Asano |
| 2005/0268984 | A1 | 12/2005 | Seki et al. |
| 2005/0270444 | A1 | 12/2005 | Miller et al. |
| 2006/0170712 | A1 * | 8/2006 | Miller et al. ............... 345/695 |
| 2006/0175966 | A1 | 8/2006 | Yamada et al. |
| 2007/0024529 | A1 | 2/2007 | Ben-David et al. |
| 2007/0085789 | A1 | 4/2007 | De Vaan |
| 2009/0033230 | A1 | 2/2009 | Ohtani |
| 2009/0073093 | A1 | 3/2009 | Yamazaki |
| 2011/0148285 | A1 | 6/2011 | Ohtani |
| 2013/0032808 | A1 | 2/2013 | Anzai et al. |
| 2013/0106278 | A1 | 5/2013 | Noguchi et al. |

FOREIGN PATENT DOCUMENTS

| | | | |
|---|---|---|---|
| EP | 1 032 045 | A2 | 8/2000 |
| EP | 1 089 361 | A2 | 4/2001 |
| EP | 1 154 676 | A1 | 11/2001 |
| EP | 1 465 461 | A1 | 10/2004 |
| EP | 1 536 406 | A1 | 6/2005 |
| EP | 1 705 635 | A2 | 9/2006 |
| EP | 1 837 851 | A2 | 9/2007 |
| JP | 06-260287 | A | 9/1994 |
| JP | 6-275381 | | 9/1994 |
| JP | 2000-206486 | A | 7/2000 |
| JP | 2001-110574 | A | 4/2001 |
| JP | 2001-244079 | A | 9/2001 |
| JP | 2001-244259 | A | 9/2001 |
| JP | 2001-290441 | | 10/2001 |
| JP | 2003-77663 | | 3/2003 |
| JP | 2003-108020 | A | 4/2003 |
| JP | 2003-249174 | | 9/2003 |
| JP | 2004-119525 | A | 4/2004 |
| JP | 2004-317726 | A | 11/2004 |
| JP | 2005-026237 | A | 1/2005 |
| JP | 2005-62833 | | 3/2005 |
| JP | 2005-156925 | | 6/2005 |
| JP | 2005-157258 | A | 6/2005 |
| JP | 2005-197239 | | 7/2005 |
| JP | 2005-227762 | A | 8/2005 |
| JP | 2005-234037 | A | 9/2005 |
| JP | 2006-309118 | A | 11/2006 |
| JP | 2007-515662 | | 6/2007 |
| KR | 2003-0086166 | | 11/2003 |
| KR | 10-2005-0031888 | | 4/2005 |
| TW | 200306681 | | 11/2003 |
| TW | 576937 | | 2/2004 |
| WO | WO 01/39554 | A1 | 5/2001 |
| WO | WO 01/95544 | A2 | 12/2001 |
| WO | WO 2004/061807 | A1 | 7/2004 |
| WO | WO 2005/031693 | A1 | 4/2005 |

OTHER PUBLICATIONS

Yamada, J. et al, "Micro Cavity Structures for Full Color AM-OLED Displays," AM-LCD '02 Digest of Technical Papers, Jul. 10, 2002, pp. 77-80.

Roosendaal, S.J. et al, "25.2: A Wide Gamut, High Aperture Mobile Spectrum Sequential Liquid Crystal Display," SID Digest '05: SID International Symposium Digest of Technical Papers, vol. 36, May 5, 2005, pp. 1116-1119.

Jak, M.J.J., et al, "25.3: Spectrum Sequential Liquid Crystal Display," SID Digest '05: SID International Symposium Digest of Technical Papers, vol. 36, May 25, 2005, pp. 1120-1123.

Sugiura, H. et al, "25.4: Six-Primary-Color 23-in WXGA LCD Using Six-Color LEDs," SID Digest '05: SID International Symposium Digest of Technical Papers, vol. 36, May 25, 2005, pp. 1124-1127.

Yang, Y.-C. et al, "31.1: Development of Six Primary-Color LCD," SID Digest '05: SID International Symposium Digest of Technical Papers, vol. 36, May 25, 2005, pp. 1210-1213.

Kim, S.S., "66.1: Invited Paper: The World's Largest (82-in.) TFT-LCD," SID Digest '05: SID International Symposium Digest of Technical Papers, vol. 36, May 25, 2005, pp. 1842-1847.

Office Action re Chinese application No. CN 200610141279.0, dated Dec. 18, 2009 (with English translation).

Search Report re European application No. EP 06019181.4, dated Nov. 21, 2011.

Office Action re Taiwanese application No. TW 95134046, dated Jan. 30, 2013 (with English translation).

Office Action re Korean application No. KR 1-2006-0094536, dated Jul. 29, 2013 (with English translation).

Korean Office Action re Application No. KR 2014-0029589, dated May 26, 2014.

Korean Office Action re Application No. KR 2014-0029589, dated Dec. 4, 2014.

Taiwanese Office Action re Application No. TW 102132558, dated Dec. 11, 2014.

* cited by examiner

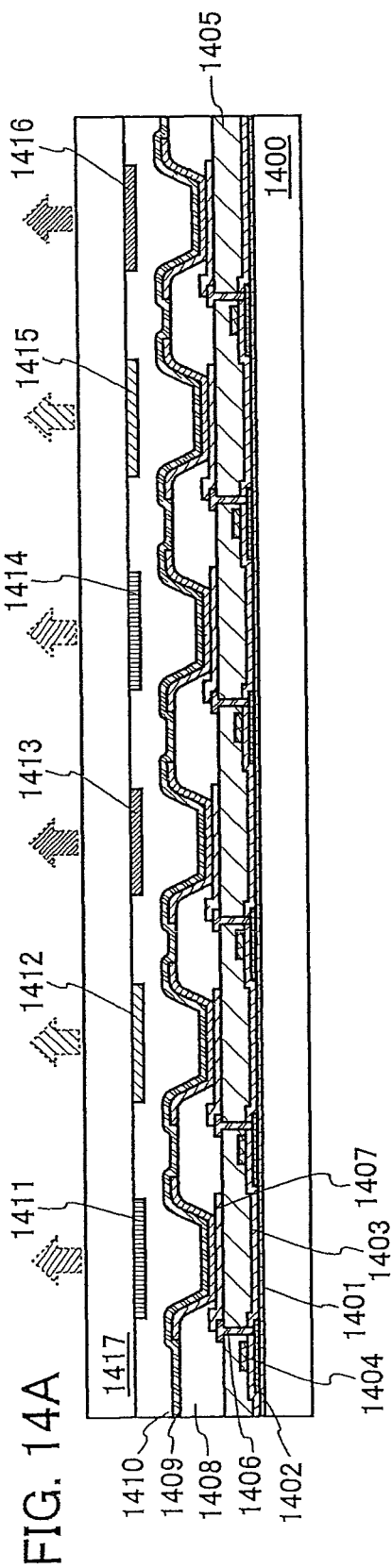
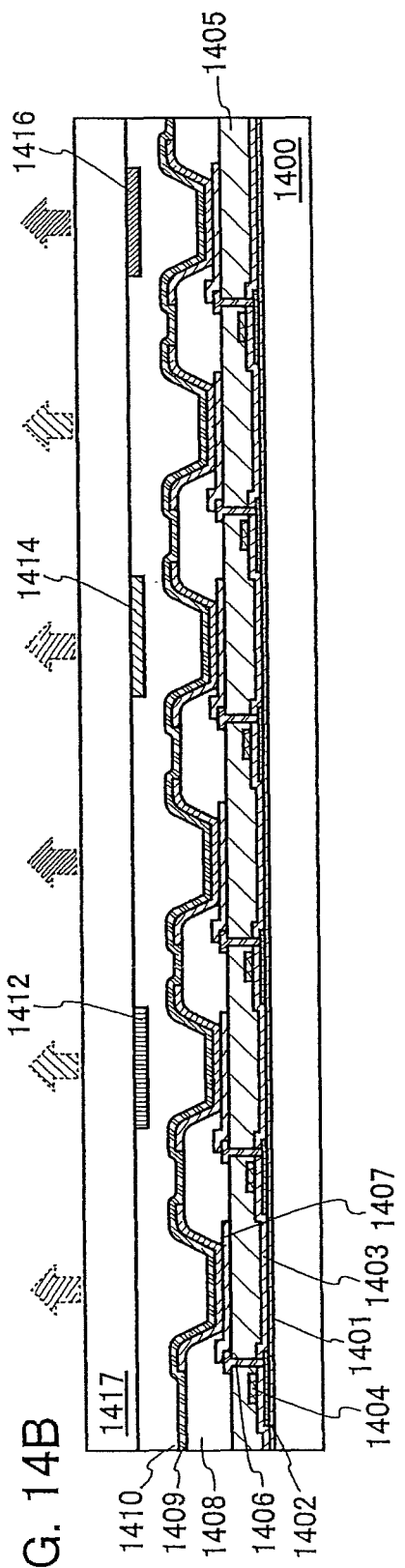

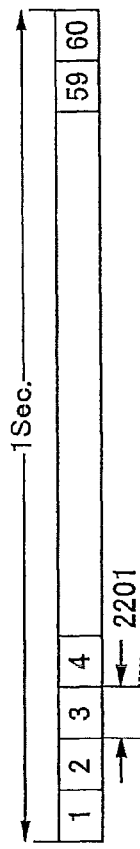
FIG. 22A
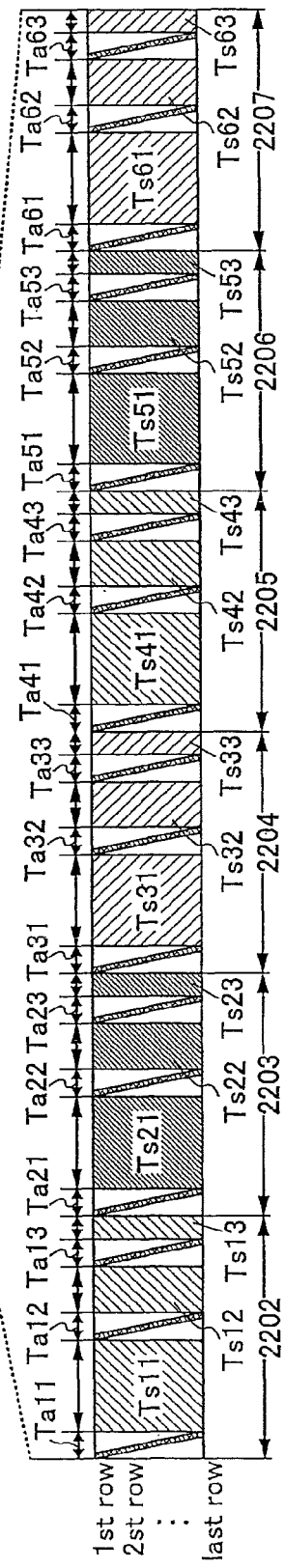
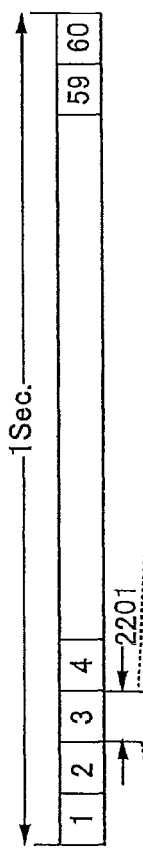
FIG. 22B
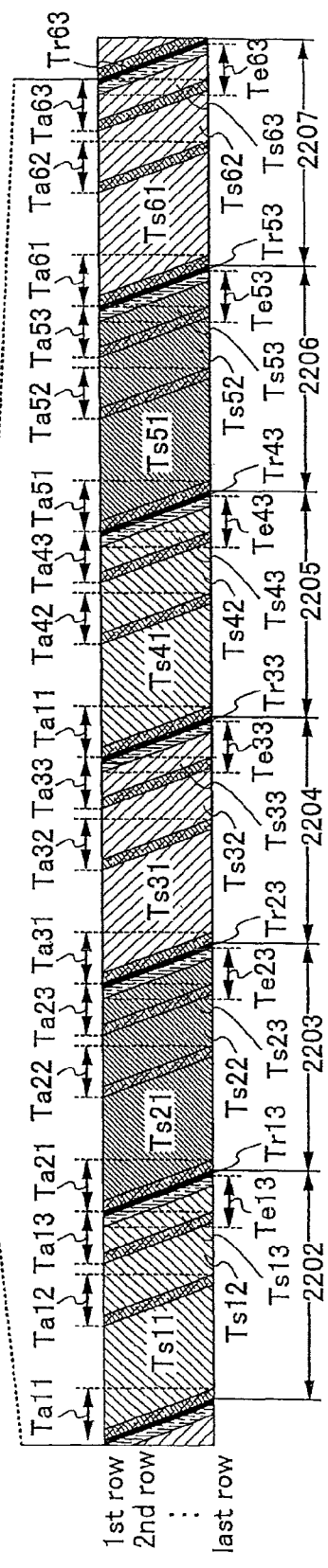

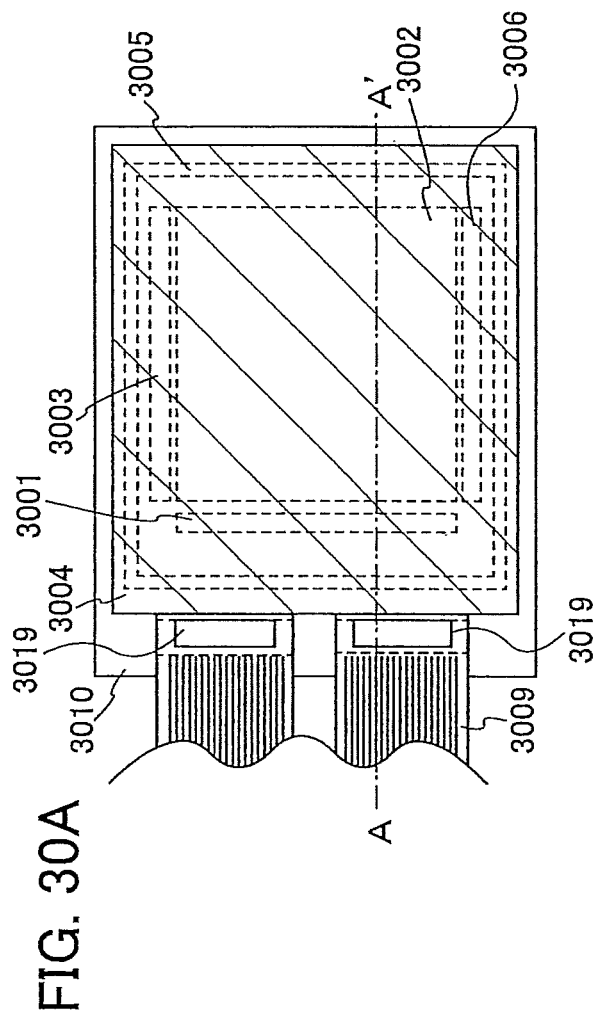
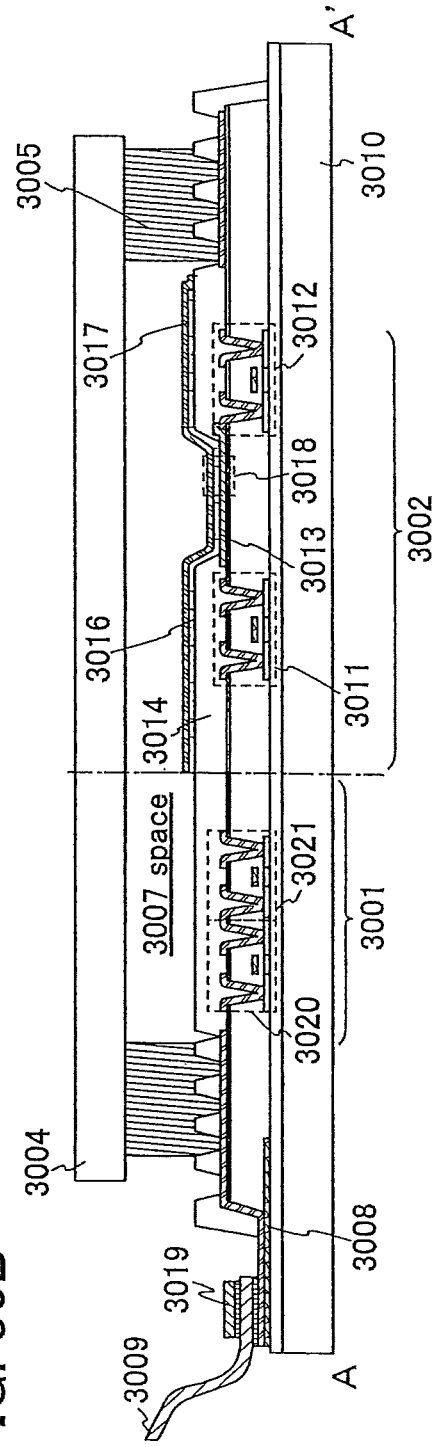
FIG. 30A
FIG. 30B

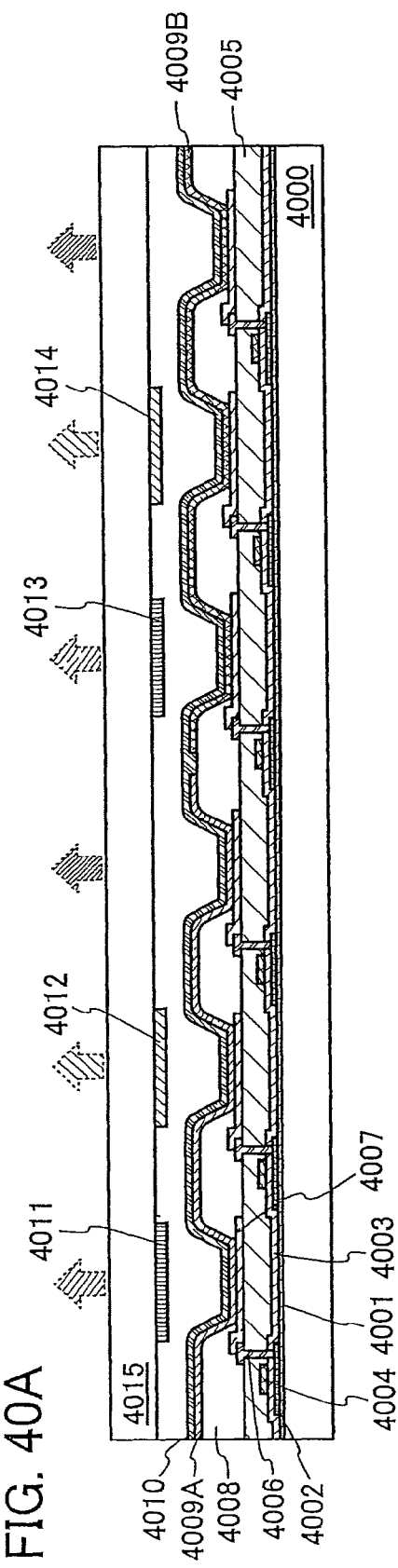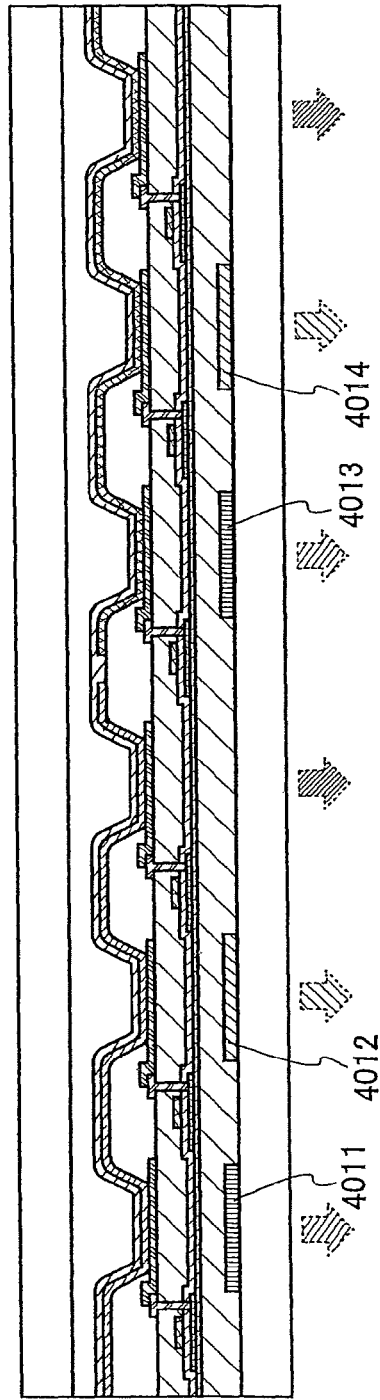
FIG. 40A
FIG. 40B

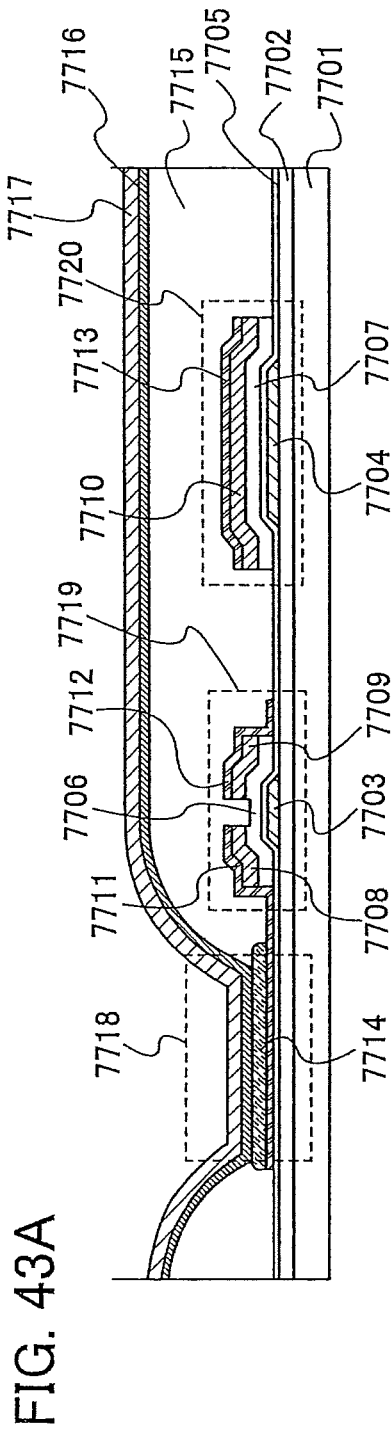
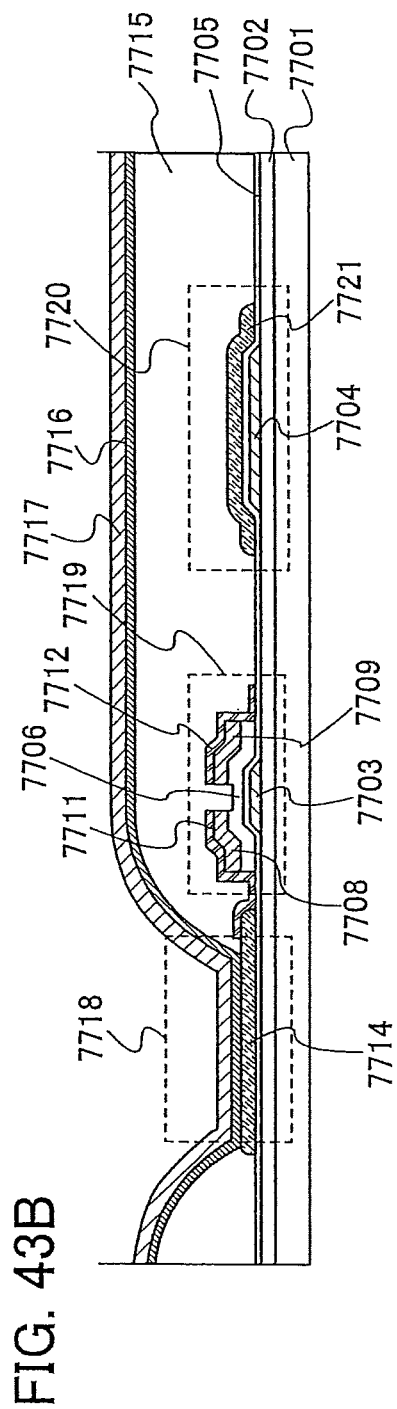
FIG. 43A
FIG. 43B 1202 1204
1201 1203 1205

1201 1203 1205
1202 1204

1201 1203 1205
1202 1204

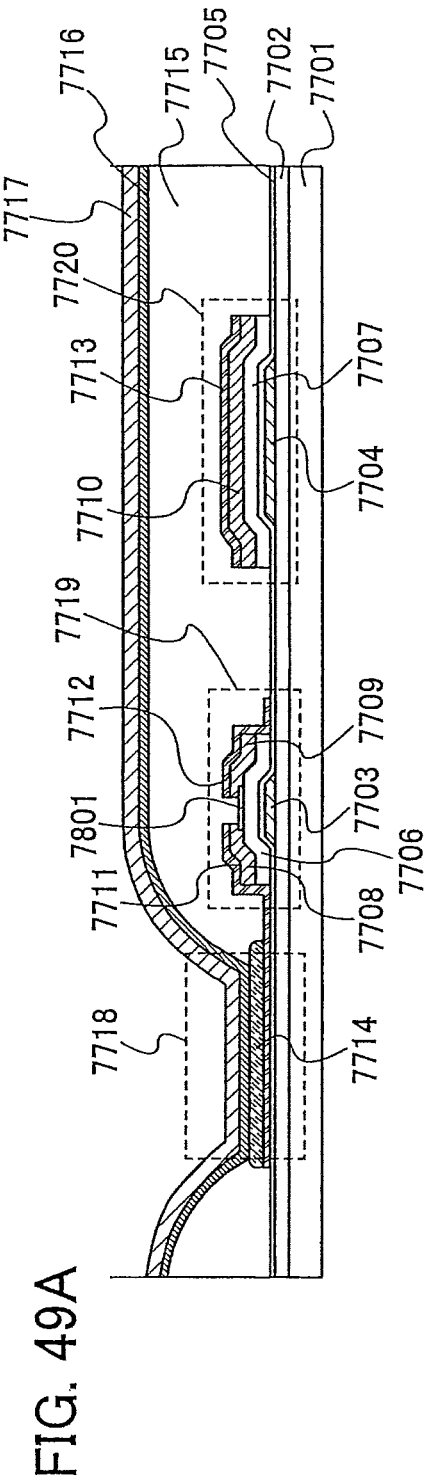
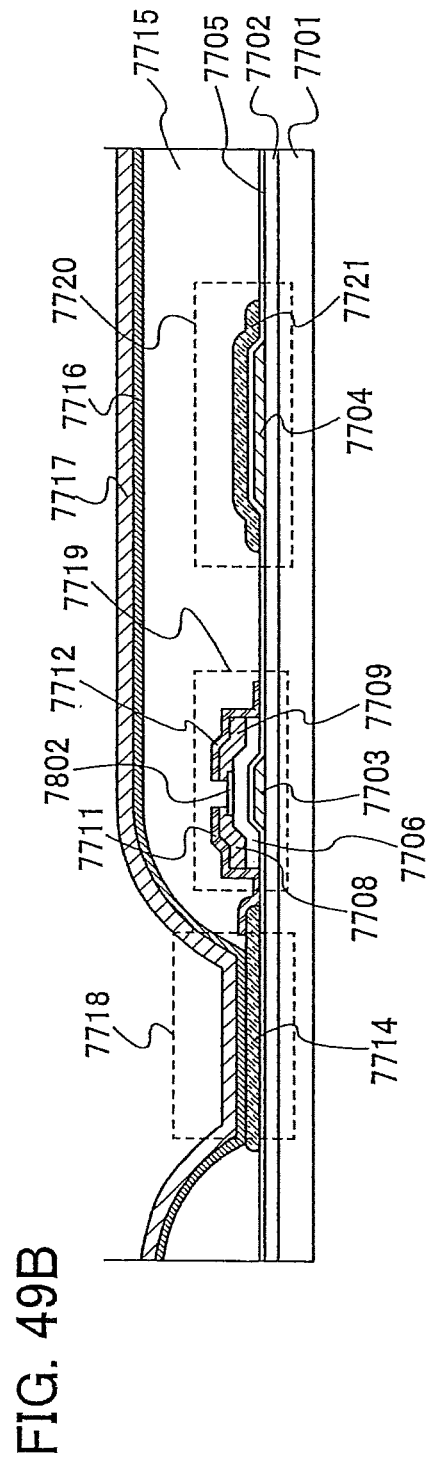
FIG. 49A
FIG. 49B

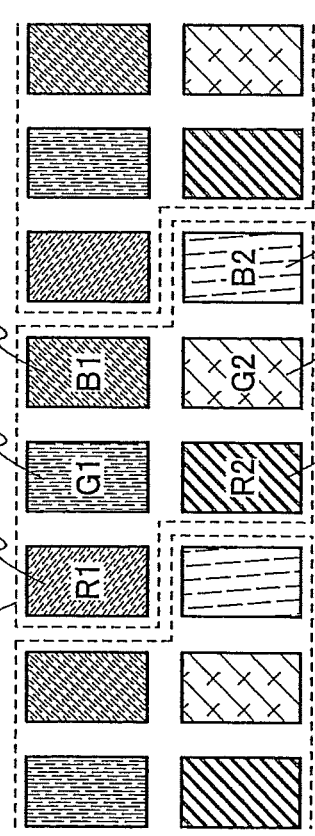
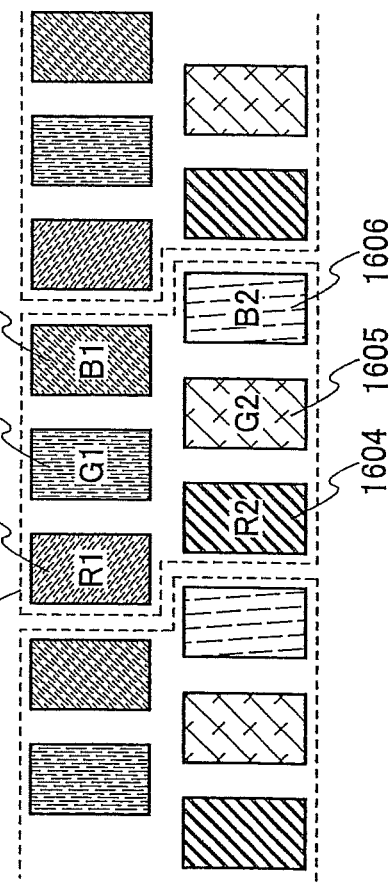
FIG. 53A
FIG. 53B

1201 / 1203 / 1205
1202  1204

1201 / 1203 / 1205
1202  1204

DISPLAY DEVICE AND ELECTRONIC DEVICE

This application is a continuation of application Ser. No. 13/612,351 filed on Sep. 12, 2012 which is a continuation of application Ser. No. 13/182,167 filed on Jul. 13, 2011 (now U.S. Pat. No. 8,278,817 issued Oct. 2, 2012) which is a divisional of application Ser. No. 11/527,125 filed on Sep. 26, 2006 (now U.S. Pat. No. 7,982,385 issued Jul. 19, 2011), all of which are incorporated herein by reference.

BACKGROUND OF THE INVENTION

1. Field of the Invention

The present invention relates to a display device equipped with a light-emitting element or an electro-optical element in a pixel. In particular, the present invention relates to a display device having a layer including an organic material, a fluorescent material, or a phosphorescent material in the light-emitting element.

2. Description of the Related Art

A display device having a light-emitting element which includes a layer of an organic material between a pair of electrodes and emits light when a current is supplied between the electrodes has been developed. Such a display device has an advantage in reducing thickness and weight, has high visibility due to the self-luminance, and has high response speed. In addition, since power consumption of such a display device may potentially be made very small, it has been actively developed as a device of next generation, and some of such devices have been put into practical use.

In the display device using the light-emitting element having the aforementioned configuration, high image quality and widening of a color gamut have been expected. For example, a display device which can reproduce and display accurate colors in editing in a printing operation, seeing and listening to a work of art, movies, or the like, and catching a real color exactly in telemedicine, has been strongly expected. In view of this, in order to improve a color gamut which can be viewed by human eyes, research to optimize a structure such as improvement of color purity and widening of a color gamut has been carried out (for example, see Reference 1: Published Japanese translation of PCT International Publication for Patent Application No. 2001-039554).

However, there is still a surplus in a color gamut which can be viewed by human eyes, and thus, a color reproduction area of a display device so far is still insufficient. FIG. 39 shows the CIE-XY chromaticity diagram which is established by COMMISSION INTERNATIONALE DE L'ECLAIRAGE (INTERNATIONAL COMMISSION ON ILLUMINATION: CIE) managing standards of color internationally. In an outer boundary of the diagram, a point which is near the rightmost end corresponds to an emission spectrum of 700 nm of red monochromatic light; a point which is near the uppermost end corresponds to an emission spectrum of 546.1 nm of green monochromatic light; and a point which is near the lowermost end corresponds to an emission spectrum of 435.8 nm of blue monochromatic light. In this chromaticity diagram, brightness (chroma) is lower in the inner side since the outer boundary of the graph (a visible area) corresponds to an emission spectrum of monochromatic light while the inner side thereof corresponds to a combination color obtained by combining different kinds of monochromatic light. In the case of expressing a color by an additive color mixture, a plurality of standard colors can reproduce only a color which lies in a position surrounded with a polygon formed of points which are shown in the CIE-XY chromaticity diagram.

When red (R) is shown by the CIE-XY chromaticity diagram, human eyes can perceive a color which has a coordinate near a right region of the chromaticity diagram (a region surrounded with the circumference of the chromaticity diagram and a dotted line 3901 in FIG. 39) as red. In addition, when green (G) is shown by the CIE-XY chromaticity diagram, human eyes can perceive a color which has a coordinate near an upper region of the chromaticity diagram (a region surrounded with the circumference of the chromaticity diagram and a dotted line 3902 in FIG. 39) as green. When blue (B) is shown by the CIE-XY chromaticity diagram, human eyes can perceive a color which has a coordinate near a lower region of the chromaticity diagram (a region surrounded with the circumference of the chromaticity diagram and dotted lines 3903 and 3904 in FIG. 39) as blue. As a specific example, a hi-vision (high definition television broadcasting; HDTV) standard can be given, which has chromaticity coordinates of R ($x=0.67$, $y=0.33$), G ($x=0.21$, $y=0.71$), and B ($x=0.14$, $y=0.08$) (a triangle 3905 in FIG. 39).

According to the method disclosed in Reference 1, a color reproduction area can be expanded in directions of arrows in FIG. 39 by increasing color purity, and brightness of colors recognized by human eyes can be increased. However, there is still a surplus in a color gamut which can be viewed by human eyes. Therefore, it is an essential task to expand the color reproduction area by satisfying the surplus in the color gamut which can be viewed by human eyes.

SUMMARY OF THE INVENTION

In view of this, it is an object of the invention to accomplish the aforementioned task in a display device equipped with a light-emitting element, so that the color reproduction area can be improved and the color gamut which can be viewed by human eyes can be widened.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The light-emitting elements provided in the first pixel and the second pixel have different emission spectrums from each other; the light-emitting elements provided in the third pixel and the fourth pixel have different emission spectrums from each other; and the light-emitting elements provided in the fifth pixel and the sixth pixel have different emission spectrums from each other.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The light-emitting elements provided in the first pixel and the second pixel emit light with colors of different coordinates from each other in the CIE-XY chromaticity diagram; the light-emitting elements provided in the third pixel and the fourth pixel emit light with colors of different coordinates from each other in the CIE-XY chromaticity diagram; and the light-emitting elements provided in the fifth pixel and the sixth pixel emit light with colors of different coordinates from each other in the CIE-XY chromaticity diagram.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The light-emitting elements provided in the first pixel and the second pixel are formed of different materials from each other to have different emission spectrums; the light-emitting elements provided in the third pixel and the fourth pixel are formed of different materials from each other to have different emission spectrums; and the light-emitting elements provided in the fifth pixel and the sixth pixel are formed of different materials from each other to have different emission spectrums.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The light-emitting elements provided in the first pixel and the second pixel are formed to have different thickness from each other to have different emission spectrums; the light-emitting elements provided in the third pixel and the fourth pixel are formed to have different thickness from each other to have different emission spectrums; and the light-emitting elements provided in the fifth pixel and the sixth pixel are formed to have different thickness from each other to have different emission spectrums.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The first pixel and the second pixel have color filters with different transmission properties from each other, thereby light which has traveled through each of the color filters has a different emission spectrum from each other; the third pixel and the fourth pixel have color filters with different transmission properties from each other, thereby light which has traveled through each of the color filters has a different emission spectrum from each other; and the fifth pixel and the sixth pixel have color filters with different transmission properties from each other, thereby light which has traveled through each of the color filters has a different emission spectrum from each other.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate the CIE-XY chromaticity diagram are 0.20 or less and 0.25 or less, respectively. The light-emitting elements provided in the first pixel and the second pixel are formed of different materials from each other, and emit light with colors of different coordinates in the CIE-XY chromaticity diagram; the light-emitting elements provided in the third pixel and the fourth pixel are formed of different materials from each other, and emit light with colors of different coordinates in the CIE-XY chromaticity diagram; and the light-emitting elements provided in the fifth pixel and the sixth pixel are formed of different materials from each other, and emit light with colors of different coordinates in the CIE-XY chromaticity diagram.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The light-emitting elements provided in the first pixel and the second pixel are formed to have different thickness from each other, and emit light with colors of different coordinates in the CIE-XY chromaticity diagram; the light-emitting elements provided in the third pixel and the fourth pixel are formed to have different thickness from each other, and emit light with colors of different coordinates in the CIE-XY chromaticity diagram; and the light-emitting elements provided in the fifth pixel and the sixth pixel are formed to have different thickness from each other, and emit light with colors of different coordinates in the CIE-XY chromaticity diagram.

A display device in accordance with one aspect of the invention includes a display region having a plurality of picture elements. Each picture element includes: a first pixel and a second pixel each including a light-emitting element, the light-emitting element having a chromaticity whose x-coordinate in a CIE-XY chromaticity diagram is 0.50 or more; a third pixel and a fourth pixel each including a light-emitting element, the light-emitting element having a chromaticity whose y-coordinate in the CIE-XY chromaticity diagram is 0.55 or more; and a fifth pixel and a sixth pixel each including a light-emitting element, the light-emitting element having a chromaticity whose x-coordinate and y-coordinate in the CIE-XY chromaticity diagram are 0.20 or less and 0.25 or less, respectively. The first pixel and the second pixel have color filters with different transmission properties from each other, and light that has traveled through one of the color filters has a color of a different coordinate from light that has traveled through the other color filter in the CIE-XY chromaticity diagram; the third pixel and the fourth pixel have color filters with different transmission properties from each other, and light that has traveled through one of the color filters has a color of a different coordinate from light that has traveled through the other color filter in the CIE-XY chromaticity diagram; and the fifth pixel and the sixth pixel have color filters with different transmission properties from each other, and light that has traveled through one of the color filters has a color of a different coordinate from light that has traveled through the other color filter in the CIE-XY chromaticity diagram.

Either one of the light-emitting element provided in the first pixel or the light-emitting element provided in the second pixel may have a chromaticity whose x-coordinate and y-coordinate in the CIE-XY chromaticity diagram are 0.6 or more and 0.35 or less, respectively; either one of the light-emitting element provided in the third pixel or the light-emitting element provided in the fourth pixel may have a chromaticity whose x-coordinate and y-coordinate in the CIE-XY chromaticity diagram are 0.3 or less and 0.6 or more, respectively; and either one of the light-emitting element provided in the fifth pixel or the light-emitting element provided in the sixth pixel may have a chromaticity whose x-coordinate and y-coordinate in the CIE-XY chromaticity diagram are 0.15 or less and 0.2 or less, respectively.

The picture element may include a light-emitting element which emits white light.

The first pixel and the second pixel may have light-emitting regions with different area dimensions from each other; the third pixel and the fourth pixel may have light-emitting regions with different area dimensions from each other; and the fifth pixel and the sixth pixel may have light-emitting regions with different area dimensions from each other.

The light-emitting element may be an electroluminescent (EL: Electro Luminescence) element (e.g., an organic EL element, an inorganic EL element, or an EL element containing organic and inorganic materials).

Note that a region in the CIE-XY chromaticity diagram in this specification corresponds to a region showing visible light in the CIE-XY chromaticity diagram which can be recognized by human eyes.

Note also that a switch described in this specification can employ various types of elements. An electrical switch, a mechanical switch, or the like is given as an example. That is, anything that can control a current flow can be employed, and thus, various types of elements can be employed without limiting to a certain element. For example, it may be a transistor, a diode (e.g., a PN junction diode, a PIN diode, a Schottky diode, or a diode-connected transistor), a thyristor, or a logic circuit combining such elements. Therefore, in the case of employing a transistor as a switch, the polarity (the conductivity type) of the transistor is not particularly limited to a certain type since it operates just as a switch. However, when off-current is preferred to be small, a transistor of a polarity with small off-current is desirably employed. As a transistor with small off-current, there is a transistor provided with an LDD region, a transistor with a multi-gate structure, or the like. In addition, it is desirable that an n-channel transistor be employed when a potential of a source terminal of the transistor being operated as a switch is closer to the low-potential-side power supply (e.g., Vss, GND, or 0 V), while a p-channel transistor be employed when the potential of the source terminal is closer to the high-potential-side power supply (e.g., Vdd). This helps the switch operate efficiently since the absolute value of the gate-source voltage of the transistor can be increased.

A CMOS switch may also be employed by using both n-channel and p-channel transistors. By employing a CMOS switch, the switch can efficiently operate as a switch since current can flow when either one of the p-channel transistor or the n-channel transistor is turned on. For example, voltage can be appropriately output regardless of whether voltage of an input signal of the switch is high or low. Further, since a voltage amplitude value of a signal for turning on or off the switch can be suppressed, power consumption can be reduced.

When a transistor is employed as a switch, the switch includes an input terminal (one of either a source terminal or a drain terminal), an output terminal (the other of either the source terminal or the drain terminal), and a terminal for controlling electrical conduction (a gate terminal). On the other hand, when a diode is employed as a switch, the switch may not have a terminal for controlling electrical conduction. Therefore, the number of wires for controlling terminals can be reduced.

Note that in this specification, the description "being connected" includes a case where elements are electrically connected, a case where elements are functionally connected, and a case where elements are directly connected. Accordingly, in the configurations disclosed in this specification, other elements may be sandwiched between elements having a predetermined connecting relation. For example, one or more elements which enable an electrical connection (e.g., a switch, a transistor, a capacitor t, an inductor, a resistor, or a diode) may be provided. In addition, one or more circuits which enable a functional connection may be provided in addition to the predetermined elements, such as a logic circuit (e.g., an inverter, a NAND circuit, or a NOR circuit), a signal converter circuit (e.g., a DA converter circuit, an AD converter circuit, or a gamma correction circuit), a potential level converter circuit (e.g., a power supply circuit such as a boosting circuit or a voltage lower control circuit, or a level shifter circuit for changing a potential level of an H signal or an L signal), a voltage source, a current source, a switching circuit, or an amplifier circuit (e.g., a circuit which can increase the signal amplitude, the amount of current, or the like, such as an operational amplifier, a differential amplifier circuit, a source follower circuit, or a buffer circuit), a signal generating circuit, a memory circuit, or a control circuit. Alternatively, the elements may be directly connected without interposing other elements or other circuits therebetween.

When it is obvious that elements are connected without interposing other elements or circuits therebetween, such elements are described as "being directly connected" in this specification. On the other hand, when elements are described as "being electrically connected", the following cases can be considered: a case where such elements are electrically connected (that is, connected by interposing other elements therebetween), a case where such elements are functionally connected (that is, connected by interposing other circuits therebetween), and a case where such elements are directly connected (that is, connected without interposing other elements or other circuits therebetween).

Note that in this specification, various types of transistors can be applied to a transistor. Therefore, types of transistors which can be applied are not limited to a certain type. For example, a thin film transistor (TFT) including a non-single crystalline semiconductor film typified by amorphous silicon or polycrystalline silicon can be applied. Accordingly, various advantages can be provided that such transistors can be manufactured at a low manufacturing temperature, can be manufactured at low cost, can be formed over a large substrate as well as a light-transmissive substrate, and further, such transistors can transmit light. In addition, the transistors can be formed by using a semiconductor substrate, an SOI substrate, or the like. In addition, a MOS transistor, a junction transistor, a bipolar transistor, or the like can be employed. Accordingly, transistors with few variations, transistors with a high current supply capacity, and transistors with a small size can be manufactured, and thereby a circuit with low power consumption can be constructed by using such transistors. Further, a transistor including a compound semiconductor such as ZnO, a-InGaZnO, SiGe, or GaAs, or a thin film transistor obtained by thinning such compound semiconductors can be employed. Accordingly, such transistors can be manufactured at a low manufacturing temperature, can be manufactured at a room temperature, and can be formed directly over a low heat-resistant substrate such as a plastic substrate or a film substrate. A transistor or the like formed by ink-jet method or a printing method may also be employed. Accordingly, such transistors can be manufactured at a room temperature, can be manufactured at a low vacuum, and can be manufactured over a large substrate. In addition, since such transistors can be manufactured without using a mask (reticle), the layout of the transistors can be easily changed. A transistor including an organic semiconductor or a carbon nanotube, or other transistors can be applied as well. Accordingly, the transistors can be formed over a substrate which can be bent. Note that a non-single crystalline semiconductor film may include hydrogen or halogen. In addition, various types of substrates can be applied to a substrate over which transistors are formed without limiting to a certain type. Accordingly, transistors may be formed over, for example, a single crystalline substrate, an SOI substrate, a glass substrate, a quartz substrate, a plastic substrate, a paper substrate, a cellophane substrate, a stone substrate, a stainless steel substrate, a substrate made of a stainless steel foil, or the like. In addition, after forming transistors over a substrate, the transistors may be transposed onto another substrate. As for another substrate, a single crystalline substrate, an SOI substrate, a glass substrate, a quartz substrate, a plastic substrate, a paper substrate, a cellophane substrate, a stone substrate, a stainless steel substrate, a substrate made of a stainless steel foil, or the like may be employed. By using the aforementioned substrates, transistors with excellent properties and with low power consumption can be formed, and thus, a device with high durability and high heat resistance can be formed.

The structure of a transistor may be various modes. Therefore, the structure of the transistor is not limited to a certain type. For example, a multi-gate structure having two or more gate electrodes may be used. When a multi-gate structure is employed, a structure where channel regions are connected in series is provided; therefore, a structure where a plurality of transistors are connected in series is provided. By employing a multi-gate structure, off-current can be reduced as well as the withstand voltage can be increased to improve the reliability of the transistor, and even if a drain-source voltage fluctuates when the transistor operates in the saturation region, flat characteristics can be provided without causing fluctuations of drain-source current very much. In addition, a structure where gate electrodes are formed above and below a channel may be employed. By using a structure where gate electrodes are formed above and below a channel, the channel region is enlarged to increase the amount of current flowing therethrough, and a depletion layer can be easily formed to improve the S value. When gate electrodes are formed above and below a channel, a structure where a plurality of transistors are connected in parallel is provided.

In addition, any of the following structures may be employed: a structure where a gate electrode is formed above a channel; a structure where a gate electrode is formed below a channel; a staggered structure; an inversely staggered structure; and a structure where a channel region is divided into a plurality of regions, and the divided regions are connected in parallel or in series. In addition, a channel (or a part of it) may overlap with a source electrode or a drain electrode. By forming a structure where a channel (or a part of it) overlaps with a source electrode or a drain electrode, electric charges can be prevented from gathering locally in a part of the channel, which would otherwise cause an unstable operation. In addition, an LDD (Lightly Doped Drain) region may be provided. By providing an LDD region, off-current can be reduced as well as the withstand voltage can be increased to improve the reliability of the transistor, and even if a drain-source voltage fluctuates when the transistor operates in the saturation region, flat characteristics can be provided without causing fluctuations of a drain-source current very much.

Note that various types of transistors may be employed in this specification, and such transistors can be formed over various types of substrates. Accordingly, all of the circuits may be formed over a glass substrate, a plastic substrate, a single crystalline substrate, an SOI substrate, or any other substrates. By forming all of the circuits over the same substrate, the number of component parts can be reduced to cut cost, as well as the number of connections to the circuit components can be reduced to improve the reliability. Alternatively, parts of the circuits may be formed over one substrate while the other parts of the circuits may be formed over another substrate. That is, not all of the circuits are required to be formed over the same substrate. For example, parts of the circuits may be formed with transistors over a glass substrate while the other parts of the circuits may be formed over a single crystalline substrate, so that the IC chip is connected to the glass substrate by COG (Chip On Glass). Alternatively, the IC chip may be connected to the glass substrate by TAB (Tape Automated Bonding) or a printed wiring board. In this manner, by forming parts of the circuits over the same substrate, the number of component parts can be reduced to cut cost, as well as the number of connections to the circuit components can be reduced to improve the reliability. In addition, by forming a portion with a high driving voltage or a portion with high driving frequency which would consume large power over another substrate, increase of power consumption can be prevented.

Note that a transistor is an element having at least three terminals of a gate, a drain, and a source. The transistor has a channel region between a drain region and a source region, and can supply a current through the drain region, the channel region, and the source region. Here, since the source and the drain of the transistor may change depending on the structure, the operating conditions, and the like of the transistor, it is difficult to define which is a source or a drain. Therefore, in the invention, a region functioning as a source and a drain may not be called the source or the drain. In such a case, for example, one of the source and the drain may be called a first terminal and the other terminal may be called a second terminal.

Note also that a transistor may be an element having at least three terminals of a base, an emitter, and a collector. In this case also, one of the emitter and the collector may be similarly called a first terminal and the other terminal may be called a second terminal.

A gate means all of or a part of a gate electrode and a gate wire (also called a gate line, a gate signal line, or the like). A gate electrode means a conductive film which overlaps with a semiconductor forming a channel region, an LDD region, or the like with a gate insulating film sandwiched therebetween. A gate wire means a wire for connecting each gate electrode of each pixel, or a wire for connecting a gate electrode to another wire.

However, there is a portion functioning as both a gate electrode and a gate wire. Such a region may be called either a gate electrode or a gate wire. That is, there is a region where a gate electrode and a gate wire cannot be clearly distinguished from each other. For example, in the case where a channel region overlaps with an extended gate wire, the overlapped region functions as both a gate wire and a gate electrode. Accordingly, such a region may be called either a gate electrode or a gate wire.

In addition, a region formed of the same material as a gate electrode and connected to the gate electrode may also be called a gate electrode. Similarly, a region formed of the same material as a gate wire and connected to the gate wire may also be called a gate wire. In a strict sense, such a region may not overlap with a channel region, or may not have a function of connecting to another gate electrode. However, there is a region formed of the same material as a gate electrode or a gate wire and connected to the gate electrode or the gate wire in order to satisfy a sufficient manufacturing margin. Accordingly, such a region may also be called either a gate electrode or a gate wire.

In a multi-gate transistor, for example, a gate electrode of one transistor is often connected to a gate electrode of another transistor by using a conductive film which is formed of the same material as the gate electrode. Since such a region is a region for connecting a gate electrode to another gate electrode, it may be called a gate wire, while it may also be called a gate electrode since a multi-gate transistor can be considered as one transistor. That is, a region which is formed of the same material as a gate electrode or a gate wire and connected thereto may be called either the gate electrode or the gate wire.

In addition, for example, a part of a conductive film which connects a gate electrode and a gate wire may also be called either a gate electrode or a gate wire.

Note that a gate terminal means a part of a gate electrode or a part of a region which is electrically connected to the gate electrode.

Note also that a source means all of or a part of a source region, a source electrode, and a source wire (also called a source line, a source signal line, or the like). A source region means a semiconductor region containing a large amount of p-type impurities (e.g., boron or gallium) or n-type impurities (e.g., phosphorus or arsenic). Accordingly, a region containing a slight amount of p-type impurities or n-type impurities, namely, an LDD (Lightly Doped Drain) region is not included in the source region. A source electrode is a part of a conductive layer formed of a different material from a source region, and electrically connected to the source region. However, there is a case where a source electrode and a source region are collectively called a source electrode. A source wire is a wire for connecting each source electrode of each pixel, or a wire for connecting a source electrode to another wire.

However, there is a portion functioning as both a source electrode and a source wire. Such a region may be called either a source electrode or a source wire. That is, there is a region where a source electrode and a source wire cannot be clearly distinguished from each other. For example, in the case where a source region overlaps with an extended source wire, the overlapped region functions as both a source wire and a source electrode. Accordingly, such a region may be called either a source electrode or a source wire.

In addition, a region formed of the same material as a source electrode and connected to the source electrode, or a portion for connecting a source electrode to another source electrode may be called a source electrode. A part of a source wire which overlaps with a source region may also be called a source electrode. Similarly, a region formed of the same material as a source wire and connected to the source wire may be called a source wire. In a strict sense, such a region may not have a function of connecting to another source electrode. However, there is a region formed of the same material as a source electrode or a source wire, and connected to the source electrode or the source wire in order to satisfy a sufficient manufacturing margin. Accordingly, such a region may also be called either a source electrode or a source wire.

In addition, for example, a part of a conductive film which connects a source electrode and a source wire may be called either a source electrode or a source wire.

Note that a source terminal means a part of a source region, a part of a source electrode, or a part of a region electrically connected to the source electrode.

Note also that the same can be said for a drain.

In this specification, a semiconductor device means a device having a circuit including semiconductor elements (e.g., transistors or diodes). The semiconductor device may also include all devices that can function by utilizing semiconductor characteristics.

In addition, a display device means a device having display elements (e.g., liquid crystal elements or light-emitting elements). Note that the display device may also include a display panel itself where a plurality of pixels including display elements such as liquid crystal elements or EL elements are formed over the same substrate as a peripheral driver circuit for driving the pixels. In addition, the display device may include a peripheral driver circuit disposed over the substrate by wire bonding or bump bonding, namely, chip-on-glass (COG). Further, the display device may include a flexible printed circuit (FPC) or a printed wiring board (PWB) attached to the display panel (e.g., an IC, a resistor, a capacitor, an inductor, or a transistor). Such a display device may also include an optical sheet such as a polarizing plate or a retardation plate. Further, the display device may include a backlight unit (which may include a light conducting plate, a prism sheet, a diffusion sheet, a reflective sheet, and a light source (e.g., an LED or a cold cathode tube)). In addition, a light-emitting device means a display device having self-luminous display elements, particularly, such as EL elements or elements used for an FED. A liquid crystal display device means a display device having liquid crystal elements.

A display element, a display device, a light-emitting element, and a light-emitting device may include various types of modes and various elements. For example, as the display element, the display device, the light-emitting element, and the light-emitting device, there is a display medium whose contrast changes by an electromagnetic action, such as an EL element (e.g., an organic EL element, an inorganic EL element, or an EL element containing both organic and inorganic materials); an electron-emissive element; a liquid crystal element; electronic ink; a grating light valve (GLV); a plasma display (PDP); a digital micromirror device (DMD); a piezoelectric ceramic element; or a carbon nanotube. In addition, a display device using an EL element includes an EL display; a display device using an electron-emissive element includes a field emission display (FED), an SED-type flat panel display (SED: Surface-conduction Electron-emitter Display), or the like; a display device using a liquid crystal element includes a liquid crystal display, a transmissive liquid crystal display, a semi-transmissive liquid crystal display, and a reflective liquid crystal display; and a display device using electronic ink includes electronic paper.

In this specification, an expression that an object is "formed on" or "formed above" another object does not necessarily mean that the object is in direct contact with another object. The expression may include a case where two objects are not in direct contact with each other, that is, a case where another object is sandwiched therebetween. Accordingly, when it is described that a layer B is formed on (above) a layer A, it means either a case where the layer B is formed in direct contact with the layer A, or a case where another layer (e.g., a layer C or a layer D) is formed in direct contact with the layer A, and then the layer B is formed in direct contact with the layer C or D. In addition, when it is described that an object is formed over another object, it does not necessarily mean that the object is in direct contact with another object, and another object may be sandwiched therebetween. Accordingly, for example, when it is described that a layer B is formed over or above a layer A, it means either a case where the layer B is formed in direct contact with the layer A, or a case where another layer (e.g., a layer C or a layer D) is formed in direct contact with the layer A, and then the layer B is formed in direct contact with the layer C or D. Similarly, when it is described that an object is formed below or under another object, it means either a case where the objects are in direct contact with each other or a case where the objects are not in contact with each other.

The invention can provide a display device having an improved color reproduction area on the CIE-XY chromaticity diagram in a display device using light-emitting elements. In other words, the invention can provide a display device which can express bright colors.

BRIEF DESCRIPTION OF THE DRAWINGS

In the accompanying drawings,

FIGS. 14A and 14B are cross-sectional views of a display device in the invention;

FIGS. 22A and 22B are timing charts of a display in the invention;

FIGS. 30A and 30B are views of one mode of a display device in the invention;

FIGS. 40A and 40B are cross-sectional views of a display device in the invention;

FIGS. 43A and 43B are cross-sectional views of a display device in the invention;

FIGS. 49A and 49B are cross-sectional views of a display device in the invention;

FIGS. 53A and 53B are schematic diagrams of picture elements of a display device in the invention;

DETAILED DESCRIPTION OF THE INVENTION

Figure 1:
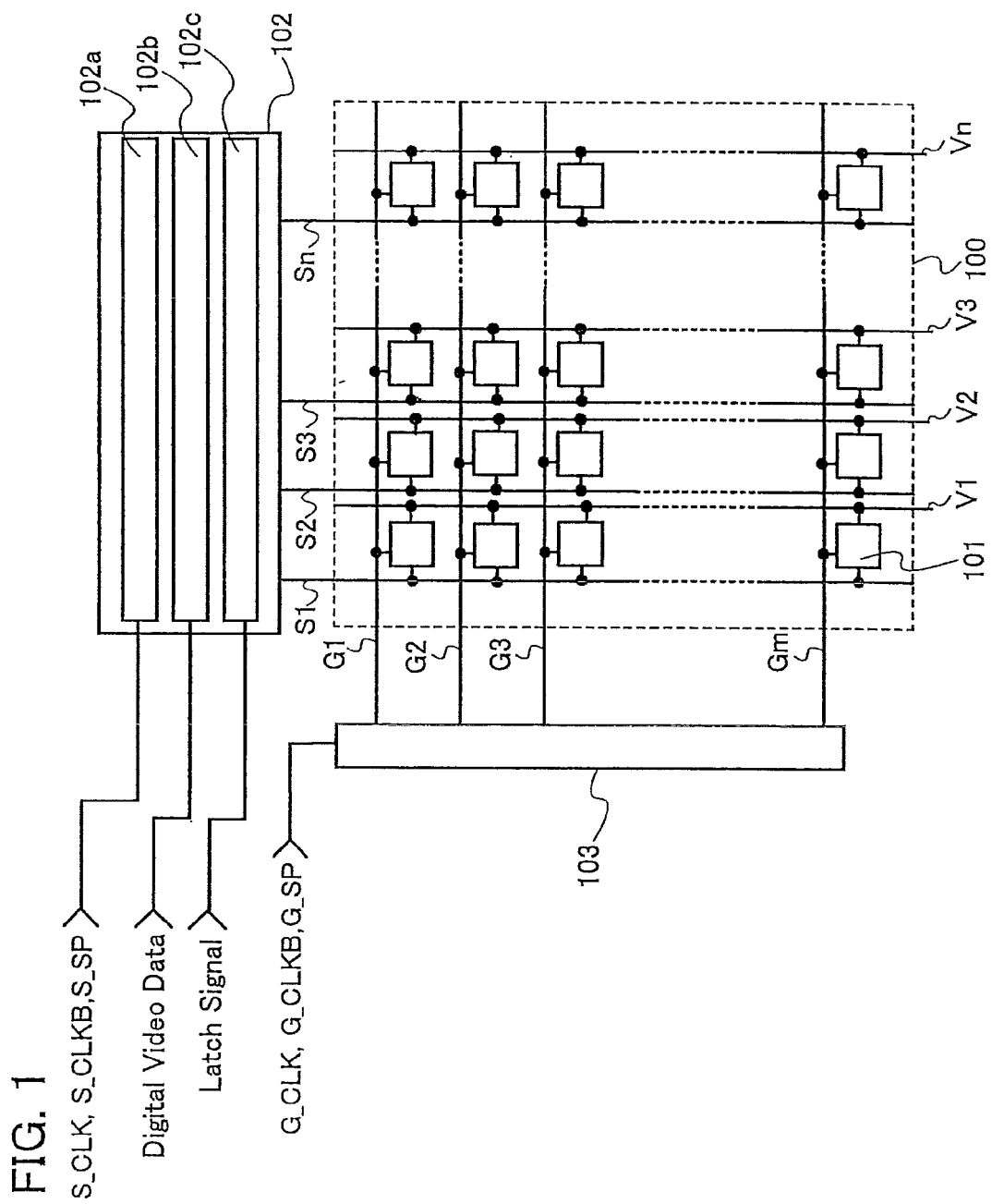
FIG. 1 is a schematic diagram of a display device in the invention.

Although the invention will be fully described by embodiment modes and embodiments with reference to the drawings, it is to be understood that various changes and modifications will be apparent to those skilled in the art. Unless such changes and modifications depart from the scope of the invention, they should be construed as being included therein. Therefore, the invention is not limited to the following description. Note that the same portions or portions having the same function are denoted by the same reference numerals, and repetitive description is omitted.

Embodiment Mode 1

[Configuration of a Display Device in this Embodiment Mode]

A configuration example of a display device in the invention is shown by a block diagram in FIG. 1. Reference numeral 100 denotes a pixel portion where a plurality of pixels 101 are arranged in matrix, and such a configuration is called an active matrix arrangement. In addition, reference numeral 102 denotes a signal line driver circuit and 103 denotes a scan line driver circuit.

Note that the signal line driver circuit 102 and the scan line driver circuit 103 are formed over the same substrate as a pixel portion 100 in FIG. 1; however, the configuration of the invention is not limited to this. The signal line driver circuit 102 and the scan line driver circuit 103 may be formed over a different substrate from the pixel portion 100, and connected to the pixel portion 100 with a connector such as a flexible printed circuit (FPC). As a method for mounting the FPC, a connecting method using an anisotropic conductive material or a metal bump, or a wire bonding method can be employed. In addition, each of the signal line driver circuit 102 and the scan line driver circuit 103 is provided one by one in FIG. 1; however, the configuration of the invention is not limited to this. The number of the signal line driver circuit 102 and the scan line driver circuit 103 can be set arbitrarily by a designer.

Note also that a pixel means an element having a color element forming one image, and includes a light-emitting element and an element which drives the light-emitting element (e.g., a circuit constructed from transistors) in this specification. In addition, a picture element means an element having pixels each having a color element for displaying one minimum image. Accordingly, in the case of a full color display device having color elements of R (Red), G (Green), and B (Blue), a picture element includes pixels including color elements of R, G, and B. Further, with regard to a picture element which includes a plurality of pixels, pixels are called in such order that a first pixel and a second pixel. In addition, each pixel may have a different area dimension.

In this specification, a connection means an electrical connection unless otherwise specified. On the other hand, a separation means a state where objects are not connected and electrically separated.

In addition, in FIG. 1, signal lines S1 to Sn, power supply lines V1 to Vn, and scan lines G1 to Gm are provided in the pixel portion 100. Note that the number of the signal lines and the scan lines is not necessarily the same. Further, the pixel portion 100 is not necessarily required to include all of the wires, and another wire may be provided therein in addition to these wires.

The signal line driver circuit 102 may be any kind of circuits as long as it can supply an input signal to each of the signal lines S1 to Sn. In this embodiment mode, as a specific example, the signal line driver circuit 102 includes a shift register 102a, a first latch circuit 102b, and a second latch circuit 102c. Note that the signal line driver circuit 102 of a display device in the invention is not limited to the aforementioned configuration. In addition, the signal line driver circuit 102 may be a signal line driver circuit which can process a video signal in a digital form (also called a digital video signal or a video signal), or a signal line driver circuit which outputs a video signal in an analog form (an analog video signal) by using a D/A (Digital-Analog) converter circuit. Further, the signal line driver circuit 102 may have a configuration including a level shifter circuit, a buffer circuit, or the like depending on the configurations of the display device.

The scan line driver circuit 103 may be any kind of circuit as long as it can output a signal to each of the scan lines G1 to Gm in order to select a pixel in the pixel portion 100. Specifically, the scan line driver circuit 103 includes a shift register circuit in this embodiment mode. In addition, the scan line driver circuit 103 may have a configuration including a level shifter circuit, a buffer circuit, or the like depending on the configurations of the display device. Further, the scan line driver circuit 103 may be constructed with a shift register and a sampling switch without using a latch circuit.

In addition, a clock signal (S_CLK), a clock inverted signal (S_CLKB), a start pulse (S_SP), a digital video signal (Digital Video Data), a latch signal (Latch Signal), and the like are input to the signal line driver circuit 102. Then, in accordance with the signals, a video signal corresponding to pixels of each column is output to each of the signal lines S1 to Sn. Note that an analog video signal may be input to the signal line driver circuit 102.

Meanwhile, a clock signal (S_CLK), a clock inverted signal (S_CLKB), a start pulse (S_SP), and the like are input to the scan line driver circuit 103. Then, in accordance with the signals, a signal which selects pixels is output to a scan line Gi (one of the first scan lines G1 to Gm) of pixel columns which are selected.

Accordingly, the video signal input to the signal lines S1 to Sn is written to each column of the pixels 101 in a row selected by the signal which is input to the scan line Gi (one of the first scan lines G1 to Gm) from the scan line driver circuit 103. Then, each pixel column is selected by each of the scan lines G1 to Gm and a video signal corresponding to each pixel is written to each pixel. Then, each pixel holds the video signal that has been written for a certain period. By holding the video signal for a certain period, each pixel can maintain a state of lighting or the like.

The display device using light-emitting elements shown in FIG. 1 is described based on an active matrix driving method; however, the invention is not limited to this. A simple (passive) matrix method may also be employed in the invention. The display device using the active matrix method shown in FIG. 1 includes a control circuit having a thin film transistor for switching in each pixel, and states of lighting and non-lighting of each pixel are controlled by the control circuit in each pixel. On the other hand, a display device using the simple (passive) matrix method is arranged such that a plurality of column signal lines and a plurality of row signal lines are crossed with each other, and light-emitting elements are sandwiched at the crossed portion. Thus, when a potential difference is generated in a region which is sandwiched between a selected row signal line and a column signal line which conducts the output operation, the light-emitting element emits light with a current flowing thereto.

Figure 46:
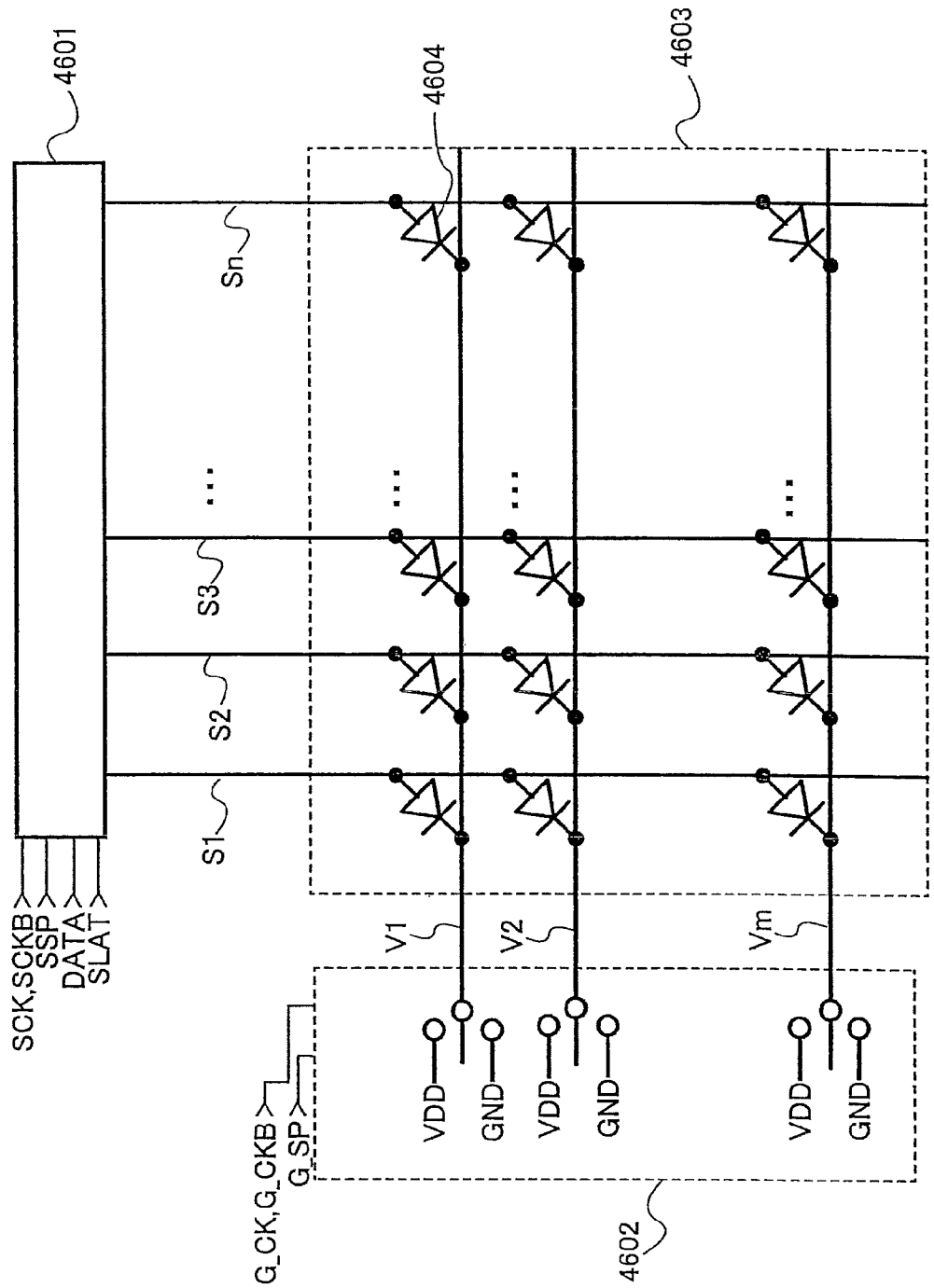
FIG. 46 is a schematic diagram of a display device in the invention.

A configuration of a display device using the passive matrix method is shown in FIG. 46. The display device shown in FIG. 46 includes a column signal line driver circuit 4601, a row signal line driver circuit 4602, and a pixel portion 4603. The pixel portion 4603 is provided with column signal lines S1 to Sn and row signal lines V1 to Vn, and has a plurality of light-emitting elements 4604 between the column signals S1 to Sn and the row signals V1 to Vn. In the case of employing the passive matrix method, the configurations of the invention can be simplified compared with the case of employing the active matrix method, and thus, it is preferable.

The aforementioned configurations of the display device can be employed in the invention.

[Configuration of a Pixel in this Embodiment Mode]

Figure 2:
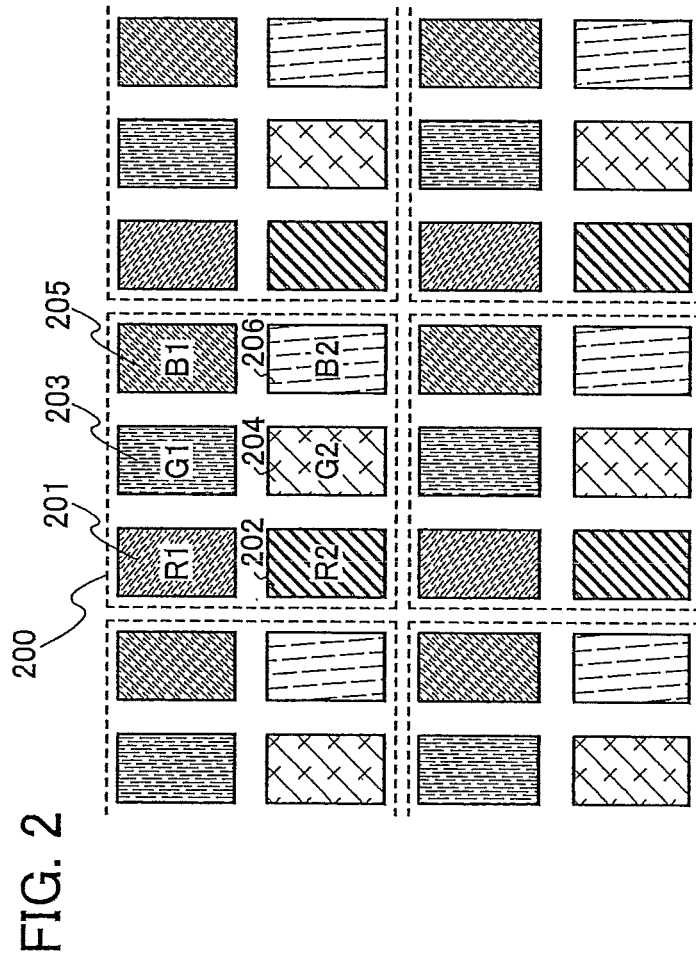
FIG. 2 is a schematic diagram of picture elements of a display device in the invention.

A specific configuration of the pixel portion in the invention shown in FIG. 1 is shown in FIG. 2. In FIG. 2, each of a first pixel 201, a second pixel 202, a third pixel 203, a fourth pixel 204, a fifth pixel 205, and a sixth pixel 206 corresponds to the pixel 101 in FIG. 1. In addition, a picture element 200 which displays one minimum image is formed by combining the first pixel 201 to the sixth pixel 206. Each of the first pixel 201, the second pixel 202, the third pixel 203, the fourth pixel 204, the fifth pixel 205, and the sixth pixel 206 has a light-emitting element. A light-emitting element R1, a light-emitting element R2, a light-emitting element G1, a light-emitting element G2, a light-emitting element B1, and a light-emitting element B2 are connected to the first pixel 201, the second pixel 202, the third pixel 203, the fourth pixel 204, the fifth pixel 205, and the sixth pixel 206, respectively.

In this specification, the light-emitting element R1 of the first pixel 201 and the light-emitting element R2 of the second pixel 202 have chromaticity whose x-coordinate in the CIE-XY chromaticity diagram is 0.50 or more. In addition, the light-emitting element G1 of the third pixel 203 and the light-emitting element G2 of the fourth pixel 204 have chromaticity whose y-coordinate in the CIE-XY chromaticity diagram is 0.55 or more. Further, the light-emitting element B1 of the fifth pixel 205 and the light-emitting element B2 of the sixth pixel 206 have chromaticity whose x-coordinate and y-coordinate in the CIE-XY chromaticity diagram are 0.20 or less and 0.35 or less, respectively. More preferably, either one of the light-emitting element R1 of the first pixel 201 or the light-emitting element R2 of the second pixel 202 has chromaticity whose x-coordinate and y-coordinate in the CIE-XY chromaticity diagram are 0.60 or more and 0.35 or less, respectively. In addition, more preferably, either one of the light-emitting element G1 of the third pixel 203 or the light-emitting element G2 of the fourth pixel 204 has chromaticity whose x-coordinate and y-coordinate in the CIE-XY chromaticity diagram are 0.30 or less and 0.60 or more, respectively. In addition, more preferably, either one of the light-emitting element B1 of the fifth pixel 205 or the light-emitting element B2 of the sixth pixel 206 has chromaticity whose x-coordinate and y-coordinate in the CIE-XY chromaticity diagram are 0.15 or less and 0.20 or less, respectively.

Note that in the invention, the absolute value $G_{12}$ which represents the difference between the coordinates (the distance between the coordinates of x and y) of the light-emitting element G1 and the light-emitting element G2 in the CIE-XY chromaticity diagram is preferably larger than the absolute value $R_{12}$ which represents the difference between the coordinates of the light-emitting element R1 and the light-emitting element R2 in the CIE-XY chromaticity diagram, or the absolute value $B_{12}$ which represents the difference between the coordinates of the light-emitting element B1 and the light-emitting element B2 in the CIE-XY chromaticity diagram. By satisfying $G_{12} > R_{12}$ or $G_{12} > B_{12}$, the color reproduction area can be improved to expand a color gamut which can be viewed by human eyes, and thus, it is preferable.

Figure 39:
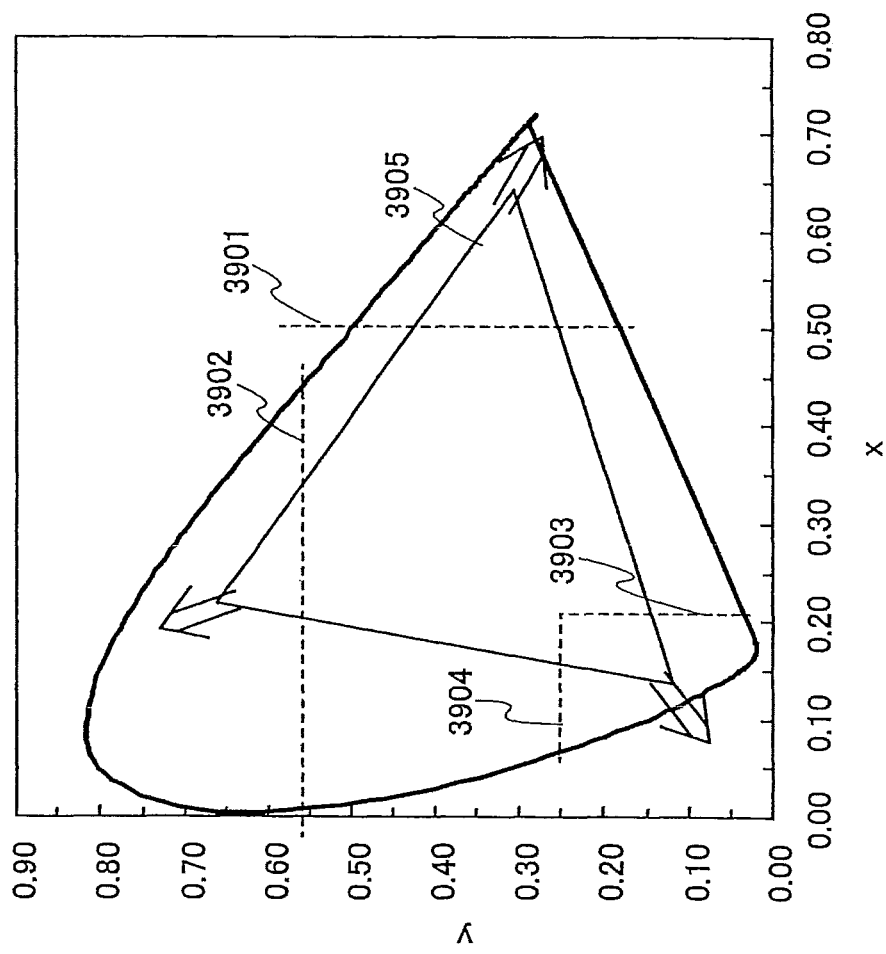
FIG. 39 is a CIE-XY chromaticity diagram for illustrating a conventional display device.

Note also that a region in the CIE-XY chromaticity diagram in this specification corresponds to a region showing visible light which can be recognized by human eyes. That is, a region in the CIE-XY chromaticity diagram in this specification corresponds to an inner region surrounded by a thick line in the CIE-XY chromaticity diagram shown in FIG. 39.

Figure 3:
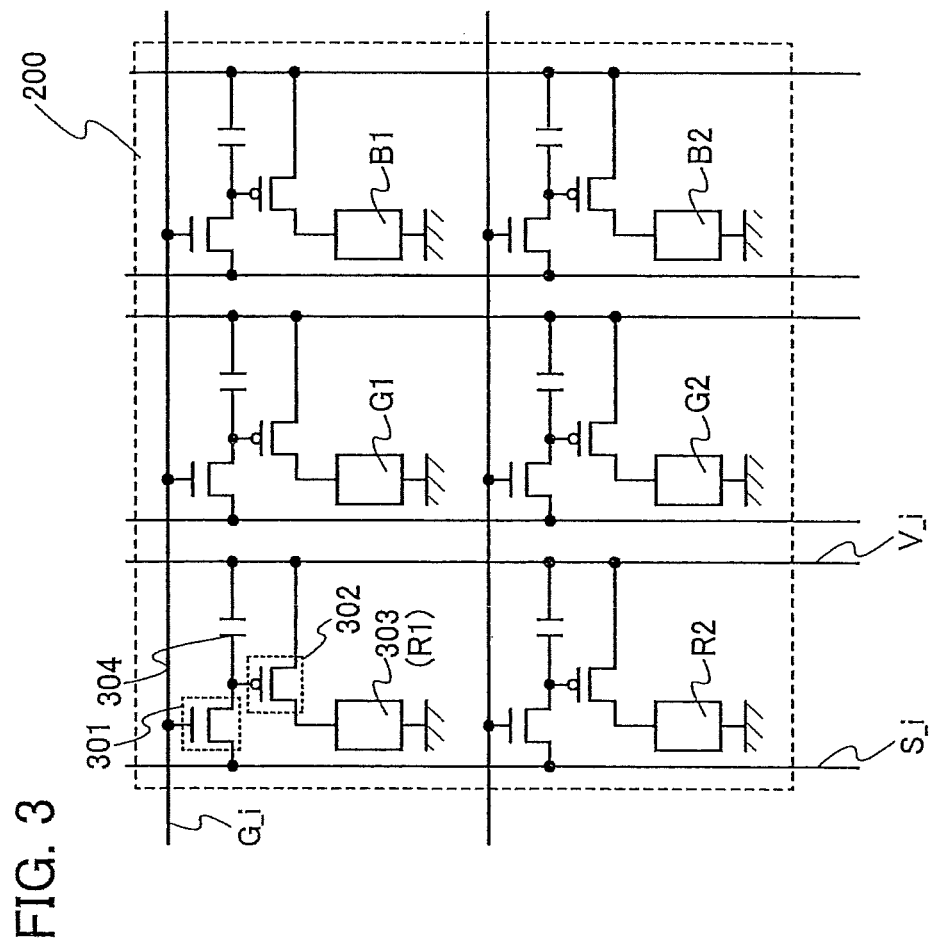
FIG. 3 is a circuit diagram of picture elements of a display device in the invention.

In addition, the circuit configuration of the picture element 200 in the invention shown in FIG. 2 is shown in FIG. 3. Each of the first pixel 201, the second pixel 202, the third pixel 203, the fourth pixel 204, the fifth pixel 205, and the sixth pixel 206 shown in FIG. 2 includes a signal line Si (one of the signal lines S1 to Sn), a scan line Gi (one of the scan lines G1 to Gm), and a power supply line Vi (one of the power supply lines V1 to Vn). In addition, each of the first pixel 201, the second pixel 202, the third pixel 203, the fourth pixel 204, the fifth pixel 205, and the sixth pixel 206 includes a first transistor 301 for switching to control an input of a video signal, a second transistor 302 for driving to decide the state of lighting or non-lighting of a light-emitting element by the video signal, a light-emitting element 303, and a storage capacitor 304. The storage capacitor 304 is provided so as to hold a gate-source voltage (gate voltage) of the second transistor 302 more accurately; however, it is not necessarily required. Note that in this specification, voltage means a potential difference from a ground unless otherwise specified. In addition, the light-emitting element 303 corresponds to the light-emitting elements R1, R2, G1, G2, B1, and B2 in FIG. 2, and each light-emitting element is connected to a circuit which drives the light-emitting element. In the configuration shown in FIG. 3, the power supply line can be shared to supply currents to the light-emitting elements R1 and R2, the light-emitting elements G1 and G2, or the light-emitting elements B1 and B2 by using the same power supply line Vi. Since the light-emitting elements R1 and R2, the light-emitting elements G1 and G2, and the light-emitting elements B1 and B2 have almost the same tone of color, respectively, the light-emitting elements can share the power supply line in this manner. As a result, the number of power supply lines disposed in the display device can be reduced, which is preferable. In FIG. 3, power supply lines which are connected to the light-emitting elements R1 and R2, the light-emitting elements G1 and G2, and the light-emitting elements B1 and B2, respectively, are described as different wires; however, the power supply lines may be wires diverged from the same wire.

Figure 52:
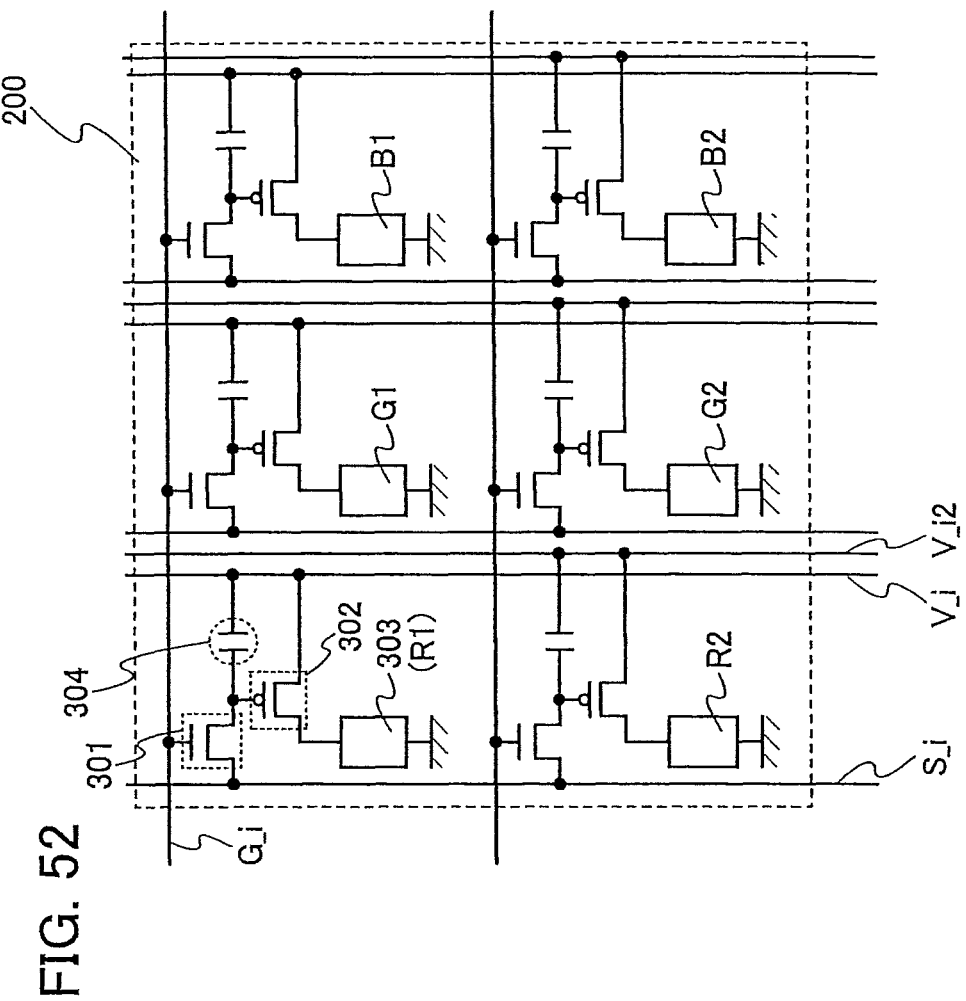
FIG. 52 is a circuit diagram of pixels of a display device in the invention.

A configuration different from the configuration shown in FIG. 3 is shown in FIG. 52. In FIG. 52, a configuration having the same function as that of FIG. 3 is denoted by the same reference numeral. As shown in FIG. 52, a configuration where the light-emitting elements R1 and R2, the light-emitting elements G1 and G2, and the light-emitting elements B1 and B2 are connected to different second power supply lines $Vi_2$, respectively may be employed. By using the different power supply lines for supplying currents to the light-emitting elements R1 and R2, the light-emitting elements G1 and G2, and the light-emitting elements B1 and B2, a voltage which is applied to the respective light-emitting elements can be controlled; thereby the luminance of each light-emitting element can be controlled freely, and thus, it is preferable.

Figure 4:
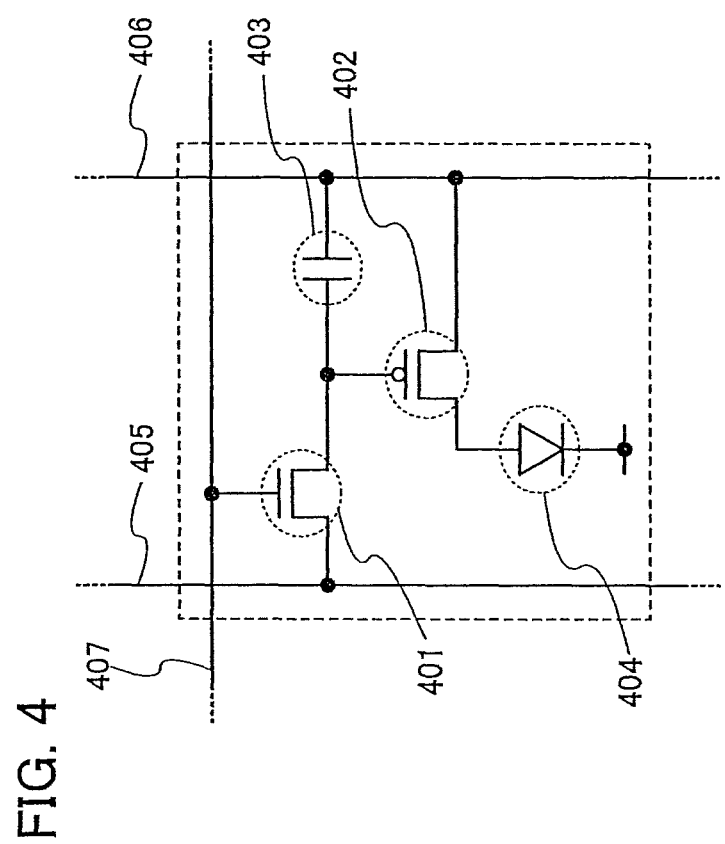
FIG. 4 is a circuit diagram of a pixel of a display device in the invention.

Here, a driving method of the light-emitting element 303 for obtaining light emission in FIG. 3 is described with reference to FIG. 4. In FIG. 4, a circuit connected to a light-emitting element 404 includes a first transistor 401 for switching to control an input of a video signal, a second transistor 402 for driving to decide the light intensity of the light-emitting element 404 by the video signal, a signal line 405, a power supply line 406, and a scan line 407. A gate of the first transistor 401 is connected to the scan line 407. One of either a first terminal or a second terminal (a source or a drain) of the first transistor 401 is connected to the signal line 405 and the other is connected to a gate of the second transistor 402. One of either a first terminal or a second terminal of the second transistor 402 is connected to the power supply line 406 and the other is connected to a pixel electrode of the light-emitting element 404. The light-emitting element 404 includes an anode and a cathode, and in this specification, in the case where the anode is used as the pixel electrode, the cathode is called the opposite electrode; while in the case where the cathode is used as the pixel electrode, the anode is called the opposite electrode. Voltage of the opposite electrode is often kept at a constant level. In addition, the first transistor 401 and the second transistor 402 may be either an n-channel transistor or a p-channel transistor. In the case where the anode is used as the pixel electrode and the cathode is used as the opposite electrode, the second transistor 402 is preferably a p-channel transistor. On the other hand, in the case where the anode is used as the opposite electrode and the cathode is used as the pixel electrode, the second transistor 402 is preferably an n-channel transistor.

One of two electrodes of the storage capacitor 403 is connected to the gate of the second transistor 402. In addition, the other of the two electrodes of the storage capacitor 403 is connected to the power source line 406; however, the invention is not limited to this, and the other of the two electrodes of the storage capacitor 403 may be connected to another wire. The storage capacitor 403 is provided so as to hold a gate-source voltage (gate voltage) of the second transistor 402 more accurately; however, it is not necessarily required by substituting the gate capacitance of the second transistor 402.

In FIG. 4, when the scan line 407 is selected in a period of writing, the first transistor 401 whose gate is connected to the scan line 407 is turned on. Then, the light-emitting element 404 emits light since a current flows from the power supply line 406 to the light-emitting element 404 in accordance with a video signal input to the gate of the second transistor 402 from the signal line 405 through the first transistor 401.

Note that the pixel configuration is not limited to this. Various types of pixel configurations can be applied such as a method for compensating variations of the threshold voltage of transistors and a method for inputting a signal current to the pixel.

The aforementioned pixel configurations can be employed in the invention.

[Method of an Operation in this Embodiment Mode]

Figure 5:
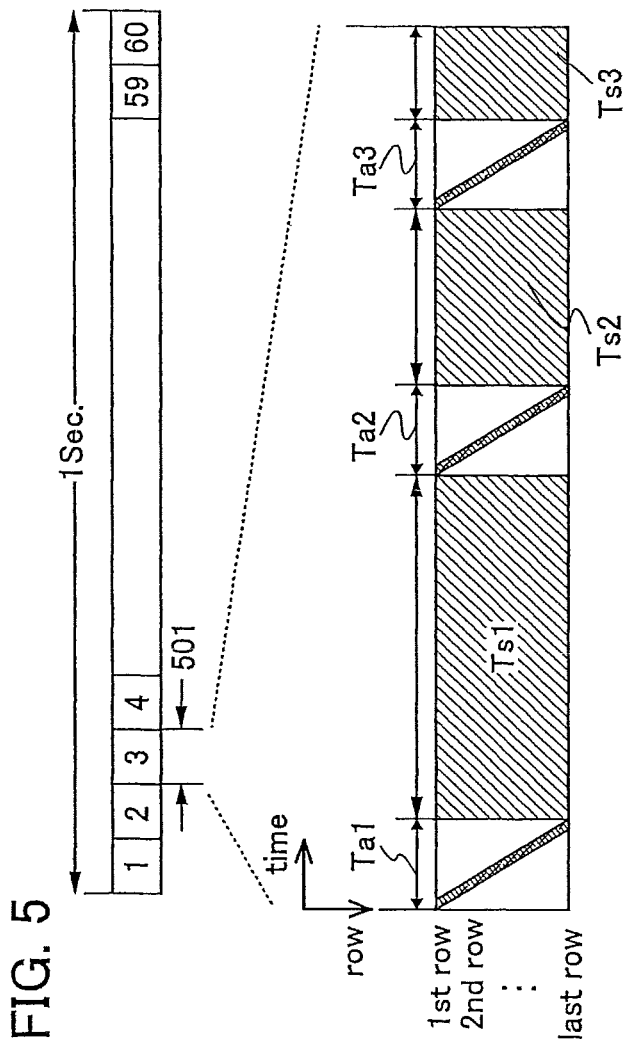
FIG. 5 is a timing chart of a display device in the invention.

Timing of an operation at the time of displaying an image with the circuit configuration shown in FIG. 4 is described with reference to FIG. 5. The display device conducts rewriting and displaying of images repeatedly in a displaying period. The number of rewriting of images is generally set about 60 times per second so that a viewer does not perceive a flicker. Here, a period in which a series operation of rewriting and displaying images is conducted once, that is, a period shown by 501 in FIG. 5 is described as one frame period 501. In this embodiment mode, a case where a 3-bit digital video signal is used in a digital time gray scale method is given as an example. In the case of a digital time gray scale method, the one frame period 501 is further divided into a plurality of sub frame periods. Here, since a video signal has 3 bits, the one frame period 501 is divided into three sub frame periods, and writing and displaying images for each luminous color are conducted in each period.

Each sub frame period includes an address (writing) period Ta# (# is a natural number) and a sustain (light-emitting) period Ts#. In FIG. 5, the length of the sustain (light-emitting) periods is Ts1:Ts2:Ts3=4:2:1, and $2^3=8$ gray scales are expressed by controlling the state of lighting or non-lighting of a light-emitting element in each sustain (light-emitting) period. That is, each sustain (light-emitting) period is set to have a power-of-two length such that Ts1:Ts2:Ts3=$2^{(n-1)}:2^{(n-2)}:\ldots:2^1:2^0$. For example, in the case where a light-emitting element emits light only in Ts3, and a light-emitting element does not emit light in Ts1 and Ts2, light emission is obtained only in about 14% of all of the sustain (light-emitting) periods. That is, luminance of about 14% can be expressed. In the case where a light-emitting element emits light in Ts1 and Ts2, and a light-emitting element does not emit light in Ts3, light emission is obtained in about 86% of all of the sustain (light-emitting) periods. That is, luminance of about 86% can be expressed.

Each of the light-emitting elements R1, R2, G1, G2, B1, and B2 which corresponds to the light-emitting element 303 in FIG. 3 is driven by this operation. In this manner, light-emitting periods of light-emitting elements which are provided in the respective pixels in the picture element 200 in FIG. 3 are controlled independently by circuits connected to the respective light-emitting elements, and thus, a desired display color can be obtained. Here, a display color means a color which can be visually recognized as a mixed color where luminescences obtained from a plurality of light-emitting elements each having a different luminous color in one pixel are mixed.

Note that the driving method is not limited to this. When an analog signal is input to the gate of the first transistor, luminance of the light-emitting element 404 may be changed in an analog manner in response to the analog signal.

The aforementioned method of operation can be employed in the invention.

[Configuration of a Light-Emitting Element in the Invention]

Figure 6:
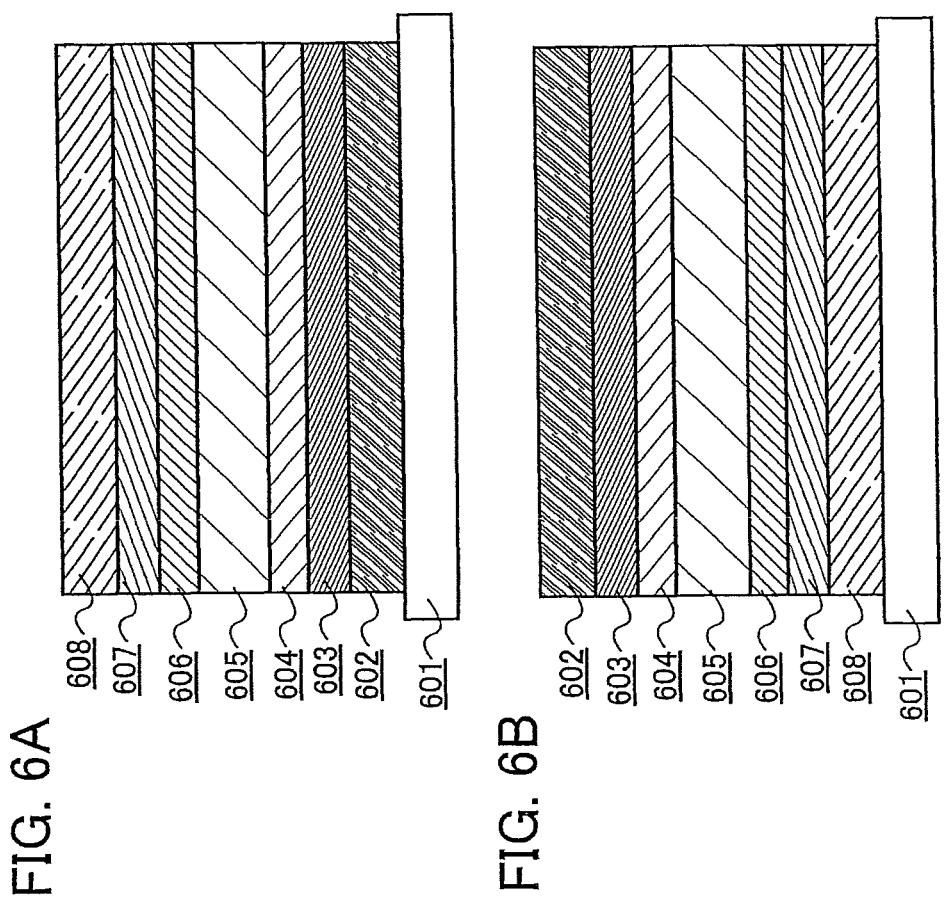
FIGS. 6A and 6B are cross-sectional views showing light-emitting elements of a display device of the invention.

Next, examples of light-emitting elements which can be applied to the display device of the invention are shown in FIGS. 6A and 6B.

A light-emitting element shown in FIG. 6A has an element structure where a substrate 601, an anode 602, a hole inject layer 603 which is made of a hole inject material, a hole transport layer 604 which is made of a hole transport material, a light-emitting layer 605, an electron transport layer 606 which is made of an electron transport material, an electron inject layer 607 which is made of an electron inject material, and a cathode 608 are stacked in this order. Here, the light-emitting layer 605 may be formed of only one kind of a light-emitting material or may be formed of two or more kinds of light-emitting materials. In addition, the structure of the light-emitting element in the invention is not limited to this. Needless to say, a circuit or a wire for driving a light-emitting element which is constructed with a transistor may be provided between the substrate 601 and the anode 602.

Further, in addition to the stacked structure shown in FIG. 6A where each functional layer is stacked, there are wide variations of element structures such as an element using a high molecular compound, and a high efficiency element which utilizes, as a light-emitting layer, a triplet light-emitting material which emits light in returning from a triplet excitation state. The light-emitting element can also be applied to a white light-emitting element which can be obtained by controlling a recombination region of carries using a hole blocking layer and dividing a light-emitting region into two regions.

The element of the invention shown in FIG. 6A can be manufactured as follows. First, a hole inject material, a hole transport material, and a light-emitting material are sequentially deposited over the substrate 601 having the anode 602 (ITO: Indium Tin Oxide). Next, an electron transport material and an electron inject material are deposited, and finally the cathode 608 is formed by vapor-deposition.

Note that a hole generation layer may be provided instead of the hole inject layer. The hole generation layer means layer which generates a hole, and can be formed by mixing at least one material selected from the hole transport materials and a material showing an electron-accepting property to the hole transport materials. Here, as a hole transport material, a material similar to a material which can be used for forming the hole transport material can be employed. In addition, as a material showing an electron-accepting property, metal oxide such as a molybdenum oxide, a vanadium oxide, a ruthenium oxide, or a rhenium oxide can be employed.

Next, materials suitable for the hole inject material, the hole transport material, the electron transport material, the electron inject material, and the light-emitting material are described.

As the hole inject material, a phthalocyanine-based compound such as phthalocyanine (abbreviation: $H_2Pc$) or copper phthalocyanine (abbreviation: CuPc), a polymer such as a poly(polyethylene dioxythiophene)/poly(polystylene sulfonate) solution (abbreviation: PEDOT/PSS), or the like can be given. The hole inject layer can be formed by selecting a material with a hole transport property which has a relatively lower ionization potential than an ionization potential of a functional layer which is formed to be in contact with the opposite side of an electrode functioning as an anode.

As a material which is most widely used as the hole transport material, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-bazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), or the like is given as an example. Alternatively, the hole transport layer may be a layer with a multilayer structure which is formed by combining two or more layers made of the aforementioned materials.

As an electron transport material, in addition to tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato) aluminum (abbreviation: BAlq), bis[2-(2'-hydroxyphenyl) benzoxazolato]zinc (abbreviation: $Zn(BOX)_2$), bis[2-(2'-hydroxyphenyl)benzothiazolato]zinc (abbreviation: $Zn(BTZ)_2$), or the like, 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), 4,4-bis(5-methylbenzoxazol-2-yl)stilbene (abbreviation: BzOs), or the like is given as an example. Alternatively, the electron transport layer may be a layer with a multilayer structure which is formed by combining two or more layers made of the aforementioned materials.

As an electron inject layer, an inorganic material such as alkaline metal, alkaline earth metal, alkaline metal fluoride, alkaline earth metal fluoride, alkaline metal oxide, or alkaline earth metal oxide is given as an example. In addition to the inorganic material, a material which can be used for forming the electron transport layer such as BPhen, BCP, p-EtTAZ, TAZ, or BzOs can be employed as the material for forming the electron inject layer by selecting from the aforementioned materials a material having a higher electron affinity than the material which is used for forming the electron transport layer. That is, the electron inject layer can also be formed by selecting from materials having electron transport properties a material having relatively a higher electron affinity in the electron inject layer than the electron affinity in the electron transport layer.

As a light-emitting layer including a light-emitting material, a material which has excellent luminous efficiency and can emit light with a desired emission wavelength may be selected to be employed without limiting to a certain light-emitting material. For example, in order to obtain red light emission, a material which presents light emission having an emission spectrum with a peak of 600 to 680 nm such as 4-dicyanomethylene-2-isopropyl-6-[2-(1,1,7,7-tetramethyl-9-julolidyl)ethenyl]-4H-pyran (abbreviation: DCJTI), 4-dicyanomethylene-2-methyl-6-(1,1,7,7-tetramethyljulolidyl-9-enyl)-4H-pyran (abbreviation: DCJT), 4-dicyanomethylene-2-tert-butyl-6-[2-(1,1,7,7-tetramethyl-9-julolidyl)ethenyl]-4H-pyran (abbreviation: DCJTB), periflanthene, or 2,5-dicyano-1,4-bis(2-[10-methoxy-1,1,7,7-tetramethyl-9-julolidyl]ethenyl)benzene can be employed. In addition, in order to obtain green-based light emission, a material which presents light emission having an emission spectrum with a peak of 500 to 550 nm such as N,N"-dimethylquinacridone (abbreviation: DMQd), Coumarin 6, Coumarin 545T, or tris(8-quinolinolato)aluminum (abbreviation: Alq$_3$) can be employed. Further, in order to obtain blue light emission, a material which presents light emission having an emission spectrum with a peak of 420 to 500 nm such as 2-tert-butyl-9,10-di(2-naphthyl)anthracene (abbreviation: t-BuDNA), 9,10-diphenylanthracene (abbreviation: DPA), 9,10-di(2-naphthyl)anthracene (abbreviation: DNA), bis(2-methyl-8-quinolinolato)-4-phenylphenolato-gallium (abbreviation: BGaq), or bis(2-methyl-8-quinolinolato)(4-phenylphenolato)aluminum (abbreviation: BAlq) can be employed. In addition to the aforementioned materials which emit fluorescence, materials which emit phosphorescence such as tris(2-phenylpyridine)iridium may also be employed.

A material used for making the light-emitting material into the dispersion state (also called a host material) is not limited to a certain material. In addition to a compound having an arylamine skeleton such as 4,4'-bis[N-(1-naphthyl)-N-phenylamino]biphenyl (abbreviation: α-NPD), a carbazole derivative such as 4,4'-bis(N-carbazolyl)biphenyl (abbreviation: CBP) or 4,4',4"-tri(N-carbazolyl)triphenylamine (abbreviation: TCTA), a metal complex such as bis[2-(2-hydroxyphenyl)pyridinato]zinc (abbreviation: Znpp$_2$), bis[2-(2'-hydroxypheyl)benzoxazolato]zinc (abbreviation: Zn(BOX)$_2$), or tris(8-quinolinolato)aluminum (abbreviation: Alq$_3$), or the like can be employed.

In addition, as shown in FIG. 6B, a light-emitting element formed by stacking layers in reverse order from FIG. 6A can be employed. That is, the light-emitting element shown in FIG. 6B has an element structure where a substrate 601, a cathode 608, an electron inject layer 607 which is made of an electron inject material, an electron transport layer 606 which is made of an electron transport material, a light-emitting layer 605, a hole transport layer 604 which is made of a hole transport material, a hole inject layer 603 which is made of a hole inject material, and an anode 602 are stacked in this order.

In order to extract light emission from the light-emitting element, at least one of the anode and the cathode of the light-emitting elements is required to be transparent. A TFT and the light-emitting element are formed over a substrate; and there are light-emitting elements having a top emission structure where light emission is extracted through a surface on the side opposite to the substrate, having a bottom emission structure where light emission is extracted through a surface on the substrate side, and a dual emission structure where light emission is extracted through both the surface on the side opposite to the substrate and the surface on the substrate side. The pixel configuration of the invention can be applied to the light-emitting elements having any emission structure.

By combining materials having the respective functions as described above, the light-emitting elements of the invention can be manufactured.

[Configuration of an Emission Structure in the Display Device of this Embodiment Mode]

Figure 7:
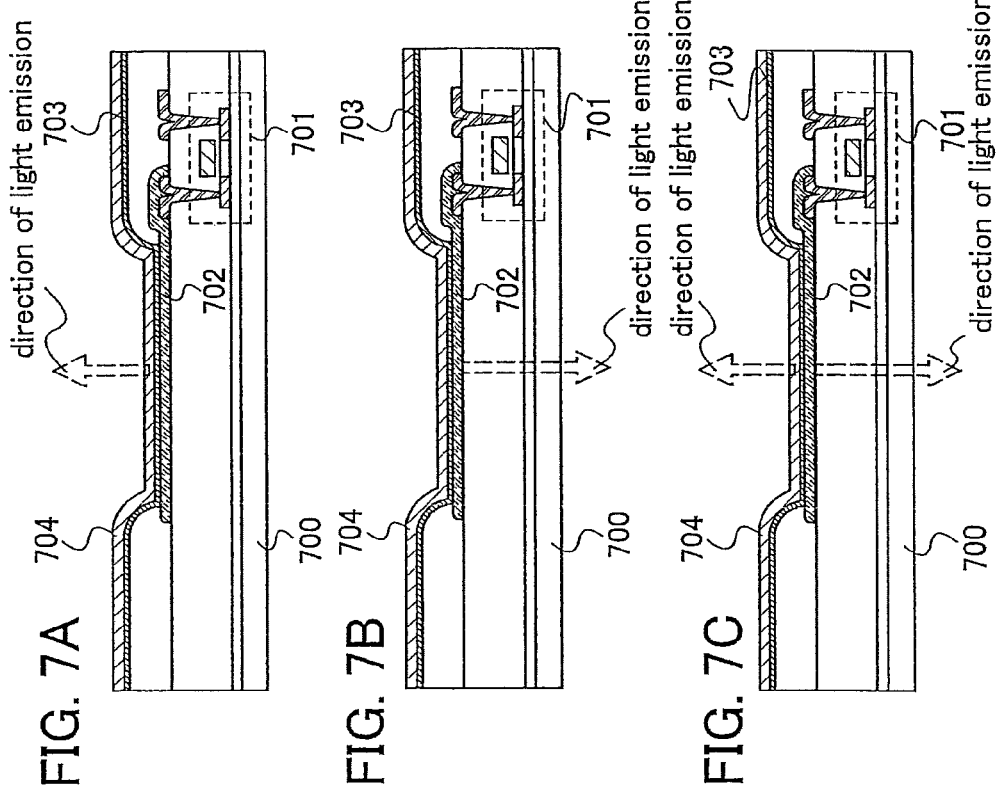
FIGS. 7A to 7C are cross-sectional views of a display device in the invention.

Next, examples of a top emission structure, a bottom emission structure, and a dual emission structure of light-emitting elements which can be applied to the display device of the invention are shown FIGS. 7A to 7C.

A light-emitting element with the top emission structure is shown in FIG. 7A.

In the light-emitting element with the top emission structure, a driving TFT 701 is formed over a substrate 700, a first electrode 702 is formed to be connected to a source electrode of the driving TFT 701, and a light-emitting layer 703 and a second electrode 704 are formed over the first electrode 702.

In addition, the first electrode 702 is an anode of the light-emitting element while the second electrode 704 is a cathode of the light-emitting element. That is, the portion where the light-emitting layer 703 is sandwiched between the first electrode 702 and the second electrode 704 corresponds to the light-emitting element.

Further, as a material used for the first electrode 702 functioning as the anode, a material having a high work function is preferably employed. For example, in addition to a single layer of a titanium nitride film, a chromium film, a tungsten film, a Zn film, a Pt film, or the like, stacked layers of a titanium nitride film and a film containing aluminum as a main component, a three-layer structure of a titanium nitride film, a film containing aluminum as a main component, and a titanium nitride film can be employed. Note that with a stacked structure, resistance as a wire is low, an excellent ohmic contact can be obtained, and a function as an anode can also be obtained. By using a metal film which reflects light, an anode which does not transmit light can be obtained.

Furthermore, as a material used for the second electrode 704 functioning as the cathode, stacked layers of a thin metal film formed of a material having a low work function (Al, Ag, Li, Ca, or an alloy of these such as MgAg, MgIn, AlLi, CaF$_2$, or calcium nitride) and a transparent conductive film (of ITO (Indium Tin Oxide), indium zinc oxide (IZO), zinc oxide (ZnO), or the like) is preferably employed. By using a thin metal film and a transparent conductive film having transparency in this manner, a cathode which can transmit light can be formed.

In this manner, light emitted from the light-emitting element can be extracted to the top surface as shown by an arrow in FIG. 7A.

In addition, the light-emitting element with the bottom emission structure is shown in FIG. 7B. Since the light-emitting element of the bottom emission structure is the same as the light-emitting element with the structure in FIG. 7A other than the emission structure, description is made with the same numerals as those in FIG. 7A.

Here, as a material used for the first electrode 702 functioning as the anode, a material having a high work function is desirably employed. For example, a transparent conductive film such as an ITO (Indium Tin Oxide) film or an indium zinc oxide (IZO) film can be employed. By using a transparent conductive film having transparency in this manner, an anode which can transmit light can be formed.

Further, as a material used for the second electrode 704 functioning as the cathode, a metal film formed of a material having a low work function (Al, Ag, Li, Ca, or an alloy of these such as MgAg, MgIn, AlLi, CaF$_2$, or calcium nitride) can be used. By using a metal film which reflects light in this manner, a cathode which does not transmit light can be obtained.

In this manner, light emitted from the light-emitting element can be extracted to the bottom surface as shown by an arrow in FIG. 7B.

The light-emitting element with the dual emission structure is shown in FIG. 7C. Since the light-emitting element with the dual emission structure is the same as the light-emitting element with the structure in FIG. 7A other than the emission structure, description is made with the same numerals as those in FIG. 7A.

Here, as a material used for the first electrode 702 functioning as the anode, a material having a high work function is desirably employed. For example, a transparent conductive film such as an ITO (Indium Tin Oxide) film or an indium zinc oxide (IZO) film can be employed. By using a transparent conductive film having transparency in this manner, an anode which can transmit light can be formed.

In addition, as a material used for the second electrode 704 functioning as the cathode, stacked layers of a thin metal film formed of a material having a low work function (Al, Ag, Li, Ca, or an alloy of these such as MgAg, MgIn, AlLi, $CaF_2$, or calcium nitride) and a transparent conductive film (of ITO (Indium Tin Oxide), indium oxide zinc oxide alloy ($In_2O_3$—ZnO), zinc oxide (ZnO), or the like) is preferably employed. By using a thin metal film and a transparent conductive film having transparency in this manner, a cathode which can transmit light can be formed.

In this manner, light emitted from the light-emitting element can be extracted to both the top and bottom surfaces as shown by arrows in FIG. 7C.

The aforementioned emission structures can be employed for the display device of the invention.

Further, in the emission structures shown in FIGS. 7A to 7C, another emission structure having more interlayer films can also be employed.

Figure 51:
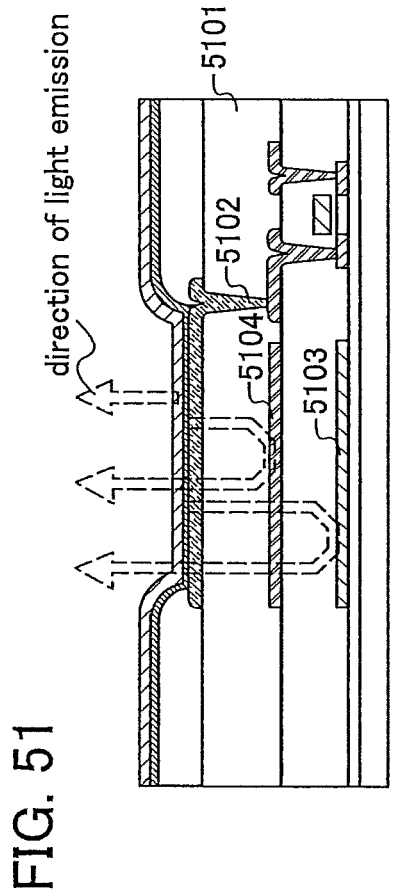
FIG. 51 is a cross-sectional view of a display device in the invention.

In FIG. 51A, a structure of a light-emitting element with a top emission structure is shown as an example. The structure shown in FIG. 51A is different from FIG. 7A in that a single-layered interlayer insulating film 5101 and a wire 5102 for being connected to a first electrode are provided. By employing a film having planarity for the interlayer insulating film 5101, disconnection of wires or the like due to steps of the interlayer film can be preferably reduced, for example, in the first electrode or the like provided over the interlayer insulating film 5101.

In addition, a structure where a first reflecting electrode 5103 which is made of the same material as a gate electrode and a second reflecting electrode 5104 which is made of the same material as source and drain electrodes are provided below the light-emitting element is preferably employed. In the top emission structure, efficiency of light extraction is bad since light emitted below the light-emitting element is not emitted to the viewer's side. However, by employing a structure where the first reflecting electrode 5103 and the second reflecting electrode 5104 are provided, more light can be emitted through the top surface of the light-emitting element, and thus, it is preferable.

The aforementioned emission structures can be employed for the display device of the invention.

[Structure of a Light-Emitting Material in the Display Device in this Embodiment Mode]

Next, a specific example of a light-emitting material used for the light-emitting element which can be applied to the display device of the invention is described.

Description has been made of the configuration of the pixel portion of the invention where the picture element of the invention includes the first pixel, the second pixel, the third pixel, the fourth pixel, the fifth pixel, and the sixth pixel in FIG. 2. In addition, a light-emitting element is provided in each of the first pixel to the sixth pixel, such that the light-emitting element R1, the light-emitting element R2, the light-emitting element G1, the light-emitting element G2, the light-emitting element B1, and the light-emitting element B2 are connected to the first pixel, the second pixel, the third pixel, the fourth pixel, the fifth pixel, and the sixth pixel, respectively.

In this specification, the light-emitting element R1 of the first pixel and the light-emitting element R2 of the second pixel of the invention have chromaticity whose x-coordinate in the CIE-XY chromaticity diagram is 0.50 or more. In addition, the light-emitting element G1 of the third pixel and the light-emitting element G2 of the fourth pixel of the invention have chromaticity whose y-coordinate in the CIE-XY chromaticity diagram is 0.55 or more. Further, the light-emitting element B1 of the fifth pixel and the light-emitting element B2 of the sixth pixel of the invention have chromaticity whose x-coordinate and y-coordinate in the CIE-XY chromaticity diagram are 0.15 or less and 0.20 or less, respectively.

Note that a structure which satisfies the following conditions is more preferable. Either one of the light-emitting element of the first pixel or the light-emitting element of the second pixel has chromaticity whose x-coordinate and y-coordinate in the CIE-XY chromaticity diagram are 0.60 or more and 0.35 or less, respectively; either one of the light-emitting element of the third pixel or the light-emitting element of the fourth pixel has chromaticity whose x-coordinate and y-coordinate in the CIE-XY chromaticity diagram are 0.30 or less and 0.60 or more, respectively; either one of the light-emitting element of the fifth pixel or the light-emitting element of the sixth pixel has chromaticity whose x-coordinate and y-coordinate in the CIE-XY chromaticity diagram are 0.15 or less and 0.20 or less, respectively. By arranging the respective color coordinates of the light-emitting elements provided in the first pixel and the second pixel; the light-emitting elements provided in the third pixel and the fourth pixel; and the light-emitting elements provided in the fifth pixel and the sixth pixel in different regions of the CIE-XY chromaticity diagram, a display device having a more improved color reproduction area on the CIE-XY chromaticity diagram can be obtained.

Specific examples of the light-emitting elements R1 and R2 used for the first pixel and the second pixel of the invention are described.

A specific element structure of the light-emitting element R1 which is provided in the first pixel is described. First, CuPu having a thickness of 20 nm is formed as a hole inject layer over ITO having a thickness of 110 nm; NPB having a thickness of 30 nm is formed as a hole transport layer; a co-evaporation layer having a thickness of 30 nm is formed as a light-emitting layer, by co-evaporating 2,3-bis(4-diphenylaminophenyl)quinoxaline (abbreviation: TPAQn) which is a host material and bis[2-(2'-benzothienyl)pyridinato-N,C3'] iridium(acetylacetonate) (abbreviation: Ir(btp)2(acac); BAlq having a thickness of 10 nm is formed as an electron transport layer; Alq having a thickness of 20 nm is formed; calcium fluoride having a thickness of 2 nm is formed as an electron inject layer; and Al having a thickness of 150 nm is formed as a cathode sequentially. Note that the ratio of TPAQn to Ir(btp) 2(acac) in the light-emitting layer is controlled so that Ir(btp) 2(acac) has a concentration of 8 wt %.

In addition, a specific element structure of the light-emitting element R2 which is provided in the second pixel is described. First, CuPu having a thickness of 20 nm is formed as a hole inject layer over ITO having a thickness of 110 nm; NPB having a thickness of 30 nm is formed as a hole transport layer; a co-evaporation layer having a thickness of 30 nm is formed as a light-emitting layer, by co-evaporating TPAQn which is a host material and rubrene; BAlq having a thickness of 10 nm is formed as an electron transport layer; Alq having a thickness of 20 nm is formed; calcium fluoride having a thickness of 2 nm is formed as an electron inject layer; and Al having a thickness of 150 nm is formed as a cathode sequentially. Note that the ratio of TPAQn to rubrene in the light-emitting layer is controlled so that rubrene has a concentration of 10 wt %.

Figure 8:
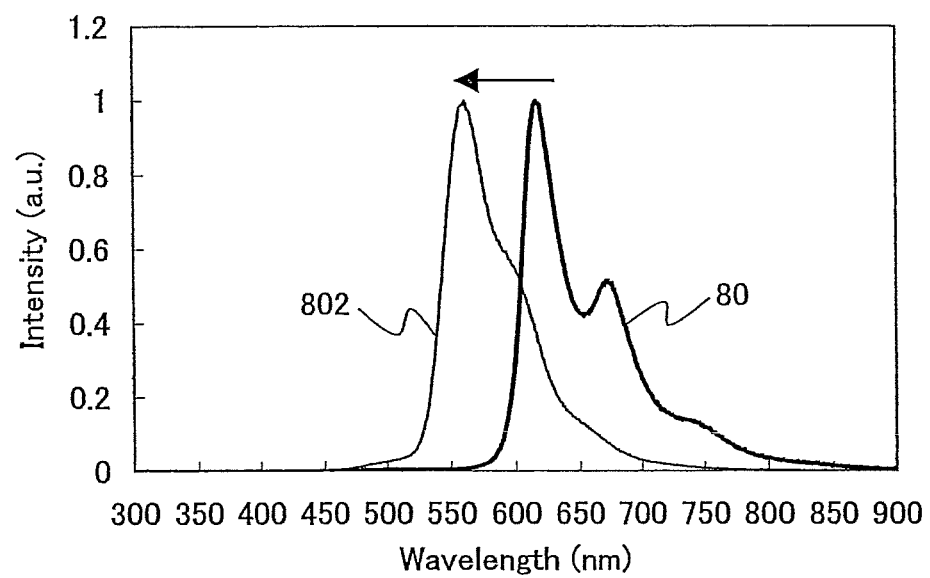
FIG. 8 is a diagram of emission spectrums of light-emitting elements.

FIG. 8 shows an emission spectrum 801 of the light-emitting element R1 manufactured as above and an emission spectrum 802 of the light-emitting element R2 manufactured as above. The emission spectrums in FIG. 8 correspond to emission spectrums when current is supplied to the light-emitting elements with a current density of 25 mA/cm$^2$. The emission spectrum 802 of the light-emitting element R2 is located in a position which is shifted to the short-wavelength side of the emission spectrum 801 of the light-emitting element R1 in FIG. 8. At this time, chromaticity coordinates of the light-emitting element R1 on the CIE-XY chromaticity diagram are (x, y)=(0.68, 0.32). In addition, chromaticity coordinates of the light-emitting element R2 on the CIE-XY chromaticity diagram are (x, y)=(0.47, 0.52).

Next, specific examples of the light-emitting elements G1 and G2 used for the third pixel and the fourth pixel of the invention are described.

A specific element structure of the light-emitting element G1 which is provided in the third pixel is described. DNTPD having a thickness of 50 nm is formed as a hole inject layer over ITO having a thickness of 110 nm; NPB having a thickness of 10 nm is formed as a hole transport layer; a co-evaporation layer having a thickness of 37.5 nm is formed as a light-emitting layer, by co-evaporating Alq which is a host material and Coumarin 6; Alq having a thickness of 37.5 nm is formed as an electron transport layer; calcium fluoride having a thickness of 2 nm is formed as an electron inject layer; and Al having a thickness of 150 nm is formed as a cathode sequentially. Note that the ratio of Alq to Coumarin 6 in the light-emitting layer is controlled so that Coumarin 6 has a concentration of 0.3 wt %.

In addition, a specific element structure of the light-emitting element G2 which is provided in the fourth pixel is described. DNTPD having a thickness of 50 nm is formed as a hole inject layer over ITO having a thickness of 110 nm; NPB having a thickness of 10 nm is formed as a hole transport layer; a co-evaporation layer having a thickness of 37.5 nm is formed as a light-emitting layer, by co-evaporating Alq which is a host material and DMQd; Alq having a thickness of 37.5 nm is formed as an electron transport layer; calcium fluoride having a thickness of 2 nm is formed as an electron inject layer; and Al having a thickness of 150 nm is formed as a cathode sequentially. Note that the ratio of Alq to DMQd in the light-emitting layer is controlled so that DMQd has a concentration of 0.3 wt %.

Figure 9:
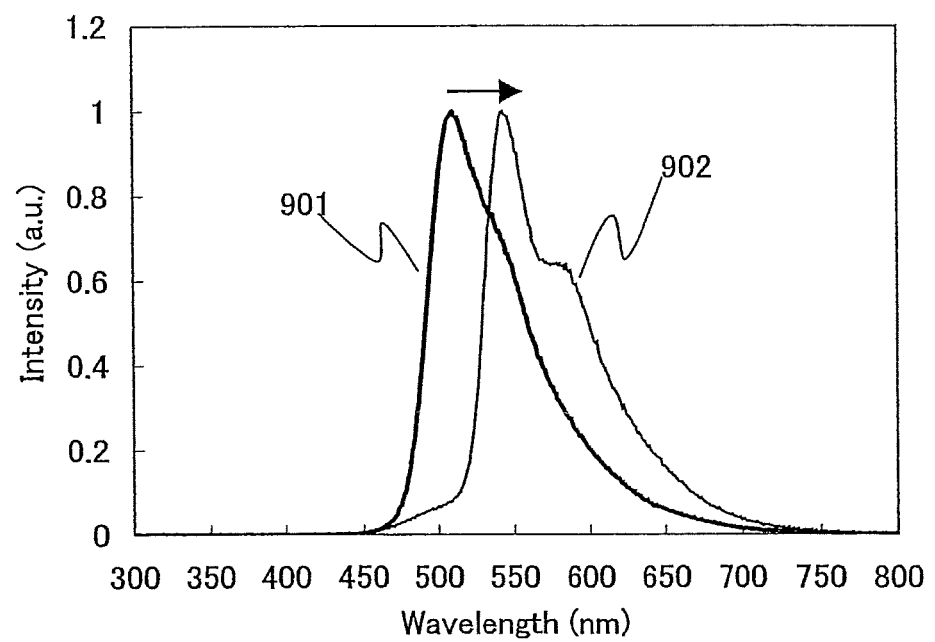
FIG. 9 is a diagram of emission spectrums of light-emitting elements.

FIG. 9 shows an emission spectrum 901 of the light-emitting element G1 manufactured as above and an emission spectrum 902 of the light-emitting element G2 manufactured as above. The emission spectrums in FIG. 9 correspond to emission spectrums when current supplied to the light-emitting elements with a current density of 25 mA/cm$^2$. The emission spectrum 902 of the light-emitting element G2 is located in a position shifted to the long-wavelength side of the emission spectrum 901 of the light-emitting element G1 in FIG. 9. At this time, chromaticity coordinates of the light-emitting element G1 on the CIE-XY chromaticity diagram are (x, y)=(0.28, 0.63). In addition, chromaticity coordinates of the light-emitting element G2 on the CIE-XY chromaticity diagram are (x, y)=(0.43, 0.56).

Next, specific examples of the light-emitting elements B1 and B2 used for the fifth pixel and the sixth pixel of the invention are described.

In addition, a specific element structure of the light-emitting element B1 which is provided in the fifth pixel is described. DNTPD having a thickness of 30 nm is formed as a hole inject layer over ITO having a thickness of 110 nm; NPB having a thickness of 30 nm is formed as a hole transport layer; t-BuDNA having a thickness of 40 nm is formed as a light-emitting layer; Alq having a thickness of 20 nm is formed as an electron transport layer; calcium fluoride having a thickness of 2 nm is formed as an electron inject layer; and Al having a thickness of 50 nm is formed as a cathode sequentially.

Further, a specific element structure of the light-emitting element B2 which is provided in the sixth pixel is described. DNTPD having a thickness of 30 nm is formed as a hole inject layer over ITO having a thickness of 110 nm; NPB having a thickness of 30 nm is formed as a hole transport layer; a co-evaporation layer of 40 nm is formed as a light-emitting layer, by co-evaporating t-BuDNA and TPAQn; Alq having a thickness of 20 nm is formed as an electron transport layer; calcium fluoride having a thickness of 2 nm is formed as an electron inject layer; and Al having a thickness of 150 nm is formed as a cathode sequentially. Note that the ratio of t-BuDNA to TPAQ in the light-emitting layer is controlled so TPAQn has a concentration of 5 wt %.

Figure 10:
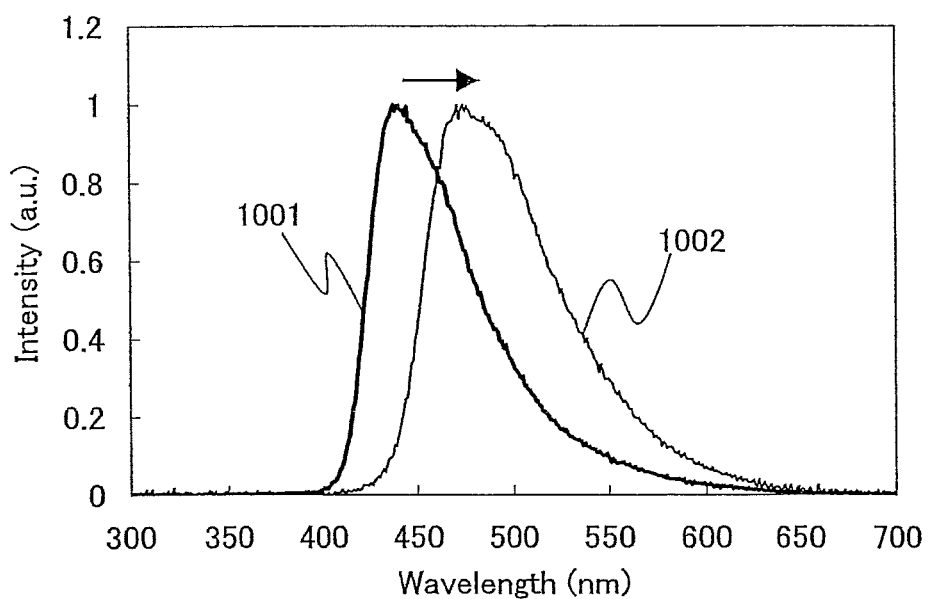
FIG. 10 is a diagram of emission spectrums of light-emitting elements.

FIG. 10 shows an emission spectrum 1001 of the light-emitting element B1 manufactured as above and an emission spectrum 1002 of the light-emitting element B2 manufactured as above. The emission spectrums in FIG. 10 correspond to emission spectrums when current is supplied to the light-emitting elements with a current density of 25 mA/cm$^2$. The emission spectrum 1002 of the light-emitting element B2 is located in a position shifted to the long-wavelength side of the emission spectrum 1001 of the light-emitting element B1 in FIG. 10. At this time, chromaticity coordinates of the light-emitting element B1 on the CIE-XY chromaticity diagram are (x, y)=(0.15, 0.11). In addition, chromaticity coordinates of the light-emitting element B2 on the CIE-XY chromaticity diagram are (x, y)=(0.18, 0.32).

Figure 11:
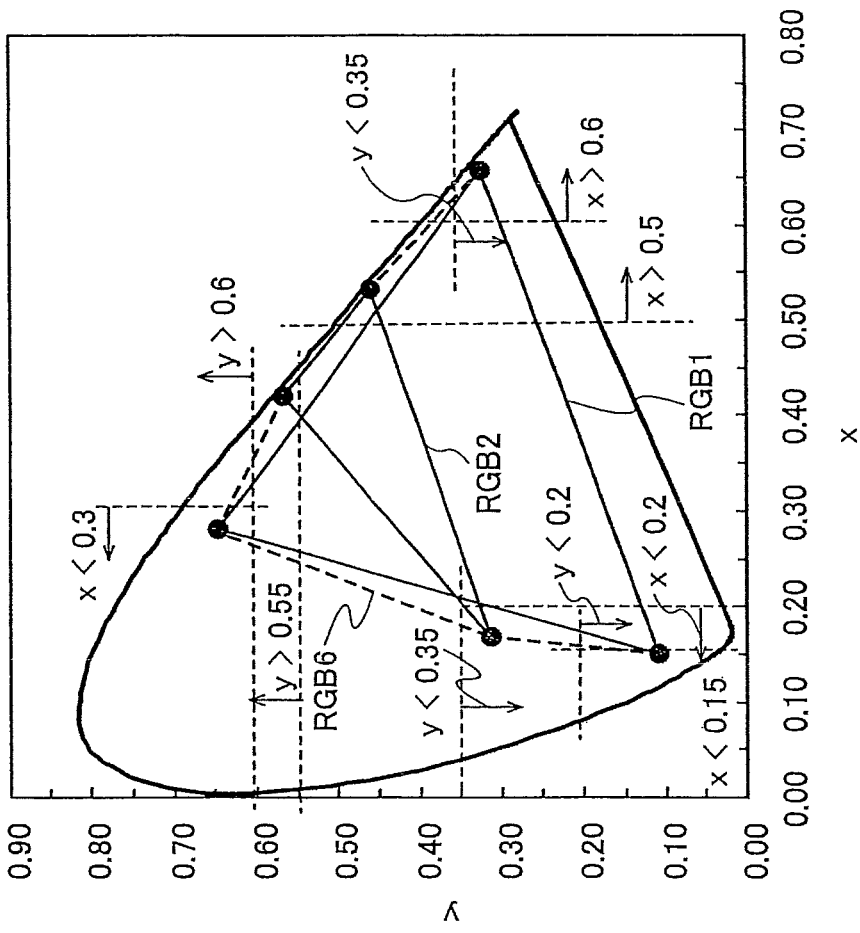
FIG. 11 is a CIE-XY chromaticity diagram of light-emitting elements in the invention.

FIG. 11 shows the CIE-XY chromaticity diagram and a diagram where each color coordinate of the light-emitting elements R1, R2, G1, G2, B1, and B2 manufactured as above are plotted. In FIG. 11, a region where color coordinates of the light-emitting elements R1, G1, and B1 are connected corresponds to RGB1, while a region where color coordinates of the light-emitting elements R2, G2, and B2 are connected corresponds to RGB2. By providing different tones of color of RGB which are the trichromaticity of colors, colors with tones in a region surrounded by RGB6 can be expressed, and thus, a display device having an improved color reproduction area on the CIE-XY chromaticity diagram can be provided.

Note that in each light-emitting element, when the optical distance between a light-emitting region and a reflecting electrode (an electrode which reflects light) is L and a desired wavelength of light is λ, a so-called micro resonator structure (a micro cavity structure) which satisfies L=(2m−1)λ/4 (note that m is a natural number not less than 1) can be employed in order to increase the color purity.

Note also that any one of the color coordinates of the light-emitting elements R2, G2, and B2 is only required to be located outside the region where color coordinates of the light-emitting elements R1, G1, and B1 are connected. This is because if all of the light-emitting elements R2, G2, and B2 have color coordinates inside the region where color coordinates of the light-emitting elements R1, G1, and B1 are connected, color reproduction areas of RGB1 and RGB2 overlap with each other.

As described above, the display device of the invention can employ the aforementioned materials of the light-emitting elements in each pixel. Note that the aforementioned materials of the light-emitting elements are only illustrative, and therefore, any light-emitting element can be employed as long as it has similar color coordinates to those of the invention.

Note that this embodiment can be freely combined with the other embodiment modes or embodiments in this specification.

Embodiment Mode 2

In this embodiment mode, a different configuration of light-emitting elements from the configuration of the light-emitting elements in the display of the invention in the aforementioned embodiment mode is described.

Description has been made of the configuration of the pixel portion of the invention with reference to FIG. 2 where the picture element of the invention includes the first pixel, the second pixel, the third pixel, the fourth pixel, the fifth pixel, and the sixth pixel. In addition, a light-emitting element is provided in each of the first pixel to the sixth pixel, so that a light-emitting element R1, a light-emitting element R2, a light-emitting element G1, a light-emitting element G2, a light-emitting element B1, and a light-emitting element B2 are connected to the first pixel, the second pixel, the third pixel, the fourth pixel, the fifth pixel, and the sixth pixel, respectively.

In this specification, the light-emitting element R1 in the first pixel and the light-emitting element R2 in the second pixel of the invention in this specification have chromaticity whose x-coordinate in the CIE-XY chromaticity diagram is 0.50 or more. In addition, the light-emitting element G1 in the third pixel and the light-emitting element G2 in the fourth pixel of the invention have chromaticity whose y-coordinate in the CIE-XY chromaticity diagram is 0.55 or more. Further, the light-emitting element B1 in the fifth pixel and the light-emitting element B2 in the sixth pixel of the invention have chromaticity whose x-coordinate and y-coordinate in the CIE-XY chromaticity diagram is 0.15 or less and 0.20 or less, respectively.

In this embodiment mode, the light-emitting elements R1 and R2 provided in the first and second pixels are formed to have different emission spectrums from each other; the light-emitting elements G1 and G2 provided in the third and fourth pixels are formed to have different emission spectrums from each other, and the light-emitting elements B1 and B2 provided in the fifth and sixth pixels are formed to have different emission spectrums from each other, by varying the thickness of the respective light-emitting elements. Accordingly, the color coordinates on the CIE-XY chromaticity diagram are varied between the light-emitting elements R1 and R2 provided in the first and second pixels, between the light-emitting elements G1 and G2 provided in the third and fourth pixels, and between the light-emitting elements B1 and B2 provided in the fifth and sixth pixels, respectively. A specific example is shown below.

In this embodiment mode, a specific example for varying coordinates of the CIE-XY chromaticity diagram between the light emitting-element G1 and the light-emitting element G2 used for the third pixel and the fourth pixel is described.

A specific structure of the light-emitting element G1 provided in the third pixel is described. CuPc of having a thickness of 20 nm is formed as a hole inject layer over ITO having a thickness of 110 nm; NPB having a thickness of 40 nm is formed as a hole transport layer; a co-evaporation layer of 40 nm is formed as a light-emitting layer, by co-evaporating Alq which is a host material and Coumarin 6 which is a green light-emitting material; a co-evaporation layer having a thickness of 30 snm is formed as an electron inject layer, by co-evaporating Alq and Li; and Al having a thickness of 150 nm is formed as a cathode sequentially. Note that the ratio of Alq to Coumarin 6 in the light-emitting layer is controlled so that Coumarin 6 has a concentration of 0.3 wt %. In addition, the ratio of Alq to Li in the electron inject layer is controlled so that Li has a concentration of 1 wt %.

Figure 12A:
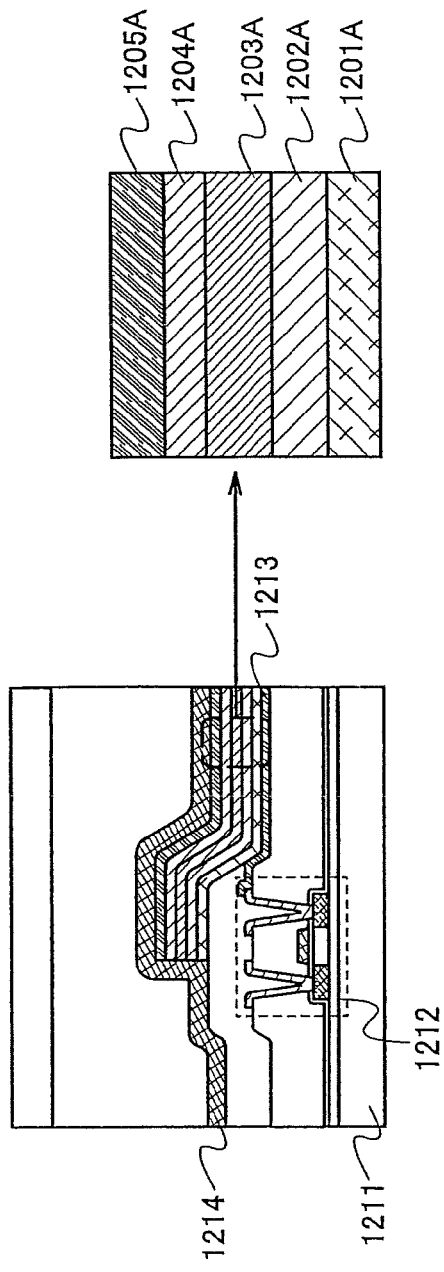
FIGS. 12A and 12B are cross-sectional views of light-emitting elements of a display device in the invention.

A stacked structure of the light-emitting element G1 provided in the third pixel is shown in FIG. 12A. The light-emitting element G1 has an element structure where a substrate 1211, an anode 1213 formed thereover with a transistor 1212 sandwiched therebetween, a hole inject layer 1201A which is made of a hole inject material, a hole transport layer 1202A which is made of a hole transport material, a light-emitting layer 1203A, an electron transport layer 1204A which is made of an electron transport material, an electron inject layer 1205A which is made of an electron inject material, and a cathode 1214 are stacked in this order. Note that a stacked structure in a right view of FIG. 12A corresponds to an enlarged cross-sectional view of the light-emitting element portion in FIG. 12A.

A specific structure of the light-emitting element G2 provided in the fourth pixel is described. CuPc having a thickness of 20 nm is formed as a hole inject layer over ITO having a thickness of 110 nm; NPB having a thickness of 40 nm is formed as a hole transport layer, a co-evaporation layer having a thickness of 40 nm is formed as a light-emitting layer, by co-evaporating Alq which is a host material and Coumarin 6 which is a green light-emitting material; a co-evaporation layer having a thickness of 30 nm is formed as an electron inject layer, by co-evaporating Alq and Li; a co-evaporation layer having a thickness of 180 nm is formed, by co-evaporating NPB and molybdenum oxide (VI); and Al having a thickness of 150 nm is formed as a cathode sequentially. Note that the ratio of Alq to Coumarin 6 in the light-emitting layer is controlled so that Coumarin 6 has a concentration of 0.3 wt %. In addition, the ratio of Alq to Li in the electron inject layer is controlled so that Li has a concentration of 1 wt %. Note that the ratio of NPB to molybdenum oxide (VI) is controlled so that molybdenum oxide has a concentration of 20 wt %.

Figure 12B:
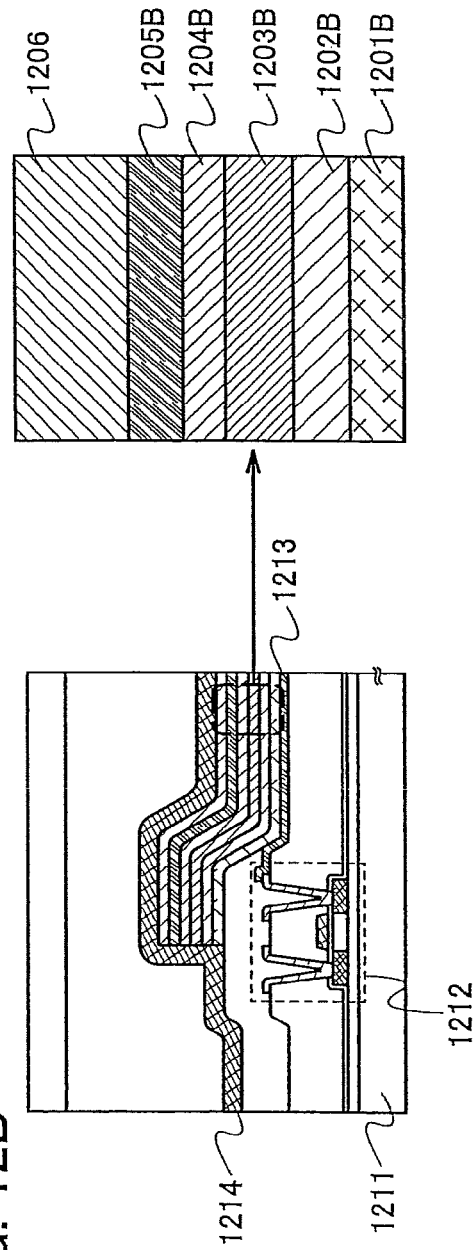

A stacked structure of the light-emitting element G2 provided in the fourth pixel is shown in FIG. 12B. The light-emitting element G2 has an element structure where a substrate 1211, an anode 1213 formed thereover with a transistor 1212 sandwiched therebetween, a hole inject layer 1201B which is made of a hole inject material, a hole transport layer 1202B which is made of a hole transport material, a light-emitting layer 1203B, an electron transport layer 1204B which is made of an electron transport material, the electron inject layer 1205B which is made of an electron inject material, a co-evaporation layer of NPB and molybdenum oxide (VI) 1206, and a cathode 1214 are stacked in this order. Note that a stacked structure in a right view of FIG. 12B corresponds to an enlarged cross-sectional view of the light-emitting element portion in FIG. 12B.

Figure 13:
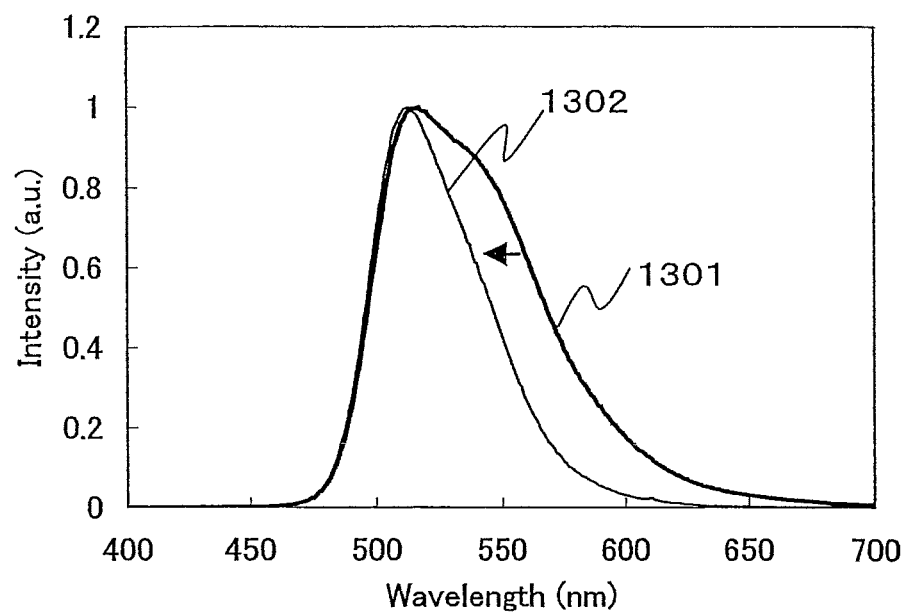
FIG. 13 is a diagram of emission spectrums of light-emitting elements.

In addition, FIG. 13 shows an emission spectrum 1301 of the light-emitting element G1 which is stacked as shown in FIG. 12A, and an emission spectrum 1302 of the light-emitting element G2 which is stacked as shown in FIG. 12B. The emission spectrums in FIG. 13 correspond to emission spectrums when current is supplied to the light-emitting elements with a current density of 25 mA/cm$^2$. The emission spectrum 1302 of the light-emitting element G2 is located in a position shifted to the short-wavelength side of the emission spectrum 1301 of the light-emitting element G1 in FIG. 13. At this time, chromaticity coordinates of the light-emitting element G1 on the CIE-XY chromaticity diagram are (x, y)=(0.30, 0.64). In addition, chromaticity coordinates of the light-emitting element G2 on the CIE-XY chromaticity diagram are (x, y)=(0.21, 0.69).

Similarly, the light-emitting elements R1 and R2 provided in the first and second pixels can be formed to have different emission spectrums from each other; and the light-emitting elements B1 and B2 provided in the fifth and sixth pixels can be formed to have different emission spectrums from each other, by varying the thickness of the respective light-emitting elements. In other words, the color coordinates on the CIE-XY chromaticity diagram can be varied between the light-emitting elements R1 and R2 provided in the first and second pixels, and between the light-emitting elements B1 and B2 provided in the fifth and sixth pixels.

Like an example shown in this embodiment mode, the light-emitting elements R1 and R2 provided in the first and second pixels can be formed to have different color coordinates from each other on the CIE-XY chromaticity diagram as well as the light-emitting elements B1 and B2 provided in the fifth and sixth pixels can be formed to have different color coordinates from each other on the CIE-XY chromaticity diagram, by varying the thickness of the respective light-emitting element. Needless to say, by using different materials for the respective light-emitting elements while at the same time varying the thickness of the respective light-emitting elements, light-emitting elements having different color coordinates from each other on the CIE-XY chromaticity diagram may be obtained.

Figure 45A:
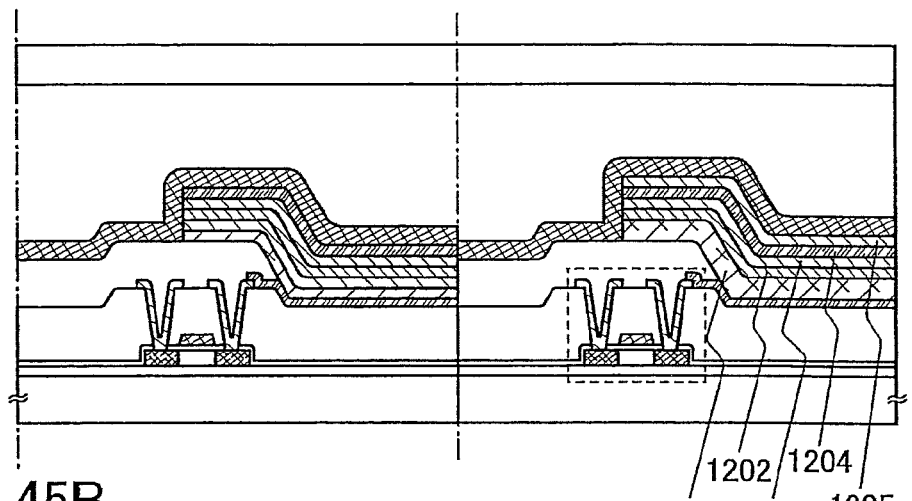
FIGS. 45A to 45C are cross-sectional views of light-emitting elements of a display device in the invention.
Figure 45B:
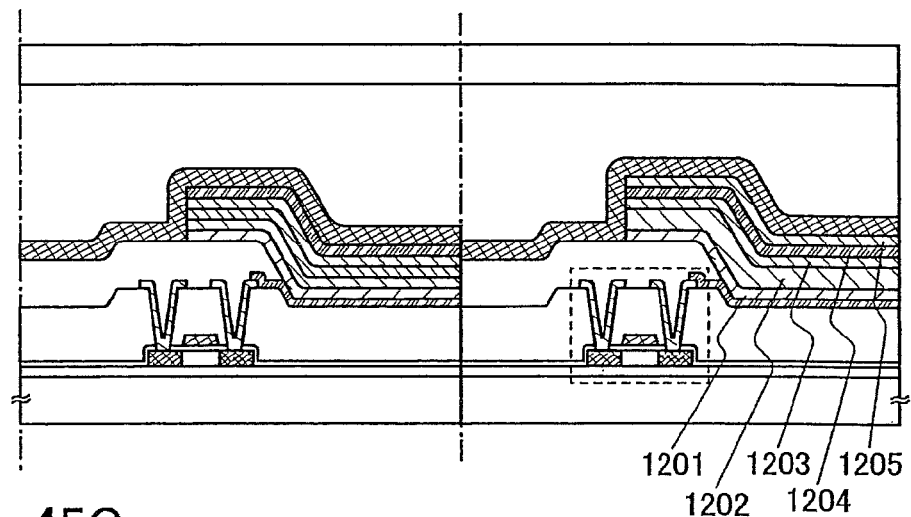
Figure 45C:
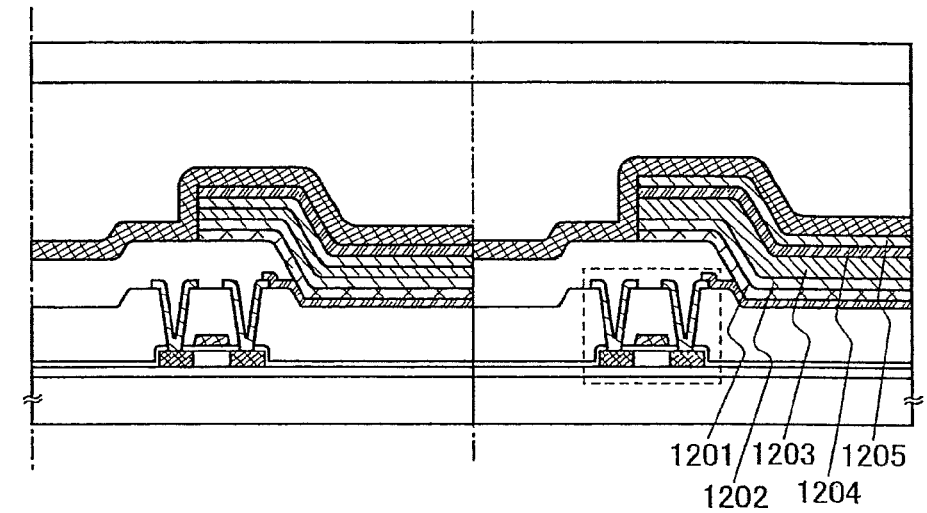
Figure 54A:
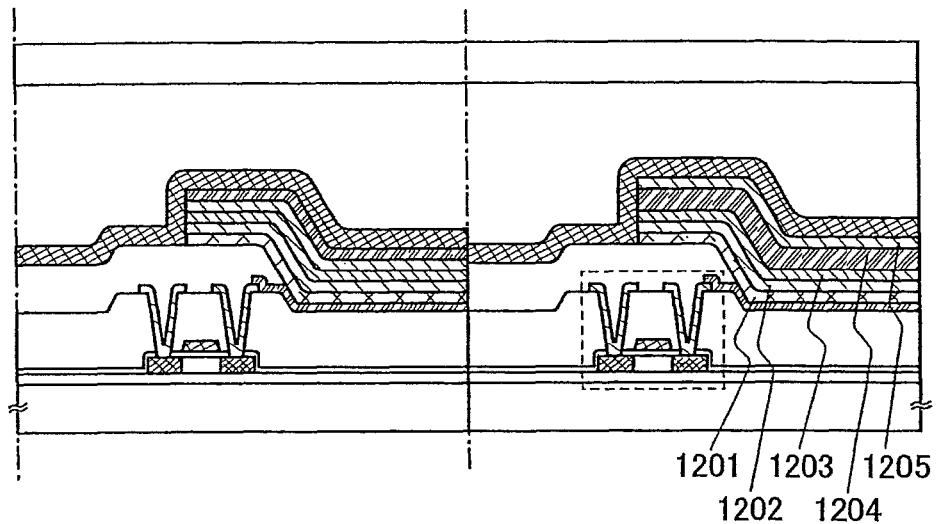
FIGS. 54A and 54B are cross-sectional views of light-emitting elements of a display device in the invention.
Figure 54B:
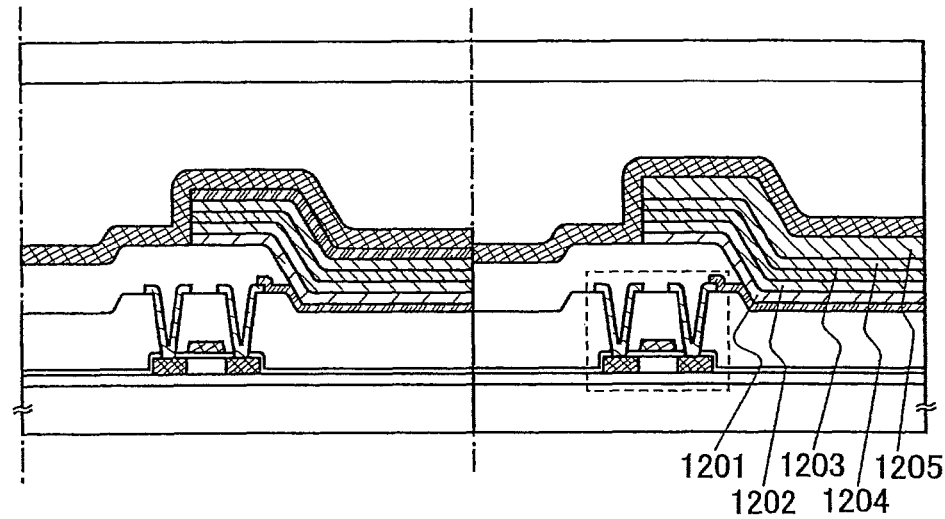

Furthermore, varying the emission spectrums by varying the thickness of the respective light-emitting elements (thickening) is not limited to be achieved by forming a co-evaporation layer. For example, as shown in FIGS. 45A to 45C and FIGS. 54A and 54B, varying the emission spectrums by varying the thickness of the respective light-emitting elements may be achieved by thickening any of a hole inject layer 1201, a hole transport layer 1202, a light-emitting layer 1203, an electron transport layer 1204, or an electron inject layer 1205. For example, as shown in FIG. 45A, by thickening the hole inject layer 1201, the thickness as a whole may be varied between the light-emitting elements R1 and R2, between the light-emitting elements G1 and G2, and between the light-emitting elements B1 and B2. Alternatively, as shown in FIG. 45B, by thickening the hole transport layer 1202, the thickness as a whole may be varied between the light-emitting elements R1 and R2, between the light-emitting elements G1 and G2, and between the light-emitting elements B1 and B2. Further alternatively, as shown in FIG. 45C, by thickening the light-emitting layer 1203, the thickness as a whole may be varied between the light-emitting elements R1 and R2, between the light-emitting elements G1 and G2, and between the light-emitting elements B1 and B2. In addition, as shown in FIG. 54A, by thickening the electron transport layer 1204, the thickness as a whole may be varied between the light-emitting elements R1 and R2, between the light-emitting elements G1 and G2, and between the light-emitting elements B1 and B2. Further, as shown in FIG. 54B, by thickening the electron inject layer 1205, the thickness as a whole may be varied between the light-emitting elements R1 and R2, between the light-emitting elements G1 and G2, and between the light-emitting elements B1 and B2. Needless to say, by thickening a plurality of films among the hole inject layer, the hole transport layer, the light-emitting layer, the electron transport layer, and the electron inject layer to vary the film thickness, light-emitting elements having different color coordinates from each other on the CIE-XY chromaticity diagram may be obtained.

Note that in order to achieve the thickening of the film, a co-evaporation layer including metal oxide is employed in this embodiment mode. By employing metal oxide for the co-evaporation layer, increase in driving voltage due to thickening of the film can be prevented, and thus, it is preferable.

Note that this embodiment mode in the invention is different from the so-called micro resonator structure (the micro cavity structure) which satisfies $L=(2m-1)\lambda/4$ (note that m is a natural number not less than 1) where the optical distance between a light-emitting region and a reflecting electrode (an electrode which reflects light) is L and a desired wavelength of light is $\lambda$. Note also that the optical distance is calculated by the following formula: "the actual distance×the refractive index at wavelength $\lambda$". The optical distance of the light-emitting element of this embodiment mode in the invention may be designed in any manner as long as the light-emitting elements R1 and R2 have different emission spectrums from each other, the light-emitting elements G1 and G2 have different emission spectrums from each other, and the light-emitting elements B1 and B2 have different emission spectrums from each other. For example, the light-emitting elements may be designed to be thinner in ascending order from the light-emitting element R1, the light-emitting element R2, the light-emitting element G1, the light-emitting element G2, the light-emitting element B1, and the light-emitting element B2. Alternatively, the light-emitting elements may also be designed to be thinner in ascending order from the light-emitting elements R1 and R2, the light-emitting elements G1 and G2, and the light-emitting elements B1 and B2.

Note also that by thickening the films of the light-emitting elements, the distance D between a first electrode (an anode) and a second electrode (a cathode) of the light-emitting element varies between the light-emitting elements R1 and R2, between the light-emitting elements G1 and G2, and between the light-emitting elements B1 and B2, respectively in this embodiment mode. In this specification, the distance D between the first electrode (the anode) and the second electrode (the cathode) of the light-emitting element corresponds to the distance between an end face of the first electrode on the light-emitting layer side and an end face of the second electrode on the light-emitting layer side (a boundary of the first electrode on the hole inject layer, and a boundary of the second electrode on the electron inject layer in this embodiment mode).

As described above, the display device of the invention can employ the aforementioned materials of the light-emitting elements in each pixel. Note that the aforementioned materials of the light-emitting elements are only illustrative; therefore, any light-emitting element can be employed as long as it has a similar color coordinate to that of the invention.

Note that this embodiment can be freely combined with the other embodiment modes or embodiments in this specification.

Embodiment Mode 3

In this embodiment mode, a different configuration of light-emitting elements from the configuration of the light-emitting elements in the display of the invention in the aforementioned embodiment modes is described.

Description has been made of the configuration of the pixel portion of the invention where the picture element of the invention includes the first pixel, the second pixel, the third pixel, the fourth pixel, the fifth pixel, and the sixth pixel in FIG. 2 In addition, a light-emitting element is provided in each of the first pixel to the sixth pixel, such that a light-emitting element R1, a light-emitting element R2, a light-emitting element G1, a light-emitting element G2, a light-emitting element B1, and a light-emitting element B2 are connected to the first pixel, the second pixel, the third pixel, the fourth pixel, the fifth pixel, and the sixth pixel, respectively.

In this specification, the light-emitting element R1 of the first pixel and the light-emitting element R2 of the second pixel of the invention have chromaticity whose x-coordinate in the CIE-XY chromaticity diagram is 0.50 or more. In addition, the light-emitting element G1 of the third pixel and the light-emitting element G2 of the fourth pixel of the invention have chromaticity whose y-coordinate in the CIE-XY chromaticity diagram is 0.55 or more. Further, the light-emitting element B1 of the fifth pixel and the light-emitting element B2 of the sixth pixel of the invention have chromaticity whose x-coordinate and y-coordinate in the CIE-XY chromaticity diagram are 0.15 or less and 0.20 or less, respectively.

In this embodiment mode, the light-emitting elements R1 and R2 provided in the first and second pixels are formed to have roughly equal emission spectrums to each other, the light-emitting elements G1 and G2 provided in the third and fourth pixels are formed to have roughly equal emission spectrums to each other, and the light-emitting elements B1 and B2 provided in the fifth and sixth pixels are formed to have roughly equal emission spectrums to each other. By providing a color filter at a portion through which light emitted from each of the light-emitting elements travels, the color coordinates on the CIE-XY chromaticity diagram are varied between the light-emitting elements R1 and R2 provided in the first and second pixels, between the light-emitting elements G1 and G2 provided in the third and fourth pixels, and between the light-emitting elements B1 and B2 provided in the fifth and sixth pixels. A specific example is shown below.

In this embodiment mode, a configuration of a display device is described using a cross-sectional structure of a picture element portion.

FIGS. 14A and 14B are partial cross-sectional views of a picture element of the display device in this embodiment mode. The display device of the invention shown in FIG. 14A includes a substrate 1400, a base insulating film 1401, a semiconductor layer 1402, a gate insulating film 1403, a gate electrode 1404, an interlayer insulating film 1405, a connecting portion 1406, a first electrode 1407 of a light-emitting element, a partition wall 1408, a light-emitting layer 1409, a second electrode 1410 of the light-emitting element, a color filter (R1) 1411, a color filter (R2) 1412, a color filter (G1) 1413, a color filter (G2) 1414, a color filter (B1) 1415, a color filter (B2) 1416, and an opposite substrate 1417.

The light emitting-element is formed at a portion where the light-emitting layer 1409 is sandwiched between the first electrode 1407 and the second electrode 1410 of the light-emitting element. The light-emitting element is connected to a thin film transistor which is made of the semiconductor layer 1402, the gate insulating film 1403, and the gate electrode 1404 through the connecting portion 1406 which is electrically in contact with the first electrode 1407 of the light-emitting element to be controlled light emission. In addition, this embodiment mode shows a structure where the first electrode 1407 is a reflecting electrode formed of a highly reflective material, and the second electrode 1410 is a transparent electrode formed of a conductive material having a light transmitting property, so that light is extracted from the direction of the second electrode 1410.

Note that the thin film transistors in FIG. 14A drive the light-emitting element R1, the light-emitting element R2, the light-emitting element G1, the light-emitting element G2, the light-emitting element B1, and the light-emitting element B2, respectively, in order from left to right. Note that emission spectrums of the light-emitting elements in the case where the color filter are not provided in the respective pixels are roughly equal between the light-emitting elements R1 and R2, between the light-emitting elements G1 and G2, and between the light-emitting elements B1 and B2. Note also that arrows shown in FIG. 14A schematically show the light emitted through the color filters from the light-emitting element R1, the light-emitting element G1, the light-emitting element B1, the light-emitting element R2, the light-emitting element G2, and the light-emitting element B2, respectively, in order from left to right.

In this embodiment mode, the color filter (R1) 1411, the color filter (R2) 1412, the color filter (G1) 1413, the color filter (G2) 1414, the color filter (B1) 1415, and the color filter (B2) 1416 are provided at light-emission sides of the light-emitting elements R1 and R2 provided in the first and second pixels, the light-emitting elements G1 and G2 provided in the third and fourth pixels, and the light-emitting elements B1 and B2 provided in the fifth and sixth pixels, respectively. In this embodiment mode, by varying transmission properties of the color filter (R1) 1411 and the color filter (R2) 1412 from each other, varying transmission properties of the color filter (G1) 1413 and the color filter (G2) 1414 from each other, and varying transmission properties of the color filter (B1) 1415 and the color filter (B2) 1416 from each other to vary emission spectrums of the light emitted from the light-emitting elements R1 and R2 from each other, vary emission spectrums of the light emitted from the light-emitting elements G1 and G2 from each other, and vary emission spectrums of the light emitted from the light-emitting elements B1 and B2 from each other, light-emitting elements each having a different color coordinate on the CIE-XY chromaticity diagram can be obtained.

Note that the color filters may be manufactured by any of a pigment dispersion method, a printing method, an electrodeposition method, and a staining method. The light-emitting elements R1 and R2 provided in the first and second pixels, the light-emitting elements G1 and G2 provided in the third and fourth pixels, and the light-emitting elements B1 and B2 provided in the fifth and sixth pixels may be light-emitting elements having the same emission spectrum, for example, a light-emitting element having an emission spectrum which emits white light. By providing the light-emitting elements having the same emission spectrum, a process of producing the light-emitting elements can be simplified, and thus, it is preferable.

FIG. 14B is a partial cross-sectional view of a picture element of the display device in this embodiment mode. Note that each structure of the display device in the invention shown in FIG. 14B conforms to FIG. 14A.

What is different from FIG. 14A is that light emitted from the light-emitting element R1, the light-emitting element G1, and the light-emitting element B1 does not travel through the color filters. Emission spectrums of the light-emitting elements in the case where the color filters are not provided in the respective pixels at this time are roughly equal between the light-emitting elements R1 and R2, between the light-emitting elements G1 and G2, and between the light-emitting elements B1 and B2. In FIG. 14B, emission spectrums of light emitted from the light-emitting element R2, the light-emitting element G2, and the light-emitting element B2 are varied by the transmission properties of the color filter (R2) 1412, the color filter (G2) 1414, and the color filter (B2) 1416. Accordingly, by varying the emission spectrums of light emitted from the light-emitting elements R1 and R2 from each other, varying emission spectrums of light emitted from the light-emitting elements G1 and G2 from each other, and varying emission spectrums of light emitted from the light-emitting elements B1 and B2 from each other, light-emitting elements each having a different color coordinate on the CIE-XY chromaticity diagram can be obtained.

Note that by disposing the same color light-emitting elements over the whole surface, varying emission spectrums of light emitted from the light-emitting elements R1 and R2 from each other, varying emission spectrums of light emitted from the light-emitting elements G1 and G2 from each other, and varying emission spectrums of light emitted from the light-emitting elements B1 and B2 from each other through color filters each having a different transmission property, light-emitting elements each having a different color coordinate on the CIE-XY chromaticity diagram may be obtained. For example, white light-emitting elements are disposed as the same color light-emitting elements, and color filters may be disposed above the first pixel to the sixth pixel as shown in FIG. 14A.

Figure 15A:
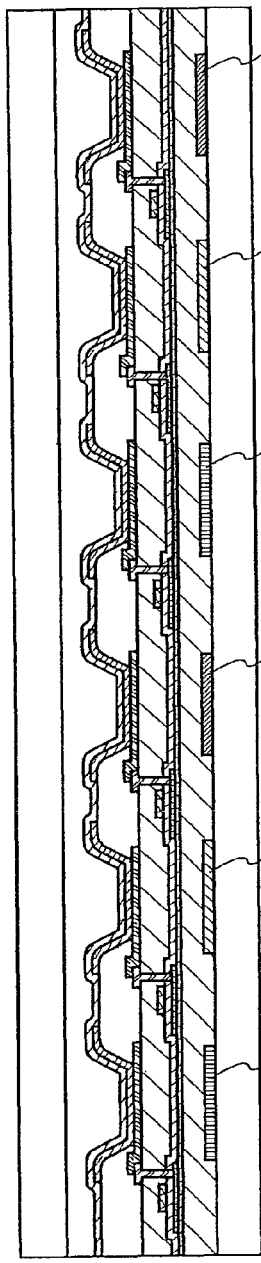
FIGS. 15A to 15C are cross-sectional views of a display device in the invention.
Figure 15B:
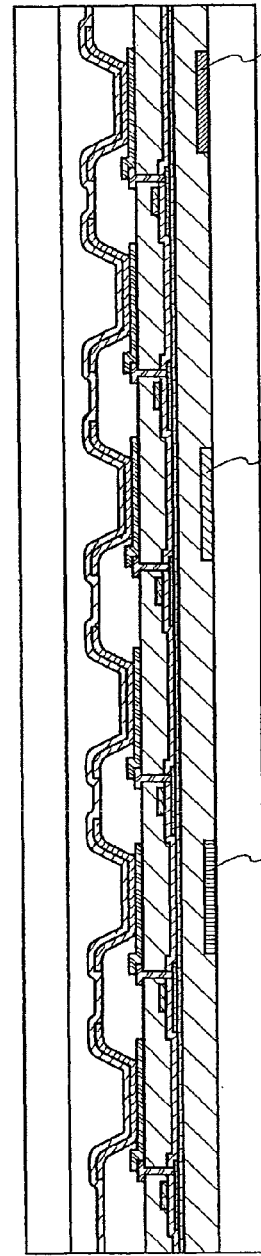

In addition, FIG. 15A is a view showing a display device of the invention having a different structure from FIG. 14A. Note that each structure of the display device in the invention shown in FIG. 15A conforms to FIG. 14A. In FIG. 15A, an example of a bottom emission display device having a structure where the light-emitting element emits light to the first electrode 1407 side thereof is shown. In FIG. 15B, the first electrode 1407 is formed of a conductive material having a light transmitting property in order to extract light emission from the first electrode 1407 side, and the second electrode 1410 is formed as a reflecting electrode which is manufactured by using a highly reflective conductive material.

In this embodiment mode, the light-emitting elements R1 and R2 provided in the first and second pixels, the light-emitting elements G1 and G2 provided in the third and fourth pixels, and the light-emitting elements B1 and B2 provided in the fifth and sixth pixels, the color filter (R1) 1411, the color filter (R2) 1412, the color filter (G1) 1413, the color filter (G2) 1414, the color filter (B1) 1415, and the color filter (B2) 1416 are provided, respectively at light-emission sides of the light-emitting elements R1 and R2 provided in the first and second pixels, the light-emitting elements G1 and G2 provided in the third and fourth pixels, and the light-emitting elements B1 and B2 provided in the fifth and sixth pixels. In this embodiment mode, by varying transmission properties of the color filter (R1) 1411 and the color filter (R2) 1412 from each other, varying transmission properties of the color filter (G1) 1413 and the color filter (G2) 1414 from each other, and varying transmission properties of the color filter (B1) 1415 and the color filter (B2) 1416 from each other to vary emission spectrums of light emitted from the light-emitting elements R1 and R2 from each other, vary emission spectrums of light emitted from the light-emitting elements G1 and G2 from each other, and vary emission spectrums of light emitted from the light-emitting elements B1 and B2 from each other, light-emitting elements each having a different color coordinate on the CIE-XY chromaticity diagram can be obtained.

Note that the color filters may be manufactured by any of a pigment dispersion method, a printing method, an electrodeposition method, and a staining method. Each of the light-emitting elements R1 and R2 provided in the first and second pixels, the light-emitting elements G1 and G2 provided in the third and fourth pixels, and the light-emitting elements B1 and B2 provided in the fifth and sixth pixels may be a light-emitting element including a light-emitting element having the same emission spectrum, for example, a light-emitting element having an emission spectrum which emits white light. By including the light-emitting element having the same emission spectrum, a process of producing the light-emitting element can be simplified, and thus, it is preferable.

FIG. 15B is a partial cross-sectional view of a picture element of the display device in this embodiment mode. Note that each structure of the display device in the invention shown in FIG. 15B conforms to FIG. 15A.

What is different from FIG. 15A is that light emitted from the light-emitting element R1, the light-emitting element G1, and the light-emitting element B1 does not travel through the color filters. Emission spectrums of light emitted from the light-emitting elements in the case where the color filters are not provided in the respective pixels at this time are roughly equal between the light-emitting elements R1 and R2, between the light-emitting elements G1 and G2, and between the light-emitting elements B1 and B2. In FIG. 15B, emission spectrums of light emitted from the light-emitting element R2, the light-emitting element G2, and the light-emitting element B2 are varied by the transmission properties of the color filter (R2) 1412, the color filter (G2) 1414, and the color filter (B2) 1416. Accordingly, by varying the emission spectrums of light emitted from the light-emitting elements R1 and R2 from each other, varying the emission spectrums of light emitted from the light-emitting elements G1 and G2 from each other, and varying the emission spectrums of light emitted from the light-emitting elements B1 and B2 from each other, light-emitting elements each having a different color coordinate on the CIE-XY chromaticity diagram can be obtained.

Note that by disposing the same color light-emitting elements over the whole surface, and providing color filters each having a different transmission property so as to overlap with the light-emitting elements, so that emission spectrums of light emitted from the light-emitting elements R1 and R2 are varied from each other, emission spectrums of light emitted from the light-emitting elements G1 and G2 are varied from each other, and emission spectrums of light emitted from the light-emitting elements B1 and B2 are varied from each other through the color filters, light-emitting elements each having a different color coordinate on the CIE-XY chromaticity diagram may be obtained. For example, white light-emitting elements are disposed as the same color light-emitting elements, and color filters may be disposed above the first pixel to the sixth pixel as shown in FIG. 15A.

Figure 15C:
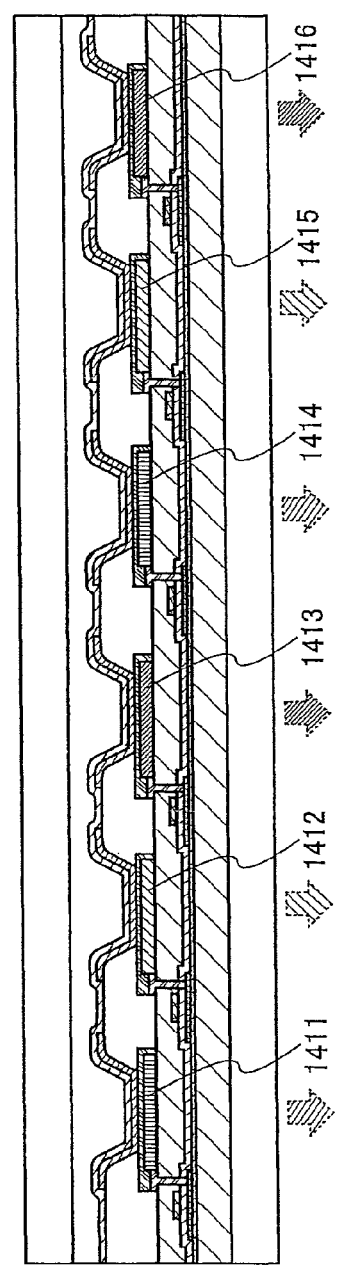

FIG. 15C is a partial cross-sectional view of a picture element of the display device in this embodiment mode. Note that each structure of the display device in the invention shown in FIG. 15C conforms to FIGS. 15A and 15B.

What is different from FIGS. 15A and 15B is that the color filter (R1) 1411, the color filter (R2) 1412, the color filter (G1) 1413, the color filter (G2) 1414, the color filter (B1) 1415, and the color filter (B2) 1416 are disposed below the first electrode 1407 which is disposed between the light-emitting element and a transistor. Thus, the process can be simplified, and thus, it is easy to conduct. Accordingly, by varying the emission spectrums of light emitted from the light-emitting elements R1 and R2 from each other, varying the emission spectrums of light emitted from the light-emitting elements G1 and G2 from each other, and varying the emission spectrums of light emitted from the light-emitting elements B1 and B2 from each other, light-emitting elements each having a different color coordinate on the CIE-XY chromaticity diagram can be obtained.

In addition, by varying the emission spectrums of light emitted from the light-emitting elements R1 and R2 from each other, varying the emission spectrums of light emitted from the light-emitting elements G1 and G2 from each other, and varying the emission spectrums of light emitted from the light-emitting elements B1 and B2 from each other, using a method where a short-wavelength monochromatic light-emitting element is disposed and a luminous color thereof is converted into a required color through a color conversion layer, light-emitting elements each having a different color coordinate on the CIE-XY chromaticity diagram may be obtained. The display device of the invention shown in FIG. 40A includes a substrate 4000, a base insulating film 4001, a semiconductor layer 4002, a gate insulating film 4003, a gate electrode 4004, an interlayer insulating film 4005, a connecting portion 4006, a first electrode 4007 of a light-emitting element, a partition wall 4008, light-emitting layers 4009A and 4009B, a second electrode 4010 of the light-emitting element, a color conversion layer (R1) 4011, a color conversion layer (G1) 4012, a color conversion layer (R2) 4013, a color conversion layer (G2) 4014, and an opposite substrate 4015.

For example, blue light-emitting elements B1 and B2 each having a different emission spectrum are disposed as the light-emitting layers 4009A and 4009B which emit short-wavelength monochromatic light, and in the case of a top emission structure as shown in FIG. 40A, the color conversion layers may be disposed above the first pixel, the second pixel, the fourth pixel, and the fifth pixel. Alternatively, in the case of a bottom emission structure, blue light-emitting elements B1 and B2 each having a different emission spectrum are disposed as the light-emitting layers 4009A and 4009B which emit short-wavelength monochromatic light, and the color conversion layers may be disposed below the first pixel, the second pixel, the fourth pixel, and the fifth pixel as shown in FIG. 40B.

Figures 41A, 41B:
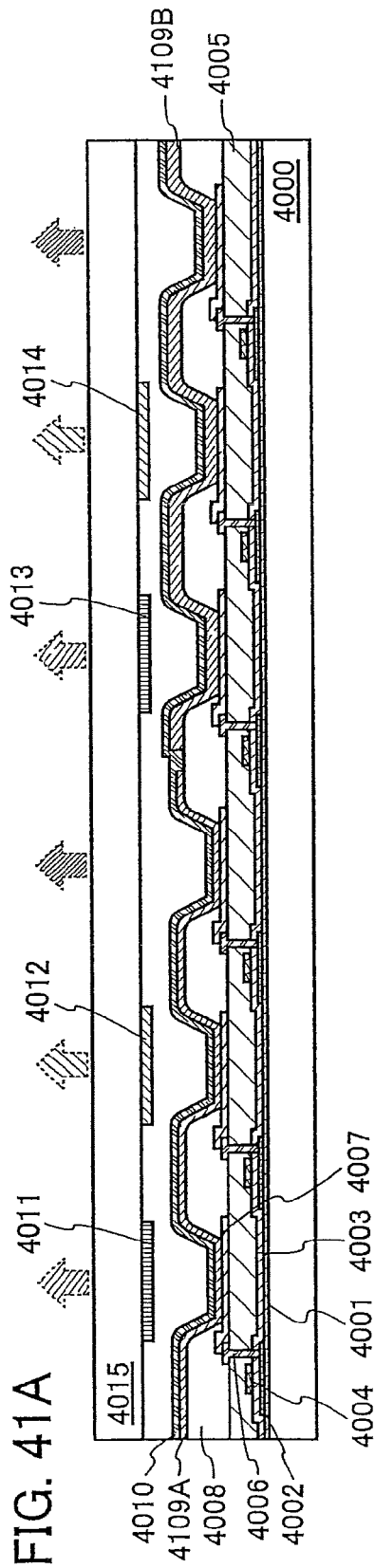
FIGS. 41A and 41B are cross-sectional views of a display device in the invention.

Note that in the case where blue light-emitting elements B1 and B2 each having a different emission spectrum are disposed as the light-emitting elements which emit short-wavelength monochromatic light, the thickness of the blue light-emitting elements B1 and B2 is varied like light-emitting layers 4109A and 4109B shown in FIGS. 41A and 41B to vary emission spectrums. For example, in the case of a top emission structure as shown in FIG. 41A, the blue light-emitting layers 4109A and 4109B each having a different emission spectrum are disposed as the light-emitting elements which emit short-wavelength monochromatic light, and color conversion layers may be disposed above the first pixel, the second pixel, the fourth pixel, and the fifth pixel. Alternatively, in the case of a bottom emission structure, the light-emitting layers 4109A and 4109B of the blue light-emitting elements are disposed as shown in FIG. 41B, and the color conversion layers may be disposed below the first pixel, the second pixel, the fourth pixel, and the fifth pixel. Note that each structure of the display device in the invention shown in FIGS. 41A and 41B conforms to FIGS. 40A and 40B.

The color conversion method for converting a color of light emitted from a light-emitting element into a required color through a color conversion layer is advantageous in that there is no need for separately coloring the light-emitting layers since a luminous color emitted from the light-emitting element is a monochromatic color. In addition, compared to a color filter method, the color conversion method is preferable since it obtains desired light emission with the color conversion layers using a process of absorption of light, excitation, and light emission.

Note that this embodiment can be freely combined with the other embodiment modes or embodiments in this specification.

Embodiment Mode 4

In this embodiment mode, a configuration which is different from the arrangement of pixels in one picture element described in the aforementioned embodiment modes in FIG. 2 is described.

Note that description has been made of the configuration of the pixel portion of the invention where the picture element of the invention includes the first pixel, the second pixel, the third pixel, the fourth pixel, the fifth pixel, and the sixth pixel in FIG. 2. In addition, a light-emitting element is provided in each of the first pixel to the sixth pixel such that a light-emitting element R1, a light-emitting element R2, a light-emitting element G1, a light-emitting element G2, a light-emitting element B1, and a light-emitting element B2 are connected to the first pixel, the second pixel, the third pixel, the fourth pixel, the fifth pixel, and the sixth pixel, respectively.

Figure 16:
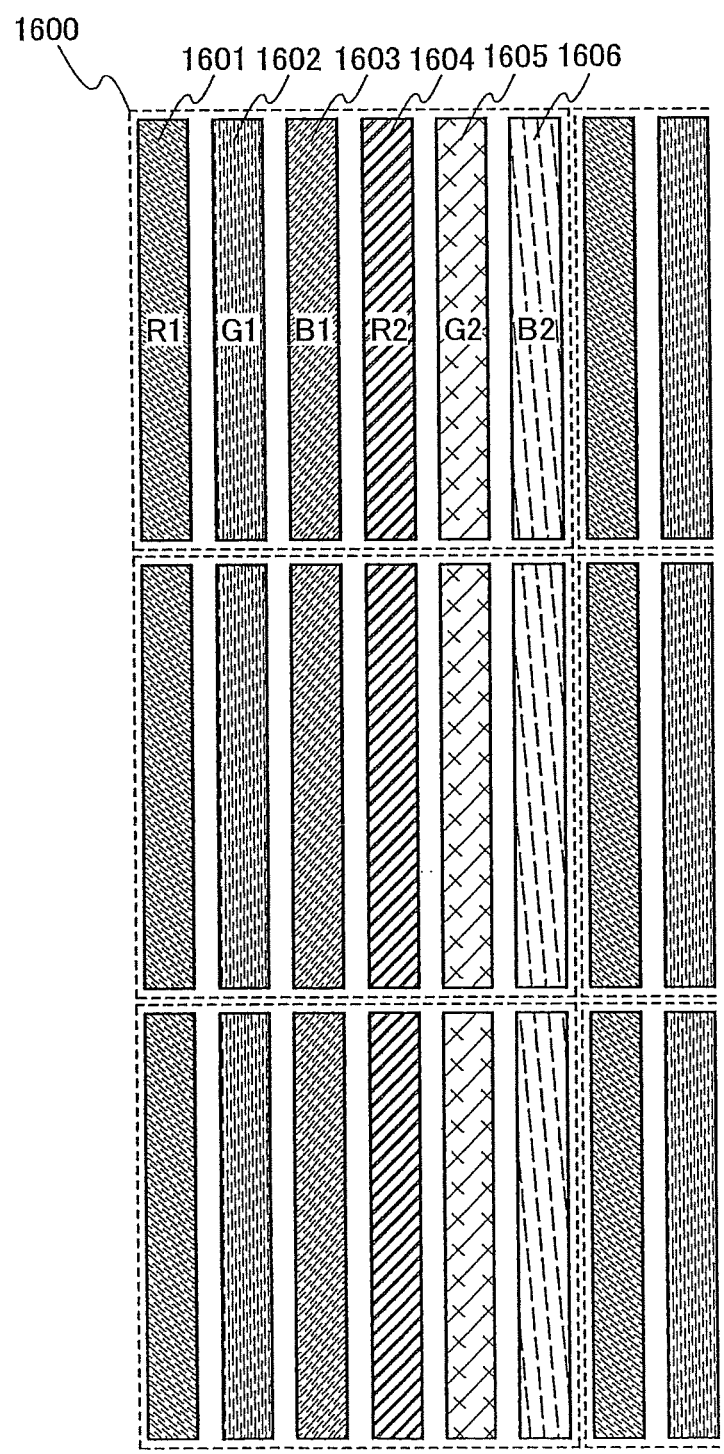
FIG. 16 is a schematic diagram of picture elements of a display device in the invention.

In the disposition of pixels of a display device in this embodiment mode, a first pixel 1601, a second pixel 1602, a third pixel 1603, a fourth pixel 1604, a fifth pixel 1605, and a sixth pixel 1606 which are included in a picture element 1600 as shown in FIG. 16 are arranged in stripes.

Note that each of the first pixel 1601 to the sixth pixel 1606 is disposed in a column direction in FIG. 16; however, a method for disposing each pixel is not limited to this. For example, each pixel may be disposed in a row direction, or the first pixel 1601 having the light-emitting element R1 and the fifth pixel 1605 having the light-emitting element G2 may be disposed to be adjacent to each other. In addition, the shape of each pixel is not limited to a rectangle as shown in FIG. 16, and for example, a square, other polygons, or a shape having a curvature may be employed.

Note also that the first pixel 1601 to the sixth pixel 1606 may be disposed either at even intervals or not.

In addition, in FIG. 53A, the first pixel 1601, the second pixel 1602, and the third pixel 1603 are arranged in the first row while the fourth pixel 1604, the fifth pixel 1605, and the sixth pixel 1606 are arranged in the next row, and the row of the first pixel 1601, the second pixel 1602, and the third pixel 1603, and the row of the fourth pixel 1604, the fifth pixel 1605, and the sixth pixel 1606 may be shifted by one pixel. In this embodiment mode, the row of the first pixel 1601, the second pixel 1602, and the third pixel 1603, and the row of the fourth pixel 1604, the fifth pixel 1605, and the sixth pixel 1606 are shifted by one pixel in the row direction; however, the number of pixels is not particularly limited to one. For example, the row of the first pixel 1601, the second pixel 1602, and the third pixel 1603, and the row of the fourth pixel 1604, the fifth pixel 1605, and the sixth pixel 1606 may be shifted by half a pixel as shown in FIG. 53B. By employing an arrangement where pixels are shifted in this manner, smooth display can be conducted particularly at the time of displaying a natural image which is moving.

In the light-emitting element R1, the light-emitting element R2, the light-emitting element G1, the light-emitting element G2, the light-emitting element B1, and the light-emitting element B2, the luminous efficiency varies depending on a light-emitting element which presents each luminous color. Thus, in order to obtain light emission with desired luminance, relatively larger current is required to be supplied to a light-emitting element having low luminous efficiency. Further, human eyes have different sensitivity to each emission wavelength, and in general, human eyes have higher sensitivity to a green wavelength than a red wavelength or a blue wavelength. Accordingly, in order to make the blue light-emitting element or the red light-emitting element emit light with the same luminous efficiency as the green light-emitting element, luminance of the blue light-emitting element or the red light-emitting element needs to be set relatively higher than the luminance of the green light-emitting element. However, when much current is supplied to the light-emitting element in order to obtain higher luminance, deterioration of the light-emitting element is promoted and power consumption of the display device is increased. In addition, if a wavelength is shifted due to deterioration of the light-emitting element, the color reproducibility of the display device may be decreased, which in turn decreases the image quality.

Therefore, a structure where area dimensions of the light-emitting element R1, the light-emitting element R2, the light-emitting element G1, the light-emitting element G2, the light-emitting element B1, and the light-emitting element B2 are varied in advance may be employed. For example, a structure where area dimensions of the light-emitting elements R1, R2, B1, and B2 are doubled while area dimensions of the light-emitting elements G1 and G2 are kept unchanged may be employed. By employing such a structure, variations of deterioration among the light-emitting elements can be averaged, and thus, it is preferable.

Figure 17:
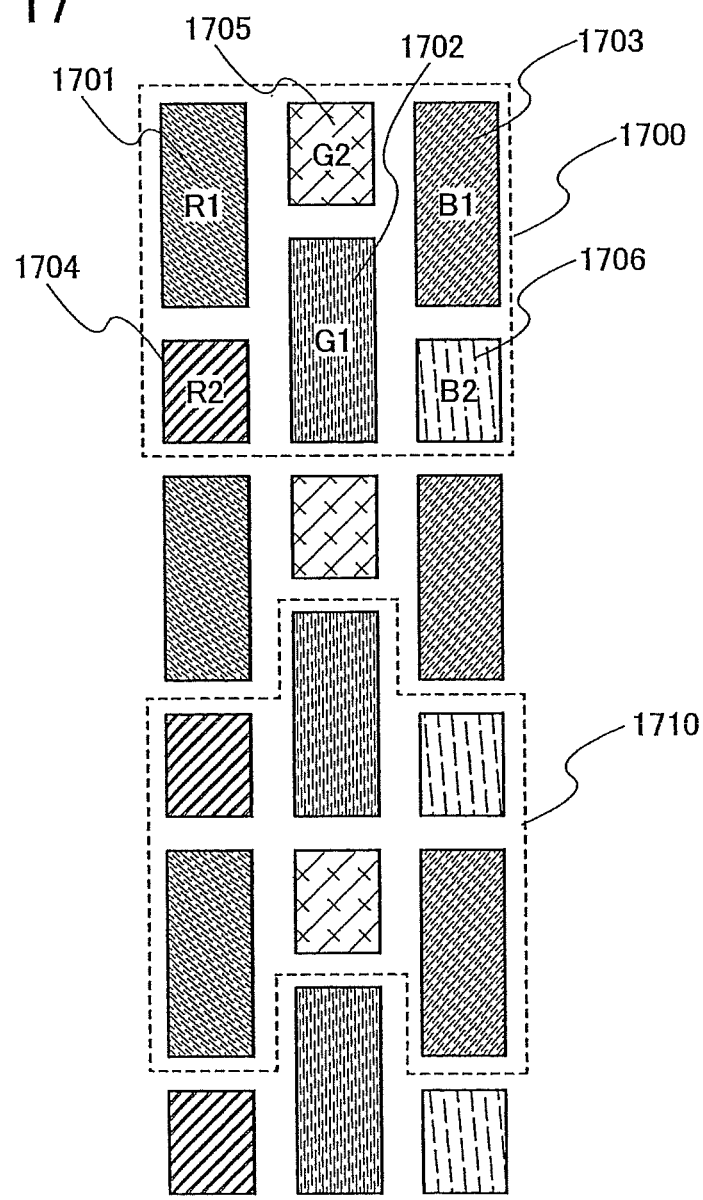
FIG. 17 is a schematic diagram of picture elements of a display device in the invention.

Unlike the structure shown in FIG. 16, pixels of the display device in this embodiment mode shown in FIG. 17 which include a first pixel 1701, a second pixel 1702, a third pixel 1703, a fourth pixel 1704, a fifth pixel 1705, and a sixth pixel 1706 in a picture element 1700 are arranged such that the first pixel 1701, the second pixel 1702, and the third pixel 1703 are arranged in delta pattern, and the fourth pixel 1704, the fifth pixel 1705, and the sixth pixel 1706 are also arranged in delta pattern.

A structure where area dimensions of the first pixel 1701, the fourth pixel 1704, and the second pixel 1702 are varied from each other as well as area dimensions of the fifth pixel 1705, the third pixel 1703, and the sixth pixel 1706 are varied from each other is employed in FIG. 17; however, the invention is not limited to this. The area dimensions of the first pixel 1701, the fourth pixel 1704, and the second pixel 1702 may be the same as well as the area dimensions of the fifth pixel 1705, the third pixel 1703, and the sixth pixel 1706 may be the same, or a structure where all of the first light-emitting element 1701 to the sixth pixel 1706 have different area dimensions from each other may be employed. In addition, a structure of a picture element is not particularly limited, and a structure where an image is formed by a picture element 1710 may be employed.

In addition, for example, the first pixel 1701 having the light-emitting element R1 and the third pixel 1703 having the light-emitting element B1 may be disposed to be adjacent to each other. In addition, the shape of each pixel is not limited to a rectangle as shown in FIG. 17, and for example, a square, other polygons, or a shape having a curvature may be employed. Note that the first pixel 1701 to the sixth pixel 1706 may be disposed either at even intervals or not.

Figure 18:
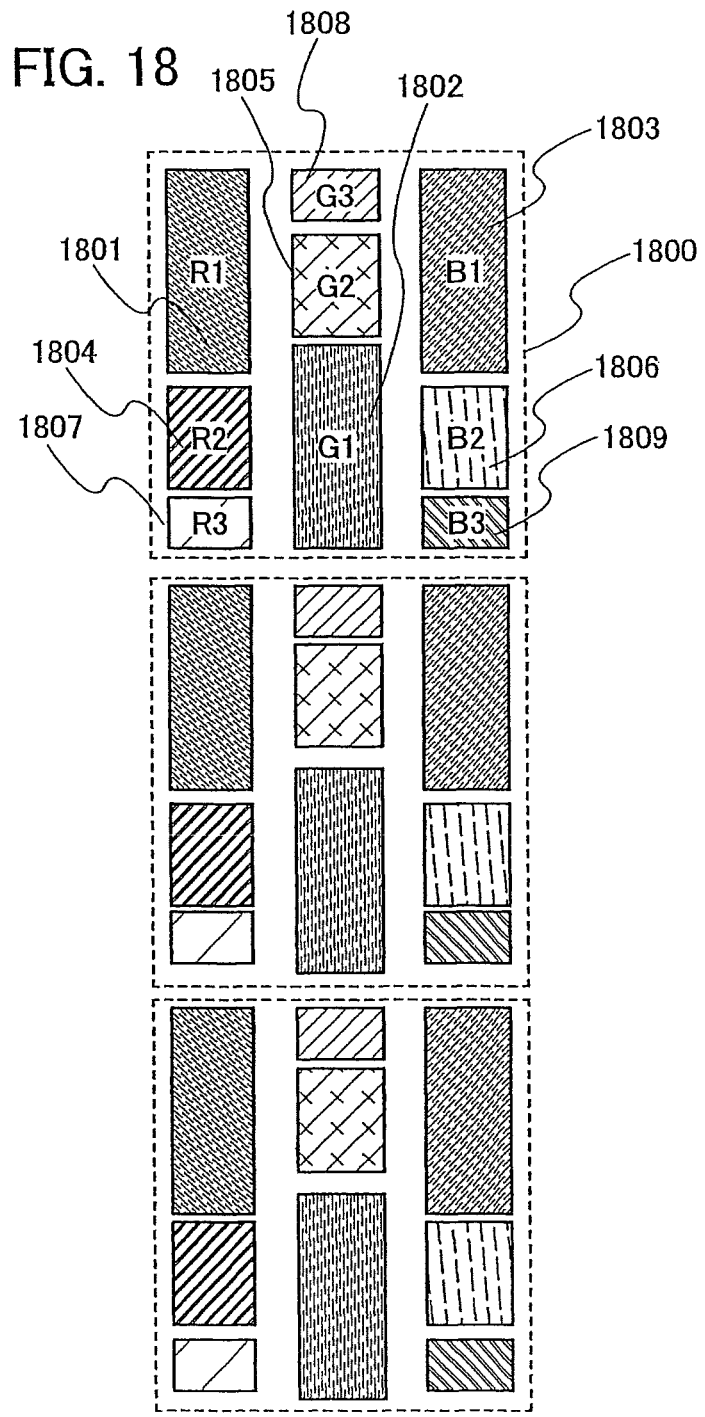
FIG. 18 is a schematic diagram of picture elements of a display device in the invention.

Further, in the display device of the invention, pixels are not limited to the first pixel to the sixth pixel. A structure where a first pixel 1801, a second pixel 1802, a third pixel 1803, a fourth pixel 1804, a fifth pixel 1805, a sixth pixel 1806, a seventh pixel 1807, an eighth pixel 1808, and a ninth pixel 1809 are provided may be employed as shown in FIG. 18. Note that a structure where the seventh pixel 1807 has a light-emitting element R3, the eighth pixel 1808 has a light-emitting element G3, and the ninth pixel 1809 has a light-emitting element B3 is employed.

In FIG. 18, a structure where area dimensions of the first pixel 1801, the fourth pixel 1804, and the seventh pixel 1807 are varied from each other, area dimensions of the second pixel 1802, the fifth light-emitting element 1805, and the eighth pixel 1808 are varied from each other, and area dimensions of the third pixel 1803, the sixth pixel 1806, and the ninth pixel 1809 are varied from each other is employed; however, the invention is not limited to this. The area dimensions of the first pixel 1801, the fourth pixel 1804, and the seventh pixel 1807 may be the same, the area dimensions of the second pixel 1802, the fifth pixel 1805, and the eighth pixel 1808 may be the same, and the area dimensions of the third pixel 1803, the sixth pixel 1806, and the ninth pixel 1809 may be the same, or a structure where all of the first pixel 1801 to the ninth pixel 1809 have different area dimensions from each other may be employed.

Figure 19A:
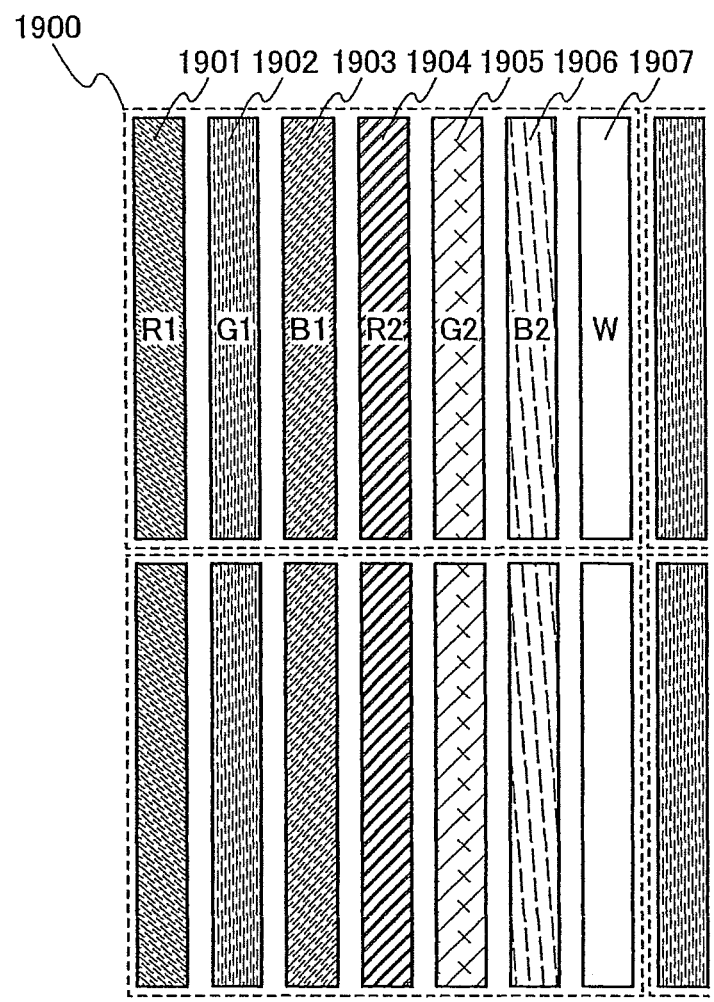
FIGS. 19A and 19B are schematic diagrams of picture elements of a display device in the invention.

In addition, in the display device of the invention, pixels are not limited to the first pixel to the sixth pixel. A structure where a first pixel 1901, a second pixel 1902, and a third pixel 1903, a fourth pixel 1904, a fifth pixel 1905, a sixth pixel 1906, and a seventh pixel 1907 are arranged may be employed as shown in FIG. 19A. Note that the seventh pixel 1907 has a structure where a white light-emitting element W is provided.

Note that the light-emitting element W of the seventh pixel 1907 has chromaticity whose x-coordinate and y-coordinate in the CIE-XY chromaticity diagram are in the range of 0.30 to 0.40 and in the range of 0.30 to 0.40, respectively. More preferably, the light-emitting element W of the seventh pixel 1907 has chromaticity whose x-coordinate and y-coordinate in the CIE-XY chromaticity diagram are in the range of 0.30 to 0.35 and in the range of 0.30 to 0.35, respectively.

A structure where the area dimensions of the first pixel 1901 and the fourth pixel 1904 are the same, the area dimensions of the second pixel 1902 and the fifth pixel 1905 are the same, and the area dimensions of the third pixel 1903 and the sixth pixel 1906 are the same is employed in FIG. 19A; however, the invention is not limited to this. A structure where area dimensions of the first pixel 1901 and the fourth pixel 1904 vary from each other, area dimensions of the second pixel 1902 and the fifth pixel 1905 vary from each other, and area dimensions of the third pixel 1903 and the sixth pixel 1906 vary from each other may be employed, or a structure where all of the pixel 1901 to the sixth pixel 1906 have different area dimensions from each other may be employed.

Figure 19B:
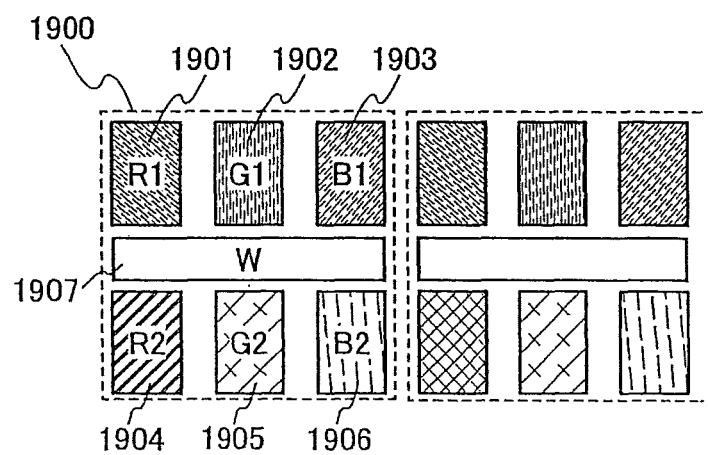

A structure which is different from FIG. 19A is shown in FIG. 19B. What is different from FIG. 19A is the disposition of the first pixel 1901, the second pixel 1902, and the third pixel 1903, the fourth pixel 1904, the fifth pixel 1905, the sixth pixel 1906, and the seventh pixel 1907. Needless to say, disposition of each pixel is not particularly limited to this. In addition, the shape of each pixel is not limited to a rectangle as shown in FIG. 19A, and for example, a square, other polygons, or a shape having a curvature may be employed.

Note that by providing the light-emitting element W which emits white light in the seventh pixel, power consumption can be reduced since a white color can be displayed by using light emission of only the light-emitting element W compared to the case of displaying a white color by using a color mixture of the light-emitting elements R1, R2, G1, G2, B1, and B2, and thus, it is preferable. In addition, when a neutral color is displayed by an additive color mixture using a white color, more reduction in power consumption can be expected, and thus, it is preferable.

Note also that in the display device of the invention, a structure of a picture element where a light-emitting element W1 which emits white light is provided in the seventh pixel, and a light-emitting element W2 which emits white light is provided in the eighth pixel may also be employed. As well as the aforementioned light-emitting elements R1 and R2, light-emitting elements G1 and G2, and light-emitting elements B1 and B2, emission spectrums of the light-emitting elements W1 and W2 are varied from each other. Accordingly, a display device which displays more bright colors and has reduced power consumption can be provided.

Note that the light-emitting element W1 of the seventh pixel and the light-emitting element W2 of the eighth pixel have chromaticity whose x-coordinate and y-coordinate in the CIE-XY chromaticity diagram are in the range of 0.30 to 0.40 and in the range of 0.30 to 0.40, respectively. More preferably, the light-emitting element W1 of the seventh pixel and the light-emitting element W2 of the eighth pixel have chromaticity whose x-coordinate and y-coordinate in the CIE-XY chromaticity diagram are in the range of 0.30 to 0.35 and in the range of 0.30 to 0.35, respectively.

Note that this embodiment can be freely combined with the other embodiment modes or embodiments in this specification.

Embodiment Mode 5

In this embodiment mode, configurations described in the aforementioned embodiment modes which are different from the pixel configuration and the operation method shown in FIG. 4 and FIG. 5 are described.

According to the pixel configuration and the operation method shown in FIG. 4 and FIG. 5, there is an advantage that the length of sustain (light-emitting) periods can be freely set since address (writing) periods and the sustain (light-emitting) periods are completely separated; however, in the address (writing) periods, neither writing nor light emission is conducted in any other rows while writing is conducted in a certain row. That is, the duty ratio as a whole is decreased.

Consequently, an operation where the address (writing) periods and the sustain (light-emitting) periods are not separated is described.

Figure 20:
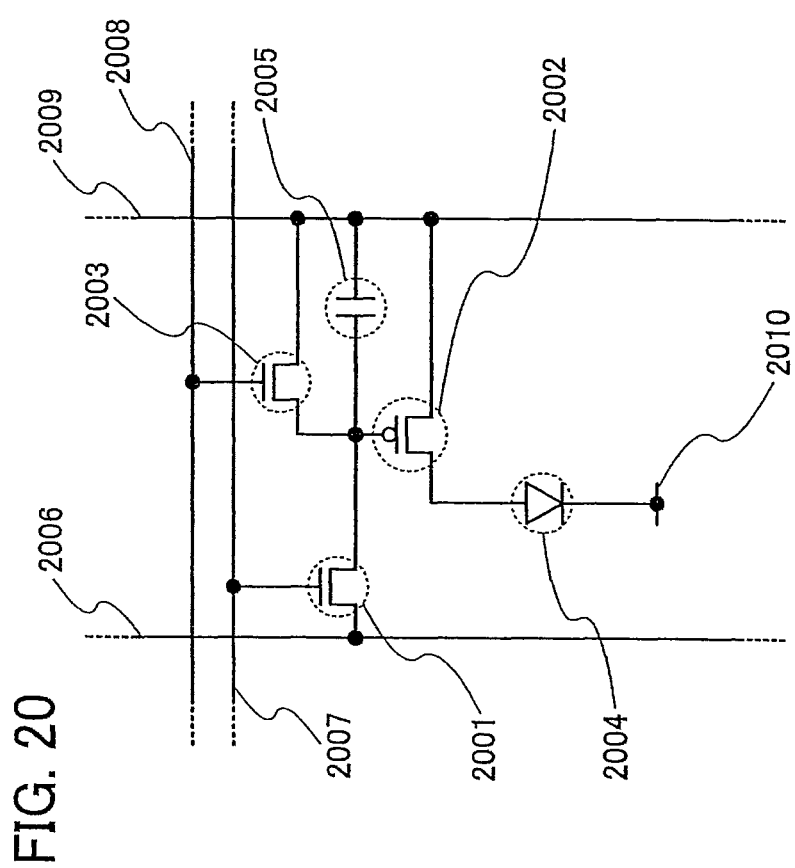
FIG. 20 is a circuit diagram of pixels of a display device in the invention.

A pixel configuration for achieving the aforementioned operation is shown in FIG. 20. The pixel configuration shown in FIG. 20 includes a first transistor 2001 for switching to control input of a video signal (also called a switching transistor), a second transistor 2002 for driving to decide the state of lighting or non-lighting of a light-emitting element by the video signal (also called a driving transistor), a third transistor 2003 for erasing a gate-source voltage of the second transistor 2002 (also called an erasing transistor), a light-emitting element 2004, a storage capacitor 2005, a signal line 2006, a first scan line 2007, a second scan line 2008, a power supply line 2009, and an opposite electrode 2010. The storage capacitor 2005 is provided so as to hold a gate-source voltage (gate voltage) of the first transistor 2001 and the second transistor 2002 more accurately; however, it is not necessarily required. Note that voltage means a potential difference from a ground unless otherwise specified. In addition, the light-emitting element 2004 corresponds to the light-emitting elements R1, R2, G1, G2, B1, and B2 in FIG. 2.

The first transistor 2001 is controlled by using the first scan line 2007. When the first transistor 2001 is turned on, a video signal is input from the signal line 2006 to the storage capacitor 2005. Then, in response to the video signal, the second transistor 2002 is turned on/off, and a current flows from the power supply line 2009 to the opposite electrode 2010 through the light-emitting element 2004.

In the case of erasing a video signal, the second scan line 2008 is selected to turn on the third transistor 2003, and turn off the second transistor 2002. Then, a current does not flow from the power supply line 2009 to the opposite electrode 2010 through the light-emitting element 2004. Accordingly, a non-lighting period can be made so that the length of a lighting period can be freely controlled.

Figure 21:
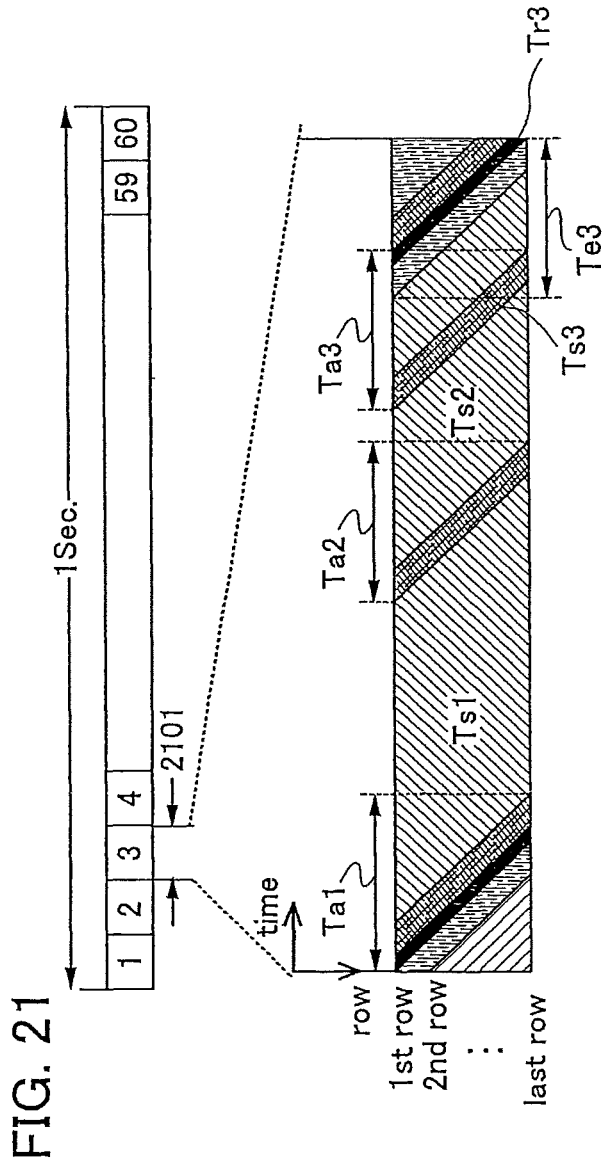
FIG. 21 is a timing chart of a display device in the invention.

Next, a timing chart in the case of conducting an operation of erasing a signal of a pixel is shown in FIG. 21. In this embodiment mode, a case where a 3-bit digital video signal is used in a digital time gray scale method similarly to FIG. 5 is described as an example. In the digital time gray scale method, one frame period 2101 is further divided into a plurality of sub frame periods. Here, since the video signal has 3 bits, the one frame period 2101 is divided into three sub frame periods, and writing and displaying of each luminous color are conducted in each sub frame period.

In FIG. 21, each sub frame period includes an address (writing) period Ta# (# is a natural number) and a sustain (light-emitting) period Ts#. In FIG. 21, in each sub frame period which is obtained by dividing the one frame period 2101, it can be seen that the address (writing) period and the sustain (light-emitting) period are not separated. That is, upon completion of writing in an i-th row, light emission is started immediately in the i-th row. After that, while writing is conducted in an (i+1)-th row, the i-th row is already in the sustain (light-emitting) period. By employing such timing, the duty ratio can be increased.

However, in the case of the timing as shown in FIG. 21, a period when an address (writing) period in a certain sub frame period and an address period in next sub frame period overlap with each other is generated if the sustain (light-emitting) period is shorter than the address (writing) period. Then, as shown in FIG. 20, by using the third transistor, an erasing period Tr3 is forcibly provided from the time of finishing the sustain (light-emitting) period to the time of starting a next address (writing) period. By this erasing period Tr3, address (writing) periods in different sub frame periods can be prevented from overlapping with each other. Specifically, by using a second scan line driver circuit for controlling the third transistor, selective pulses for erasing are sequentially output from a first row to turn on the third transistor at desired timing. Note that the second scan line driver circuit may have the same configuration as a first scan line driver circuit which conducts normal writing. Accordingly, a period of writing signals for erasing (hereinafter, it is described as a reset period) Te3 has an equal length to the address (writing) period.

Note that although a case where the number of gray scale display bits and the number of sub frames are the same is given as an example here, one frame may be further divided. In addition, gray scales can be expressed even when the length ratio of the sustain (light-emitting) periods is not necessarily the power of two. By employing the pixel configuration shown in FIG. 20 in this manner, the length of the lighting period in each row can be easily controlled.

By employing the pixel configuration as shown in FIG. 20, many sub frames can be arranged in one frame even if a signal writing operation is slow. In addition, in the case of conducting the erasing operation, a driving frequency of a source driver can also be reduced since there is no need for acquiring data for erasing like a video signal.

Alternatively, in the pixel configurations in FIG. 4 and FIG. 20, a field sequential method may be employed. In FIG. 22A, one frame period denoted by 2201 in the pixel configuration of FIG. 4 is divided into six periods denoted by 2202 to 2207, and writing and displaying of each luminous color are conducted in each period. In addition, in FIG. 22B, one frame period denoted by 2201 in the pixel configuration of FIG. 20 is divided into six periods shown with 2202 to 2207, and writing and displaying of each luminous color are conducted in each period.

Note that in FIGS. 22A and 22B, a case where a 3-bit digital video signal is used in a digital time gray scale method is given as an example. In the digital time gray scale method, the one frame period 2201 is further divided into a plurality of sub frame periods. Here, since the video signal has 3 bits, the one frame period 2201 is divided into three sub frame periods.

Note also that in FIGS. 22A and 22B, one of the six periods denoted by the first period 2202, the second period 2203, the third period 2204, the fourth period 2205, the fifth period 2206, and the sixth period 2207 which correspond to the light-emitting elements R1, R2, G1, G2, B1, and B2, for example, the first period 2202 is described.

In the first period 2202, each sub frame period includes an address (writing) period $Ta1_{\#}$ (# is a natural number) and a sustain (light-emitting) period $Ts1_{\#}$. In addition, in the second period 2203, each sub frame period includes an address (writing) period $Ta2_{\#}$ (# is a natural number) and a sustain (light-emitting) period $Ts2_{\#}$. Hereinafter, the third period 2204 to the sixth period 2207 are described in the same manner.

In FIG. 22A, the length of the sustain (light-emitting) periods is $Ts1_1:Ts1_2:Ts1_3=4:2:1$, and $2^3=8$ gray scales are expressed by controlling the state of lighting or non-lighting of the light-emitting element in each sustain (light-emitting) period. That is, each sustain (light-emitting) period is set to have a power-of-two length of a previous sustain (light-emitting) period such that $Ts1_1:Ts1_2:Ts1_3=2^{(n-1)}:2^{(n-2)}:\ldots:2^1:2^0$. For example, in the case where a light-emitting element emits light only in $Ts1_3$, and a light-emitting element does not emit light in $Ts1_1$ and $Ts1_2$, light emission is obtained only in about 14% of all of the sustain (light-emitting) periods. That is, luminance of about 14% can be expressed. In the case where a light-emitting element emits light in Ts1 and Ts2, and a light-emitting element doe not emit light in Ts3, light emission is obtained in about 86% of all of the sustain (light-emitting) periods. That is, luminance of about 86% can be expressed.

As shown in FIG. 21, by conducting this operation repeatedly to express luminous colors of the first to sixth pixels, that is, the light-emitting elements R1, R2, G1, G2, B1, and B2 in FIG. 2, a viewer can view multicolor display by a residual image effect.

Although the third transistor 2003 is used in FIG. 20, another method can be employed as long as a current can be controlled not to be supplied to the light-emitting 2004 by forcibly making a non-lighting period. Accordingly, the non-lighting period may be made by disposing a switch in somewhere on a path where a current flows from the power supply line 2009 to the opposite electrode 2010 through the light-emitting element 2004, and by controlling on/off of the switch. Alternatively, the gate-source voltage of the second transistor 2002 may be controlled to forcibly turn off the second transistor 2002.

Figure 23:
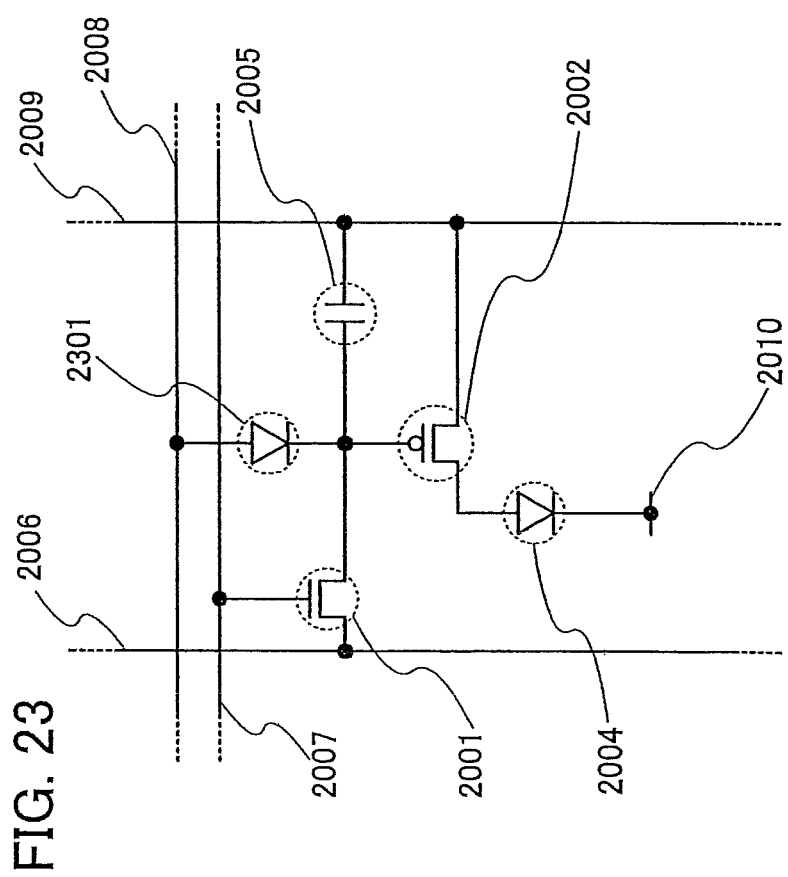
FIG. 23 is a circuit diagram of a pixel of a display device in the invention.

An example of a pixel configuration in the case of forcibly turning off the second transistor 2002 is shown in FIG. 23. What is different from FIG. 20 is that an erasing diode 2301 is connected between a gate of a second transistor 2002 and a second scan line 2008.

In the case of erasing a video signal, the second scan line 2008 (here, it is set to be at a high potential) is selected to turn on the erasing diode 2301, thereby a current flows from the second scan line 2008 to the gate of the second transistor 2002. Accordingly, the second transistor 2002 is turned off. Then, a current does not flow from the power supply line 2009 to the opposite electrode 2010 through the light-emitting element 2004. Accordingly, a non-lighting period can be made so that the length of a lighting period can be freely controlled.

In the case of holding the video signal, the second scan line 2008 (here, it is set to be at a low potential) is not selected. Then, the erasing diode 2301 is turned off so that the gate potential of the second transistor 2002 is held.

Note that the erasing diode 2301 may be any element as long as it has a rectifying property. Such an element may be a PN junction diode, a PIN diode, a Schottky diode, or a zener diode.

Figure 24:
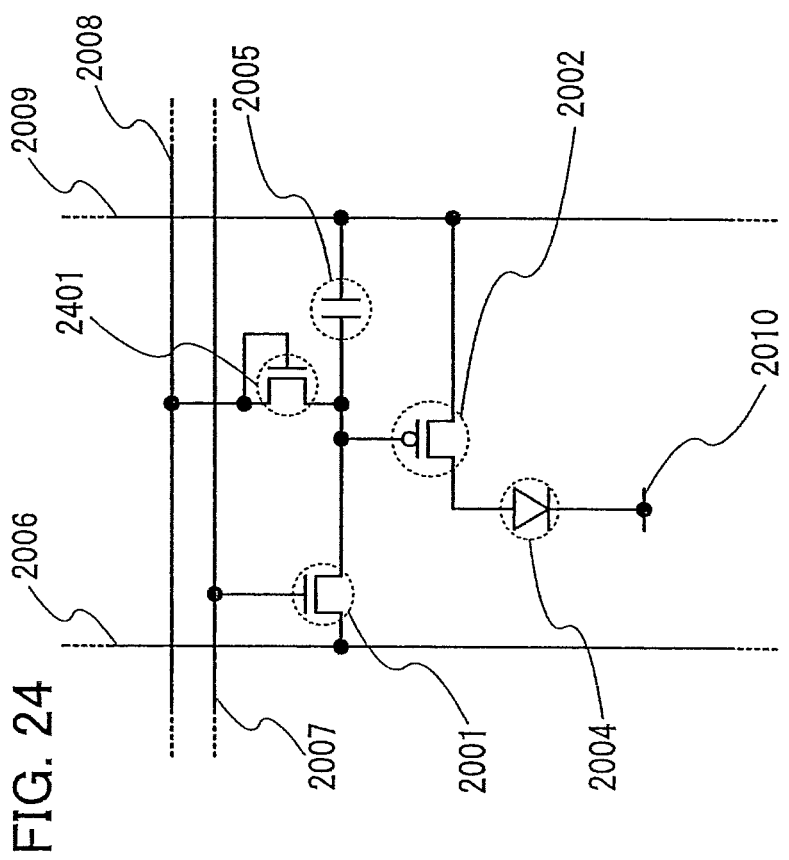
FIG. 24 is a circuit diagram of a pixel of a display device in the invention.

In addition, the erasing diode 2301 may be a diode-connected transistor (a transistor whose gate and drain are connected). A circuit diagram at this case is shown in FIG. 24. As the erasing diode 2301, a diode-connected transistor 2401 is employed. Here, an n-channel transistor is employed; however, the invention is not limited to this. A p-channel transistor may also be employed.

Note that timing charts, pixel configurations, and driving methods shown in this embodiment mode are only exemplary, and the invention is not limited to these. Various types of timing charts, pixel configurations, and driving methods can be applied.

Figure 25:
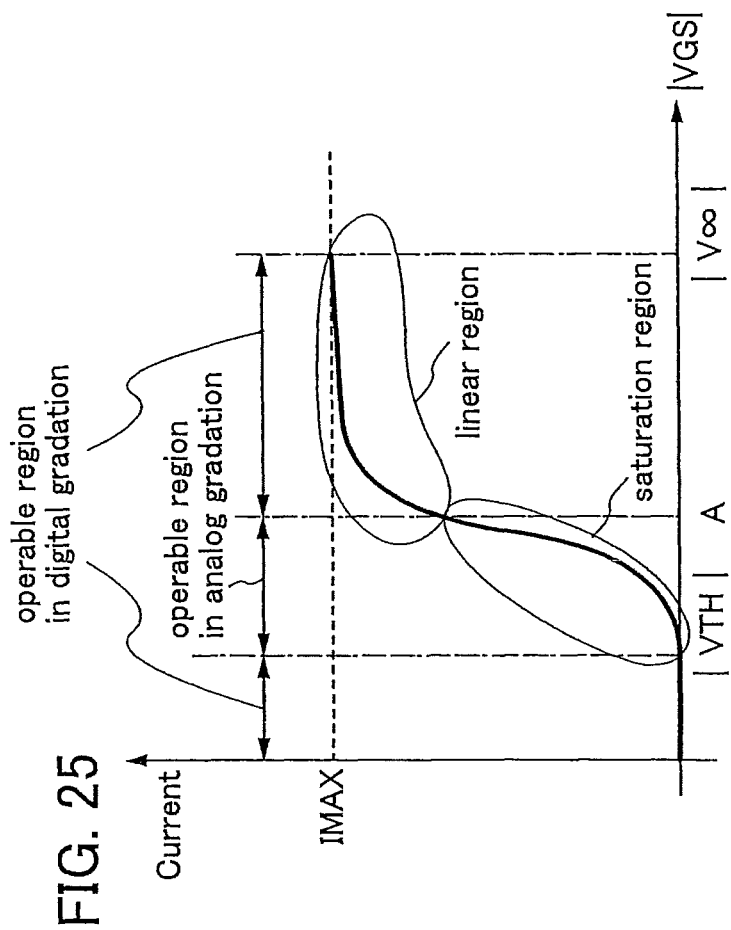
FIG. 25 is a diagram showing an operation of a transistor of a display device in the invention.

Next, an operation region of a driving transistor in the case of a digital gray scale method is described. Note that FIG. 25 is a characteristic diagram of an operation of the transistor where a horizontal axis shows a gate-source voltage of the transistor while a vertical axis shows a source-drain current of the transistor.

For example, in the case of operating the transistor in the saturation region, there is an advantage that the value of a current which flows to the light-emitting element does not change even if a current-voltage characteristic of the light-emitting element is deteriorated. Thus, the display device is hardly influenced by ghosting. However, if a current characteristic of the driving transistor varies, a current which flows thereto also varies. Therefore, there is a case where display unevenness is generated.

On the other hand, in the case of operating the transistor in the linear region, the value of a current which flows thereto is hardly influenced even if the current characteristic of the driving transistor varies. Thus, display unevenness is hardly generated. In addition, power consumption can also be reduced since (the absolute value of) a gate-source voltage of the driving transistor does not become too large.

Further, when (the absolute value of) a gate-source voltage of the driving transistor is increased, a current which flows thereto is hardly influenced even if the current characteristic of the driving transistor varies. However, when the current-voltage characteristic of the light-emitting element is deteriorated, there is a case where the value of a current which flows thereto is changed. Therefore, the display device is easily influenced by ghosting.

When the driving transistor operates in the saturation region in this manner, the value of a current does not change even if the characteristics of the light-emitting element change. Accordingly, in this case, the driving transistor can be regarded as operating as a current source. Therefore, this driving is called a constant current driving.

In addition, when the driving transistor operates in the linear region, the value of the current does not change even if the current characteristic of the driving transistor varies. Accordingly, in this case, the driving transistor can be regarded as operating as a switch. Thus, it is regarded that a voltage of the power supply line is directly applied to the light-emitting element. Therefore, this driving is called a constant voltage driving.

The invention can employ either the constant current driving or the constant voltage driving. Accordingly, whether to employ the constant current driving or the constant voltage driving may be changed appropriately in view of variations of the light-emitting element and the transistor.

Note that this embodiment can be freely combined with the other embodiment modes or embodiments in this specification.

Embodiment Mode 6

In this embodiment mode, description is made of another layout structure of each pixel and each wire in the invention.

Figure 26:
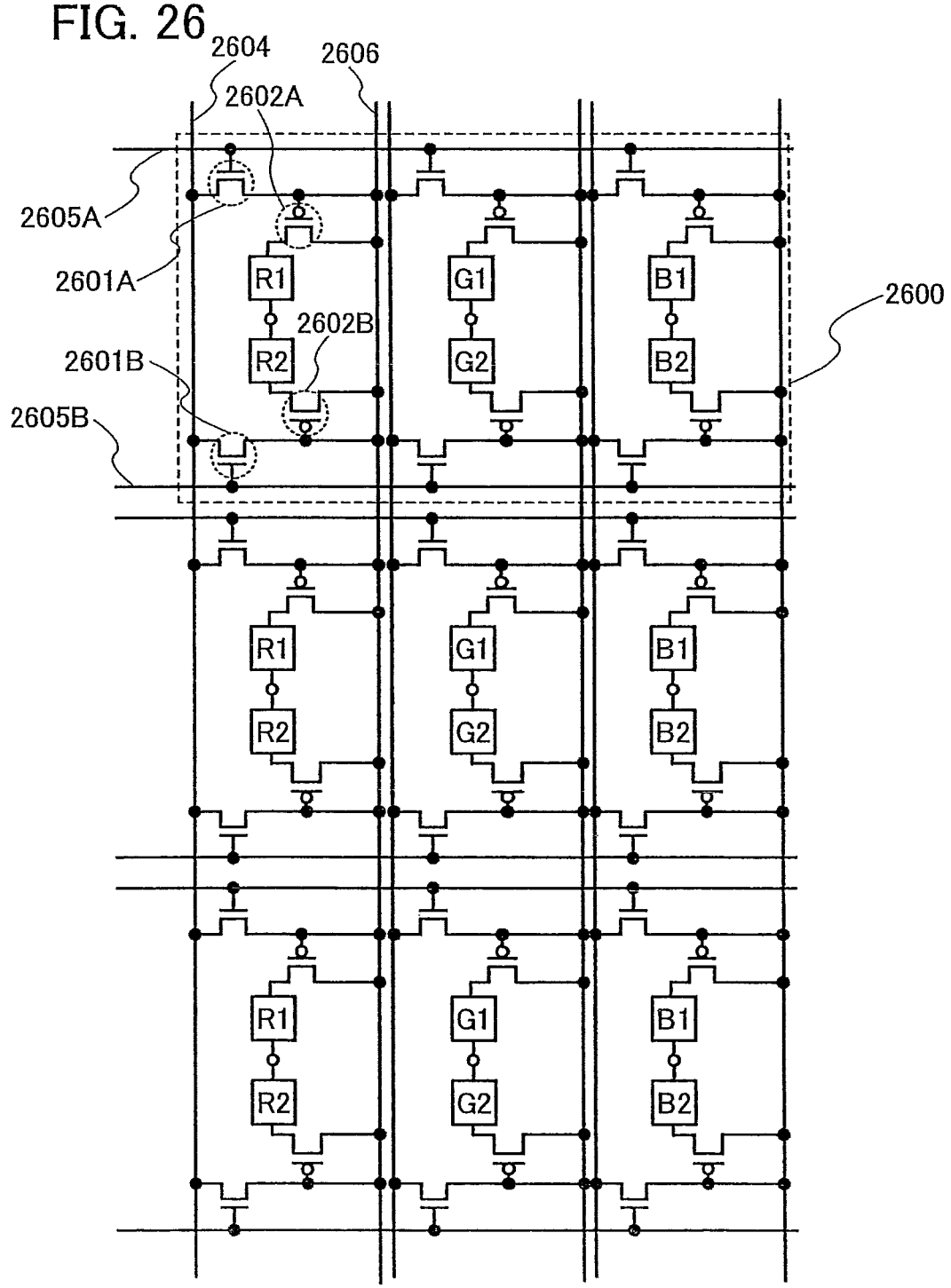
FIG. 26 is a circuit diagram of picture elements of a display device in the invention.

FIG. 26 shows a layout diagram of the circuit diagram shown in FIG. 4. Note that the circuit diagram and the layout diagram are not limited to FIG. 4 and FIG. 26, respectively.

Switching transistors 2601A and 2601B, driving transistors 2602A and 2602B, and electrodes of light-emitting elements R1 and R2 are disposed. Sources of the switching transistors 2601A and 2601B are connected to a signal line 2604, while drains thereof are connected to gates of the driving transistors 2602A and 2602B, respectively. A gate of the switching transistor 2601A is connected to a scan line 2605A, while a gate of the switching transistor 2601B is connected to a scan line 2605B. Sources of the driving transistors 2602A and 2602B are connected to a power supply line 2606, while drains thereof are connected to the electrodes of the light-emitting elements R1 and R2, respectively. Although a storage capacitor (not shown) is connected between the gate of either the driving transistor 2602A or 2602B and the power supply line 2606, it is not necessarily required.

Note that the number of the signal lines 2604 may be more than one corresponding to the driving transistors 2602A and 2602B.

The signal line 2604 and the power supply line 2606 are formed of a second wire, while the scan lines 2605A and 2605B are formed of a first wire.

Figure 27:
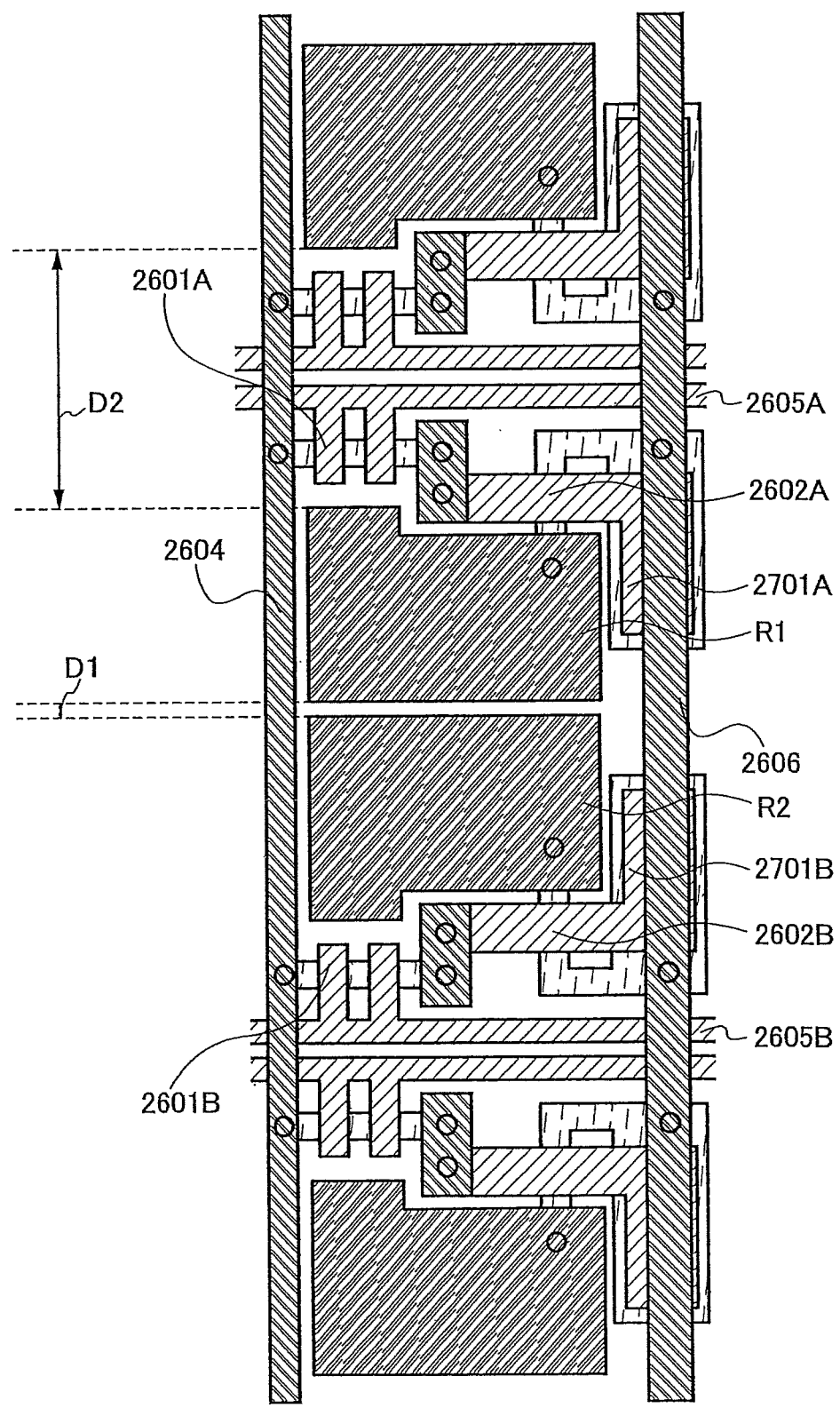
FIG. 27 is a top view of pixels of a display device in the invention.

FIG. 27 shows a top view of a pixel configuration corresponding to FIG. 26. Reference numerals denoting the respective portions in FIG. 27 correspond to those in FIG. 26.

In FIG. 27, in the case of a top-gate structure, films of a substrate, a semiconductor layer, a gate insulating film, a first wire, an interlayer insulating film, and a second wire are formed in this order. In the case of a bottom-gate structure, films of a substrate, a first wire, a gate insulating film, a semiconductor layer, an interlayer insulating film, and a second wire are formed in this order. In addition, in FIG. 27, storage capacitors 2701A and 2701B are provided between the power supply line and the first wires.

Although the description has been made of a double-gate structure where each of the switching transistors 2601A and 2601B is formed to have two channel formation regions, a single-gate structure where one channel formation region is formed or a triple-gate structure where three channel formation regions are formed may be used as well. Alternatively, a deal-gate structure where two gate electrodes are disposed above and below a channel formation region with gate insulating films sandwiched therebetween, or other structures may be used.

In FIG. 27, when the distance between the light-emitting elements R1 and R2 in the same picture element is denoted by D1, the distance between the light-emitting element R1 and a light-emitting element R2 of a picture element in another row is denoted by D2. According to a mode of FIG. 27 in this embodiment mode, a structure where D1<D2 is provided, and thus the distance between the light-emitting elements R1 and R2 in the same picture element can be shortened. In the invention, the light-emitting elements R1 and R2 are arranged in parallel in the column direction (the vertical direction in FIG. 26), and no scan line is disposed between the light-emitting elements R1 and R2 as shown in FIG. 27, which is preferable in that a color mixture of the light-emitting elements R1 and R2 can be more visible. Needless to say, light-emitting elements G1 and G2, and light-emitting elements B1 and B2 preferably have a similar structure to the light-emitting elements R1 and R2 in order to make a color mixture more visible. In addition, in the case of arranging the light-emitting elements R1 and R2 in parallel in the row direction (the horizontal direction in FIG. 26), it is preferable not to dispose a power supply line between the light-emitting elements R1 and R2, which allows the light-emitting elements R1 and R2 to be located more closer to each other.

Figure 28:
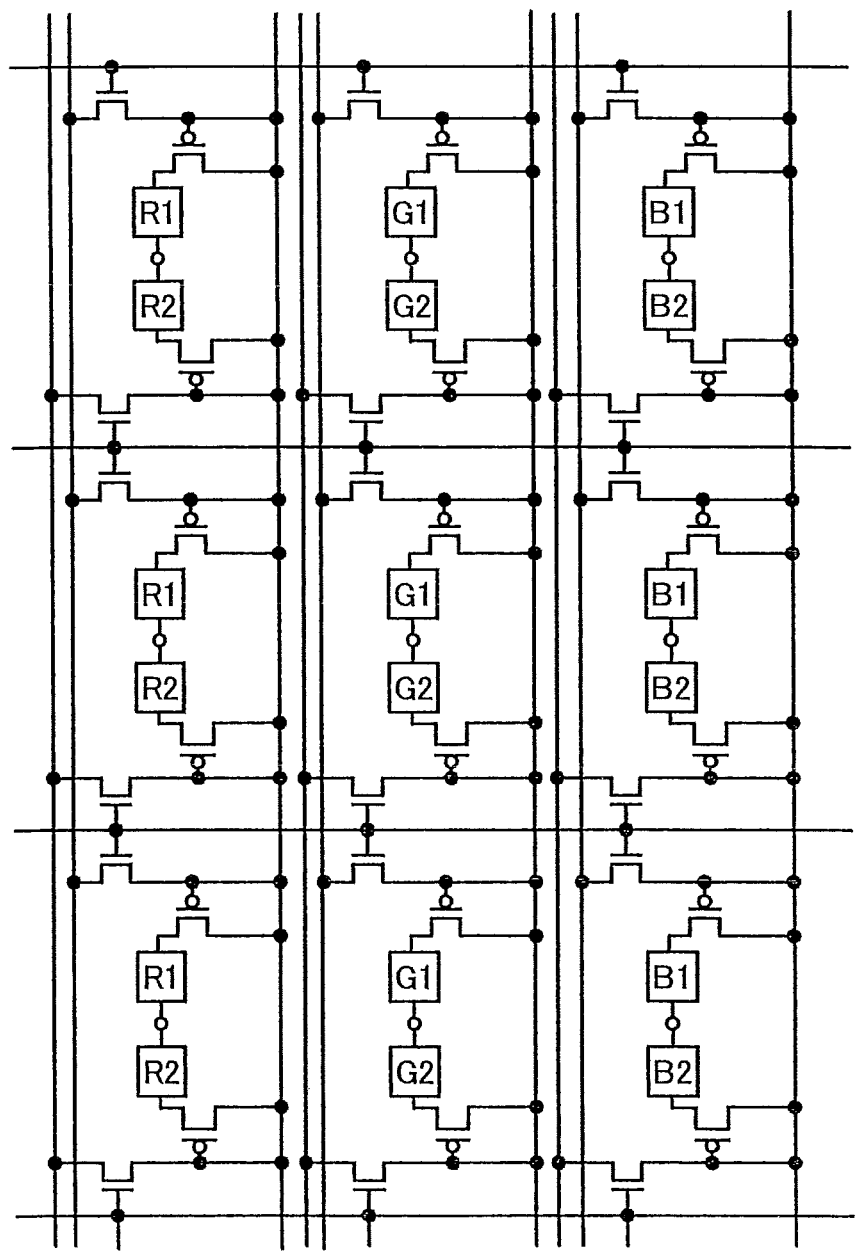
FIG. 28 is a circuit diagram of picture elements of a display device in the invention.

In the pixel of FIG. 26, the scan line 2605B can be replaced by a scan line 2605A of a pixel in another row. That is, the scan line 2605B of the display device shown in FIG. 26 can be omitted. FIG. 28 shows an exemplary configuration in the case where the scan line 2605B in the pixel of FIG. 26 is omitted and replaced by the scan line 2605A of a pixel in another row.

Figure 29:
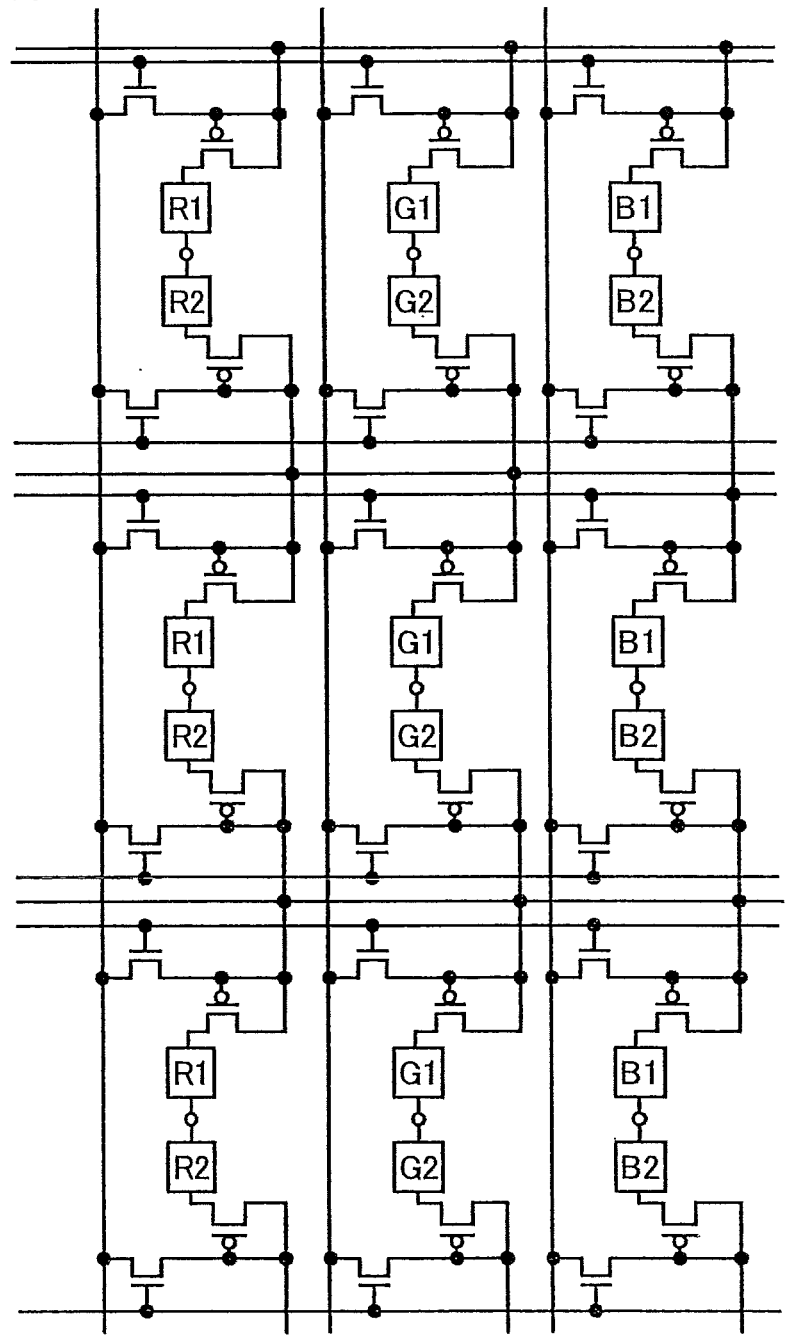
FIG. 29 is a circuit diagram of picture elements of a display device in the invention.

The configurations of the display device shown in FIGS. 26 and 28 are only illustrative, and thus the invention is not limited to these. For example, the power supply line is not necessarily required to be disposed in parallel with the signal line, and may be provided in parallel with the scan line, or each power supply line may be provided in grid patterns. That is, the power supply line in the pixel in FIG. 26 may be provided in parallel with the scan line as shown in FIG. 29.

As described above, wires provided around a pixel of the display device of the invention can have various structures, and thus the invention is not limited to the structures described in this specification.

Note that this embodiment mode can be freely combined with the other embodiment modes or embodiments in this specification.

Embodiment Mode 7

In this embodiment mode, description is made of a structure of a display panel having a pixel configuration shown in the aforementioned embodiment, with reference to FIGS. 30A and 30B.

Note that FIG. 30A is a top view showing a display panel, and FIG. 30B is a cross-sectional view taken along a line A-A' of FIG. 30A. The display panel includes a signal line driver circuit 3001, a pixel portion 3002, a first scan line driver circuit 3003, and a second scan line driver circuit 3006, which are shown by dotted lines. The display panel also includes a sealing substrate 3004 and a sealant 3005, and the inner side of the sealant 3005 is a space 3007.

Note that a wire 3008 is a wire for transmitting signals to be input into the first scan line driver circuit 3003, the second scan line driver circuit 3006, and the signal line driver circuit 3001, and receives video signals, clock signals, start signals, and the like from an FPC 3009 (Flexible Printed Circuit) which serves as an external input terminal. An IC chip 3019 (a semiconductor chip incorporating a memory circuit, a buffer circuit, and the like) is mounted on a connecting portion between the FPC 3009 and the display panel by COG (Chip On Glass) or the like. Although only an FPC is shown in the drawing, a printed wiring board (PWB) may be attached to the FPC. A display device in this specification includes not only a main body of a display panel, but includes a display panel in the condition that an FPC or a PWB is attached. Further, it also includes a display panel on which an IC chip and the like are mounted.

Next, a cross-sectional structure is described with reference to FIG. 30B. Although the pixel portion 3002 and its peripheral driver circuits (the first scan line driver circuit 3003, the second scan line driver circuit 3006, and the signal line driver circuit 3001) are actually formed over the substrate 3010, only the signal line driver circuit 3001 and the pixel portion 3002 are shown herein.

The signal line driver circuit 3001 is constructed from transistors of single conductivity type, such as an n-channel TFT 3020 and an n-channel TFT 3021. Note that in the case of constructing pixels by using transistors of single conductivity type, given that a peripheral driver circuit is constructed by using only n-channel transistors, a single conductivity type display panel can be manufactured. Needless to say, not only transistors of single conductivity type, but a CMOS circuit constructed from an n-channel transistor and a p-channel transistor may be used. In addition, although this embodiment mode shows a display panel where a pixel portion and peripheral driver circuits are formed over the same substrate, the invention is not necessarily limited to this and a part or all of the peripheral driver circuits may be formed in an IC chip so that it is mounted on the display panel by COG or the like. In such a case, the driver circuit is not required to be formed from transistors of single conductivity type, and thus it may be formed by combining an n-channel transistor and a p-channel transistor.

The pixel portion 3002 includes a TFT 3011 and a TFT 3012. Note that a source electrode of the TFT 3012 is connected to a first electrode 3013 (pixel electrode). In addition, an insulator 3014 is formed covering the edge of the first electrode 3013. Here, the insulator 3014 is formed by using a positive photosensitive acrylic resin film.

In order to obtain an excellent coverage, a top edge or a bottom edge of the insulator 3014 is formed to have a curved surface with a curvature. For example, in the case of using positive photosensitive acrylic as a material of the insulator 3014, it is preferable to form only the top edge of the insulator 3014 to have a curvature radius (0.2 to 3 µm). Alternatively, the insulator 3014 can be formed by using a negative photoresist which becomes insoluble in etchant by light or a positive photoresist which becomes soluble in etchant by light.

A light-emitting layer 3016 and a second electrode 3017 (opposite electrode) are formed over the first electrode 3013. Here, as a material used for the first electrode 3013 functioning as an anode, a material with a high work function is desirably used. For example, the first electrode 3103 can be formed with a single film such as an ITO (Indium Tin Oxide) film, an indium zinc oxide (IZO) film, a titanium nitride film, a chromium film, a tungsten film, a Zn film, or a Pt film, stacked layers of a titanium nitride film and a film containing aluminum as its main component, or a three-layer structure of a titanium nitride film, a film containing aluminum as its main component, and a titanium nitride film, or the like. When the first electrode 3103 is formed to have a stacked structure, low resistance as a wire can be obtained, an excellent ohmic contact can be formed, and further a function as an anode can be obtained.

The light-emitting layer 3016 is formed by a vapor deposition method using a vapor-deposition mask or an ink-jet method. A part of the light-emitting layer 3016 is formed by using a metal complex of the Group 4 in the periodic table, which may be combined with either a low molecular material or a high molecular material. In general, the material used for the light-emitting layer is often an organic compound with a single layer or stacked layers; however, a structure where a film made of an organic compound partially contains an inorganic compound may be used as well. Further, known triplet materials can be used.

As a material used for the second electrode 3017 formed over the light-emitting layer 3016, a material with a low work function (e.g., Al, Ag, Li, or Ca; or alloys of these such as MgAg, MgIn, AlLi, $CaF_2$, or calcium nitride) may be used. Note that in the case where light generated in the light-emitting layer 3016 is made travel through the second electrode 3017, the second electrode 3017 (cathode) is preferably formed of stacked layers of a thin metal film and a light-transmissive conductive film (e.g., ITO (an alloy of indium oxide and tin oxide), an alloy of indium oxide and zinc oxide ($In_2O_3$—ZnO), zinc oxide (ZnO), or the like).

Further, by attaching the sealing substrate 3004 to the substrate 3010 with the sealant 3005, a structure where a light-emitting element 3018 is provided in the space 3007 surrounded by the substrate 3010, the sealing substrate 3004, and the sealant 3005 is formed. Note that the space 3007 may be filled with an inert gas (e.g., nitrogen, argon, or the like) or filled with the sealant 3005.

Note that the sealant 3005 is preferably formed with an epoxy resin. In addition, such a material desirably transmits as little moisture and oxygen as possible. As a material used for the sealing substrate 3004, a plastic substrate made of FRP (Fiberglass-Reinforced Plastics), PVF (PolyVinyl Fluoride), mylar, polyester, acrylic, or the like can be used in addition to a glass substrate or a quartz substrate.

In this manner, a display panel having a pixel configuration of the invention can be obtained. Note that the aforementioned configuration is only illustrative, and thus the structure of the display panel of the invention is not limited to this.

By forming the signal line driver circuit 3001, the pixel portion 3002, the first scan line driver circuit 3003, and the second scan line driver circuit 3006 over the same substrate as shown in FIG. 30, cost reduction of the display device can be achieved. In addition, in this case, when the signal line driver circuit 3001, the pixel portion 3002, the first scan line driver circuit 3003, and the second scan line driver circuit 3006 are formed by using transistors of single conductivity type, the manufacturing process can be simplified, which leads to a further cost reduction.

Figure 31A:
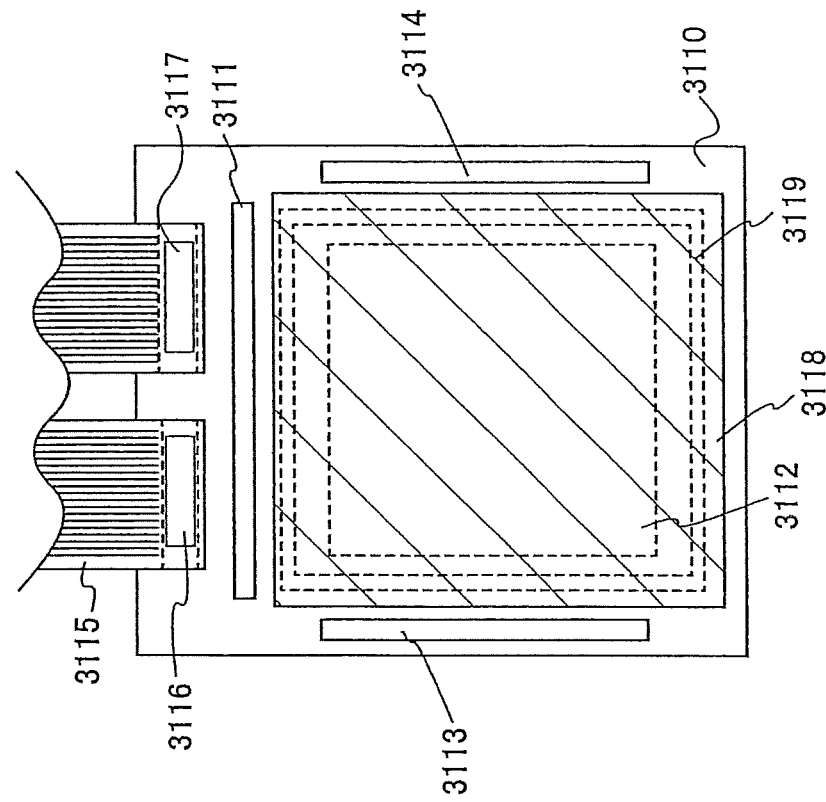
FIGS. 31A and 31B are views of one mode of a display device in the invention.

Note that a structure of a display panel is not limited to the structure where the signal line driver circuit 3001, the pixel portion 3002, the first scan line driver circuit 3003, and the second scan line driver circuit 3006 are formed over the same substrate as shown in FIG. 30A, and a structure where a signal line driver circuit 3101 shown in FIG. 31 which corresponds to the signal line driver circuit 3001 is formed in an IC chip so that it is mounted on the display panel by COG or the like may be used. Note that a substrate 3100, a pixel portion 3102, a first scan line driver circuit 3103, a second scan line driver circuit 3104, an FPC 3105, an IC chip 3106, an IC chip 3107, a sealing substrate 3108, and a sealant 3109 in FIG. 31A correspond to the substrate 3010, the pixel portion 3002, the first scan line driver circuit 3003, the second scan line driver circuit 3006, the FPC 3009, the IC chip 3019, the sealing substrate 3004, and the sealant 3005 in FIG. 30A, respectively.

That is, only a signal line driver circuit which is required to perform a high-speed operation is formed in an IC chip using a CMOS or the like in order to achieve low power consumption. In addition, by forming an IC chip using a semiconductor chip such as a silicon wafer, a higher-speed operation and lower power consumption can be achieved.

By forming the first scan line driver circuit 3103 and the second scan line driver circuit 3104 over the same substrate as the pixel portion 3102, cost reduction can be achieved. Further, by forming the first scan line driver circuit 3103, the second scan line driver circuit 3104, and the pixel portion

3102 using transistors of single conductivity type, further cost reduction can be achieved. As a configuration of pixels included in the pixel portion 3102, the pixels shown in Embodiment Modes 1, 2, 3, and 4 can be used.

In this manner, cost reduction of a high-definition display device can be achieved. In addition, by mounting an IC chip which incorporates a functional circuit (e.g., a memory or a buffer) on a connecting portion between the FPC 3105 and the substrate 3100, the substrate area can be effectively utilized.

Figure 31B:
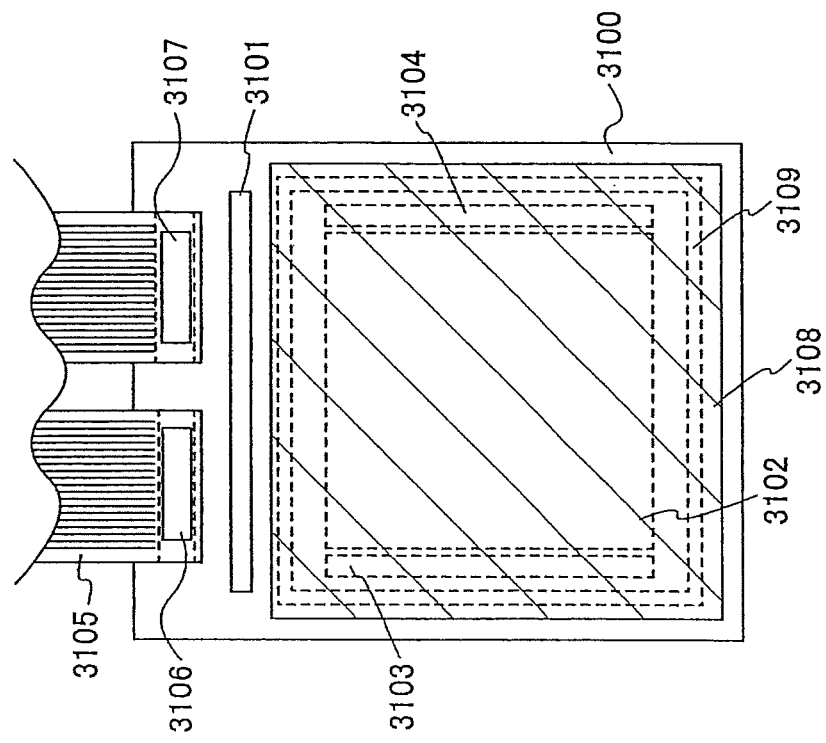

Alternatively, after forming a signal line driver circuit 3111, a first scan line driver circuit 3114, and a second scan line driver circuit 3113 in FIG. 31B, which correspond to the signal line driver circuit 3001, the first scan line driver circuit 3003, and the second scan line driver circuit 3006 in FIG. 30A, respectively, in IC chips, the IC chips may be mounted on the display panel by COG or the like. In this case, power consumption of a high-definition display device can be further reduced. Therefore, in order to obtain a display device with lower power consumption, polysilicon is desirably used for semiconductor layers of the transistors which are used in the pixel portion. A substrate 3110, a pixel portion 3112, an FPC 3115, an IC chip 3116, an IC chip 3117, a sealing substrate 3118, and a sealant 3119 in FIG. 31B correspond to the substrate 3010, the pixel portion 3002, the FPC 3009, the IC chip 3019, the sealing substrate 3004, and the sealant 3005 in FIG. 30A, respectively.

In addition, by using amorphous silicon for semiconductor layers of the transistors in the pixel portion 3112, further cost reduction can be achieved. Further, a large display panel can be manufactured.

Figure 32A:
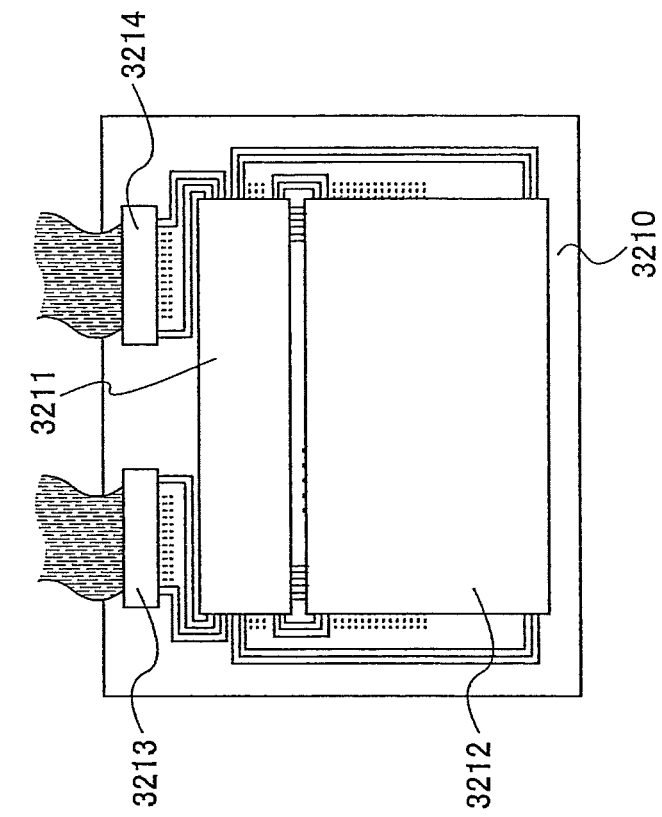
FIGS. 32A and 32B are views of one mode of a display device in the invention.

The second scan line driver circuit, the first scan line driver circuit, and the signal line driver circuit are not required to be provided in the row direction and the column direction of the pixels. For example, as shown in FIG. 32A, a peripheral driver circuit 3201 formed in an IC chip may incorporate the functions of the first scan line driver circuit 3114, the second scan line driver circuit 3113, and the signal line driver circuit 3111 shown in FIG. 31B. Note that a substrate 3200, a pixel portion 3202, an FPC 3204, an IC chip 3205, an IC chip 3206, a sealing substrate 3207, and a sealant 3208 in FIG. 32A correspond to the substrate 3010, the pixel portion 3002, the FPC 3009, the IC chip 3019, the sealing substrate 3004, and the sealant 3005 in FIG. 30A, respectively.

Figure 32B:
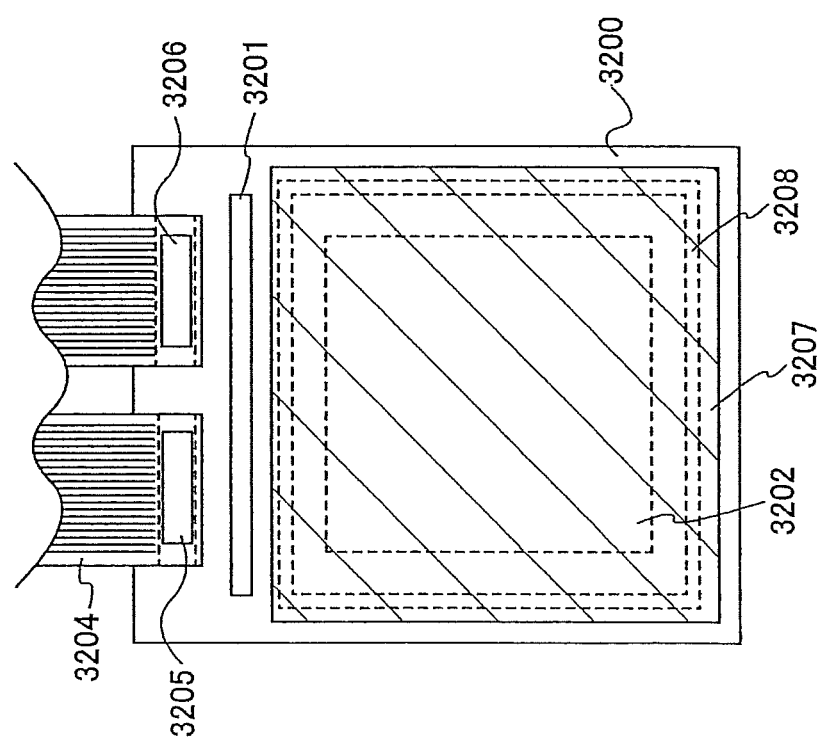

FIG. 32B shows a schematic view for illustrating a connection of wires in the display device of FIG. 32A. The display device includes a substrate 3210, a peripheral driver circuit 3211, a pixel portion 3212, an FPC 3213, and an FPC 3214. External signals and power supply potentials are input into the peripheral driver circuit 3211 from the FPC 3213. Output from the peripheral driver circuit 3211 is input into wires in the row and column directions which are connected to the pixels included in the pixel portion 3212.

As described above, a display panel of the display device of the invention can have various structures, and thus is not limited to the structures described in this specification.

Note that this embodiment mode can be freely combined with the other embodiment modes or embodiments in this specification.

Embodiment Mode 8

In this embodiment mode, description is made of another structure of each pixel and a cross-sectional structure of a transistor in the invention.

Figure 44A:
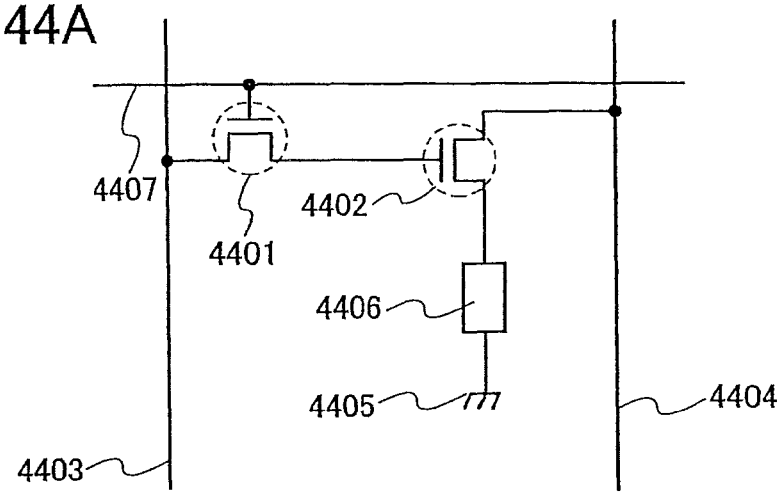
FIGS. 44A to 44C are circuit diagrams of pixels of a display device in the invention.
Figure 44B:
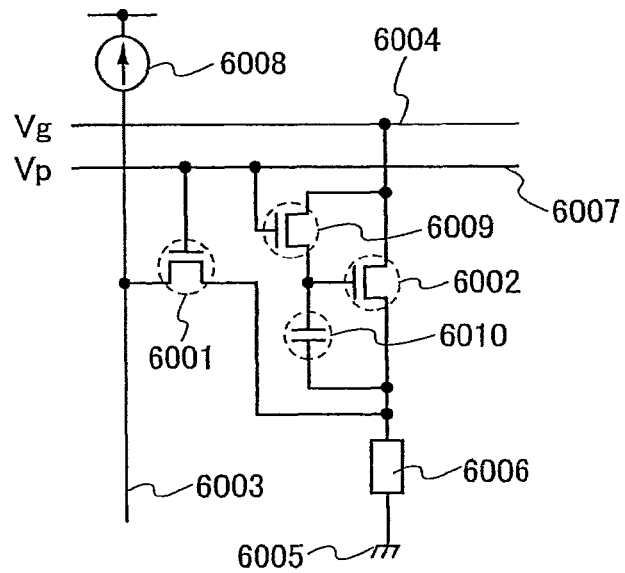
Figure 44C:
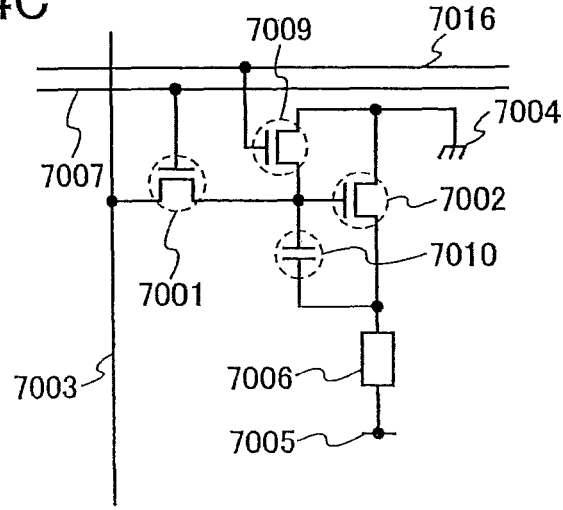

FIGS. 44A to 44C show exemplary circuit diagrams in this embodiment mode. Note that the circuit diagram is not limited to the ones shown in FIGS. 44A to 44C. The circuit diagrams illustrated in FIGS. 44A to 44C are the circuit diagrams using only n-channel transistors. By constructing a circuit which constitutes a pixel by using only n-channel transistors, a display device which can be formed through a simple process and can accommodate a large substrate can be provided. Hereinafter, specific examples of them are described.

FIG. 44A shows a circuit configuration. In a pixel, a first transistor 4401, a second transistor 4402, and a light-emitting element 4406 are disposed. A signal line 4403 to which video signals are input is connected to a gate of the second transistor 4402 through the first transistor 4401. A gate of the first transistor 4401 is connected to a scan line 4407. The second transistor 4402 and a light-emitting element 4406 are connected between a first power supply line 4404 and a second power supply line 4405. Current flows from the first power supply line 4404 to the second power supply line 4405. The light-emitting element 4406 emits light in accordance with the amount of current flowing thereto.

A storage capacitor may be provided in order to hold video signals input to the gate of the second transistor 4402. In that case, the storage capacitor may be provided either between the gate of the second transistor 4402 and a drain of the second transistor 4402, or between the gate of the second transistor 4402 and a source of the second transistor 4402. Alternatively, the storage capacitor may be provided between the gate of the second transistor 4402 and another wire (a dedicated wire, a scan line of a pixel in the preceding row, or the like). As a further alternative, the storage capacitor may be replaced by the gate capacitance of the second transistor 4402. Note that the second transistor 4402 and the first transistor 4401 are n-channel transistors.

FIG. 44B shows another circuit configuration of this embodiment mode. In a pixel, a first transistor 6001, a second transistor 6002, a third transistor 6009 (also called a storage transistor), a storage capacitor 6010, and a light-emitting element 6006 are disposed. A signal line 6003 to which video signals are input is connected to a source of the second transistor 6002 through the first transistor 6001. A gate of the first transistor 6001 is connected to a scan line 6007. The second transistor 6002 and a light-emitting element 6006 are connected between a first power supply line 6004 and a second power supply line 6005. Current flows from the first power supply line 6004 to the second power supply line 6005. The light-emitting element 6006 emits light in accordance with the amount of current flowing thereto. The storage capacitor 6010 is disposed between a gate and the source of the second transistor 6002, and the third transistor 6009 is connected between the gate and a drain of the second transistor 6002. A gate of the third transistor 6009 is connected to the scan line 6007.

A current source circuit 6008 is disposed in a signal line driver circuit. The current source circuit 6008 supplies a current to a pixel in accordance with the size of a video signal. A video signal which is supplied to the source signal line 6003 upon selection of the scan line 6007 is input to the second transistor 6002. At this time, no current flows into the light-emitting element 6006 because of the potential relationship between the first power supply line 6004 and the second power supply line 6005, since the potential of the first power supply line 6004 is changed. Then, a gate-source voltage of the second transistor 6002 with a required level is held in the storage capacitor 6010 in accordance with the size of a video signal. After that, the scan line 6007 is turned into a non-selection state, so that the charges accumulated in the storage capacitor 6010 are held. Accordingly, the gate-source voltage of the second transistor 6002 does not change even when the drain potential or the source potential of the second transistor 6002 changes. Then, the potential of the first power supply line 6004 returns to a former level, so that a current with an amount corresponding to a video signal flows through the second transistor 6002 to be delivered to the light-emitting element 6006.

FIG. 44C shows another circuit configuration of this embodiment mode. In a pixel, a first transistor 7001, a second transistor 7002, a third transistor 7009, a storage capacitor 7010, and a light-emitting element 7006 are disposed. A signal line 7003 to which video signals are input is connected to a gate of the second transistor 7002 through the first transistor 7001. A gate of the first transistor 7001 is connected to a first scan line 7007. The second transistor 7002 and a light-emitting element 7006 are connected between a first power supply line 7004 and a second power supply line 7005. Current flows from the first power supply line 7004 to the second power supply line 7005. The light-emitting element 7006 emits light in accordance with the amount of current flowing thereto. The storage capacitor 7010 is disposed between the gate and a source of the second transistor 7002, and the third transistor 7009 is connected between the gate and a drain of the second transistor 7002. A gate of the third transistor 7009 is connected to a second scan line 7016.

In the circuit configuration shown in FIG. 44C, the third transistor 7009 is turned on in response to a signal input from the second scan line 7016. Then, a gate-source voltage of the second transistor 7002 which has a level equal to the threshold voltage of the second transistor 7002 is held in the storage capacitor 7010. Therefore, variations in the threshold voltage of each driving voltage can be corrected in advance. Note that a voltage higher than the threshold voltage of the transistor may be held in the storage capacitor 7010 in advance by increasing the potential of the second power supply line 7005 only for an instant.

Then, a video signal supplied to the signal line 7003 is input to the gate of the second transistor 7002. Then, a current corresponding to the size of a video signal flows through the second transistor 7002 to be delivered to the light-emitting element 7006.

In FIGS. 44A to 44C, the second transistor may be operated only in the saturation region, operated both in the saturation region and the linear region, or operated only in the liner region.

In the case where the second transistor is operated only in the linear region, it roughly operates as a switch. Therefore, fluctuations of characteristics of the second transistor due to the deterioration, temperature, and the like will have few effects on the switching operation. In the case where the second transistor is operated only in the linear region, whether to flow a current into the light-emitting element 7006 or not is often controlled digitally. In that case, a time gray-scale method, an area gray-scale method, and the like may be combined in order to achieve multi-gray scales.

Figure 42A:
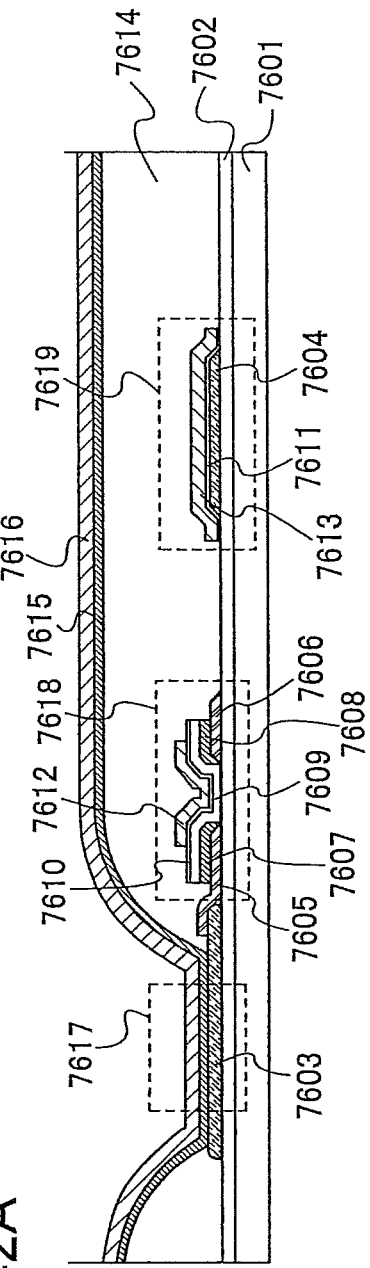
FIGS. 42A and 42B are cross-sectional views of a display device in the invention.
Figure 42B:
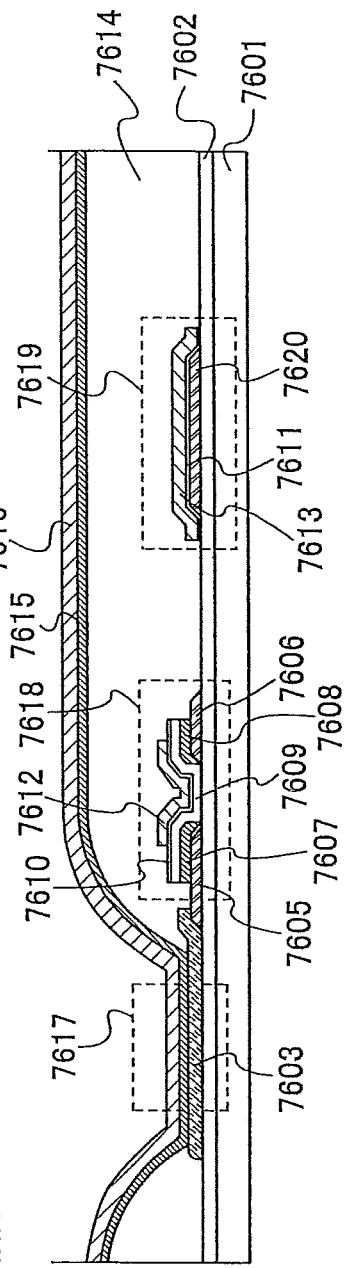

Next, a case is described where an amorphous silicon (a-Si: H) film is used for a semiconductor layer of a transistor in the circuit configurations shown in FIGS. 44A to 44C. FIGS. 42A and 42B show examples of a top-gate transistor, while FIGS. 43A and 43B and FIGS. 49A and 49B show examples of a bottom-gate transistor.

FIG. 42A shows a cross section of a staggered transistor which uses amorphous silicon as a semiconductor layer. As shown in FIG. 42A, a base film 7602 is formed over a substrate 7601. Further, a pixel electrode 7603 is formed over the base film 7602. In addition, a first electrode 7604 is formed with the same material and in the same layer as the pixel electrode 7603.

As a substrate, any of a glass substrate, a quartz substrate, a ceramic substrate, a plastic substrate, and the like can be used. In addition, as the base film 7602, a single layer of aluminum nitride (AlN), silicon oxide ($SiO_2$), silicon oxynitride ($SiO_xN_y$), or the like, or stacked layers thereof can be used.

Wires 7605 and 7606 are formed over the base film 7602, and the edge of the pixel electrode 7603 is covered with the wire 7605. N-type semiconductor layers 7607 and 7608 each having n-type conductivity are formed over the wires 7605 and 7606, respectively. A semiconductor layer 7609 is formed between the wires 7605 and 7606, and over the base film 7602. A part of the semiconductor layer 7609 is extended to partially cover the n-type semiconductor layers 7607 and 7608. Note that the semiconductor layer 7609 is formed of a non-crystalline semiconductor film which is made of amorphous silicon (a-Si:H), a microcrystalline semiconductor (μ-Si:H), or the like. A gate insulating film 7610 is formed over the semiconductor layer 7609. In addition, an insulating film 7611 which is formed with the same material and in the same layer as the gate insulating film 7610 is formed over the first electrode 7604. Note that the gate insulating film 7610 is formed of a silicon oxide film, a silicon nitride film, or the like.

A gate electrode 7612 is formed over the gate insulating film 7610. In addition, a second electrode 7613 which is formed with the same material and in the same layer as the gate electrode 7612 is formed over the first electrode 7604 with the insulating film 7611 sandwiched therebetween. By sandwiching the insulating film 7611 between the first electrode 7604 and the second electrode 7613, a storage capacitor 7619 is formed. An interlayer insulating film 7614 is formed covering the edge of the pixel electrode 7603, a driving transistor 7618, and the storage capacitor 7619.

A light-emitting layer 7615 and an opposite electrode 7616 are formed over the interlayer insulating film 7614 and the pixel electrode 7603 positioned in an opening of the interlayer insulating film 7614. Thus, a light-emitting element 7617 is formed in a region where the light-emitting layer 7615 is sandwiched between the pixel electrode 7603 and the opposite electrode 7616.

The first electrode 7604 shown in FIG. 42A may be replaced by a first electrode 7620 as shown in FIG. 42B. The first electrode 7620 is formed with the same material and in the same layer as the wires 7605 and 7606.

FIGS. 43A and 43B show partial cross sections of a display panel having a bottom-gate transistor which uses amorphous silicon as a semiconductor layer.

A base film 7702 is formed over a substrate 7701. Further, a gate electrode 7703 is formed over the base film 7702. In addition, a first electrode 7704 is formed with the same material and in the same layer as the gate electrode 7703. As a material of the gate electrode 7703, polysilicon doped with phosphorus can be used. Not only polycrystalline silicon, but also silicide which is a compound of a metal and silicon may be used as well.

In addition, a gate insulating film 7705 is formed covering the gate electrode 7703 and the first electrode 7704. The gate insulating film 7705 is formed of a silicon oxide film, a silicon nitride film, or the like.

A semiconductor layer 7706 is formed over the gate insulating film 7705. In addition, a semiconductor layer 7707 is formed with the same material and in the same layer as the semiconductor layer 7706.

As a substrate, any of a glass substrate, a quartz substrate, a ceramic substrate, a plastic substrate, and the like can be used. In addition, as the base film 7702, a single layer of aluminum nitride (AlN), silicon oxide ($SiO_2$), silicon oxynitride ($SiO_xN_y$), or the like, or stacked layers thereof can be used.

N-type semiconductor layers 7708 and 7709 each having n-type conductivity are formed over the semiconductor layer 7706, while an n-type semiconductor layer 7710 is formed over the semiconductor layer 7707.

Wires 7711, 7712, and 7713 are formed over the n-type semiconductor layers 7708, 7709, and 7710, respectively, and the conductive layer 7713 which is formed with the same material and in the same layer as the wires 7711 and 7712 is formed over the n-type semiconductor layer 7710.

A second electrode is formed of the semiconductor layer 7707, the n-type semiconductor layer 7710, and the conductive layer 7713. Note that a storage capacitor 7720 is formed in a region where the gate insulating film 7705 is sandwiched between the second electrode and the first electrode 7704.

In addition, a part of the wire 7711 is extended, and a pixel electrode 7714 is formed in contact with the top surface of the extended portion of the wire 7711.

An insulator 7715 is formed covering the edge of the pixel electrode 7714, a driving transistor 7719, and the storage capacitor 7720.

A light-emitting layer 7716 and an opposite electrode 7717 are formed over the pixel electrode 7714 and the insulator 7715, and a light-emitting element 7718 is formed in a region where the light-emitting layer 7716 is sandwiched between the pixel electrode 7714 and the opposite electrode 7717.

The semiconductor layer 7707 and the n-type semiconductor 7710 which partially function as a second electrode of the storage capacitor are not necessarily provided. That is, only the conductive layer 7713 may be used as the second electrode, so that the storage capacitor has a structure where a gate insulating film is sandwiched between the first electrode 7704 and the conductive layer 7713.

Note that by forming the pixel electrode 7714 before forming the wire 7711 shown in FIG. 43A, a storage capacitor 7720 as shown in FIG. 43B can be formed, which has a structure where the gate insulating film 7705 is sandwiched between the first electrode 7704 and a second electrode 7721 which is formed of the same material and in the same layer as the pixel electrode 7714.

Although FIGS. 43A and 43B show inversely staggered transistors with a channel-etched structure, a transistor with a channel-protective structure may be employed as well. Next, description is made of a case of a transistor with a channel-protective structure, with reference to FIGS. 49A and 49B.

A transistor with a channel-protective structure shown in FIG. 49A is different from the driving transistor 7719 with a channel-etched structure shown in FIG. 43A in that an insulator 7801 serving as an etching mask is provided over a channel formation region in the semiconductor layer 7706. Portions common to FIGS. 49A and 43A are denoted by common reference numerals.

Similarly, a transistor with a channel-protective structure shown in FIG. 49B is different from the driving transistor 7719 with a channel-etched structure shown in FIG. 43B in that an insulator 7802 serving as an etching mask is provided over a channel formation region in the semiconductor layer 7706. Portions common to FIGS. 49B and 43B are denoted by common reference numerals.

By using an amorphous semiconductor film for a semiconductor layer (e.g., a channel formation region, a source region, or a drain region) of a transistor which partially constitutes a pixel of the invention, manufacturing cost can be reduced. For example, an amorphous semiconductor film can be applied by using the pixel configurations shown in FIGS. 44A to 44C.

Note that this embodiment mode can be freely combined with the other embodiment modes or embodiments in this specification.

Embodiment Mode 9

In this embodiment mode, description is made of a structure of a passive display panel which can be applied to the invention.

Figure 47:
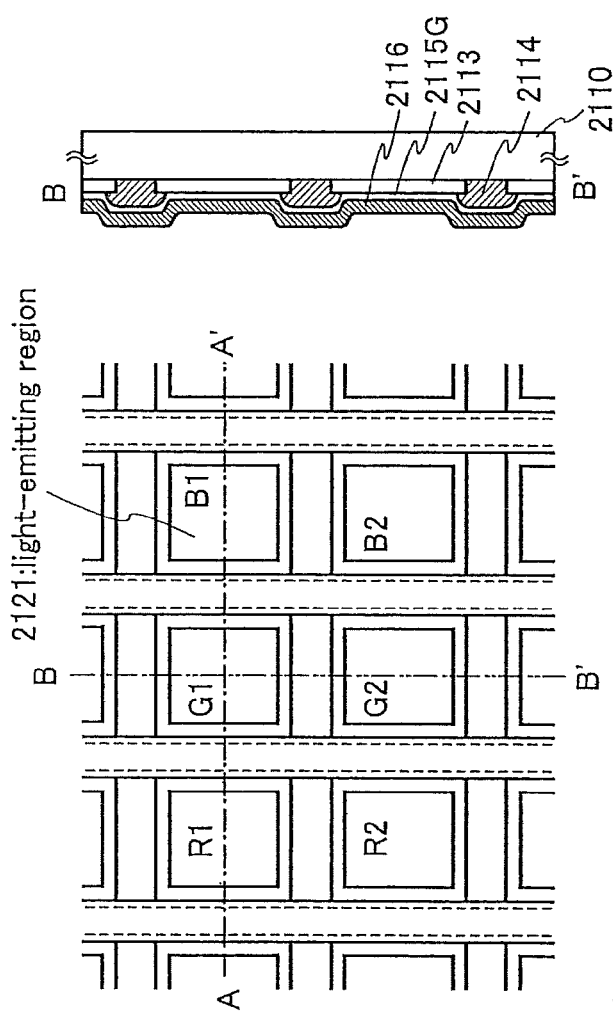
FIG. 47A is a top view of a display device.
FIGS. 47B and 47C are cross-sectional views thereof.

FIG. 47A is a top view of a pixel portion before being sealed. FIG. 47B is a cross-sectional view taken along a chain dash line A-A' in FIG. 47A, and FIG. 47C is a cross-sectional view taken along a chain dash line B-B' in FIG. 47A.

A plurality of first electrodes 2113 are disposed in stripe patterns at even intervals over a substrate 2110. A partition wall 2114 having openings corresponding to the respective pixels is provided over the first electrode 2113. The partition wall 2114 having openings is formed of a light-shielding material (black pigment, a photosensitive or non-photosensitive organic material in which carbon black is dispersed (e.g., polyimide, acrylic, polyamide, polyimide amide, resist, or benzocyclobutene), or an SOG film (e.g., a $SiO_x$ film containing an alkyl group)). For example, a material such as COLOR MOSAIC® CK (registered trademark of FUJIFILM OLIN Co., Ltd) is used for the partition wall 2114 having openings. The partition wall 2114 having openings functions as a black matrix (BM). Note that the opening corresponding to each pixel functions as a light-emitting region 2121.

Over the partition wall 2114 having openings, a plurality of parallel partition walls 2122 with inversely tapered shapes are provided, crossing the first electrodes 2113. The inversely tapered partition walls 2122 are formed by photolithography using a positive photosensitive resin by which unexposed regions remain as patterns, so that lower portions of the patterns are etched more by controlling the quantity of exposure light or the developing time. The inversely tapered partition walls 2122 may also be formed with the aforementioned light-shielding material so as to further improve the contrast.

Figure 48:
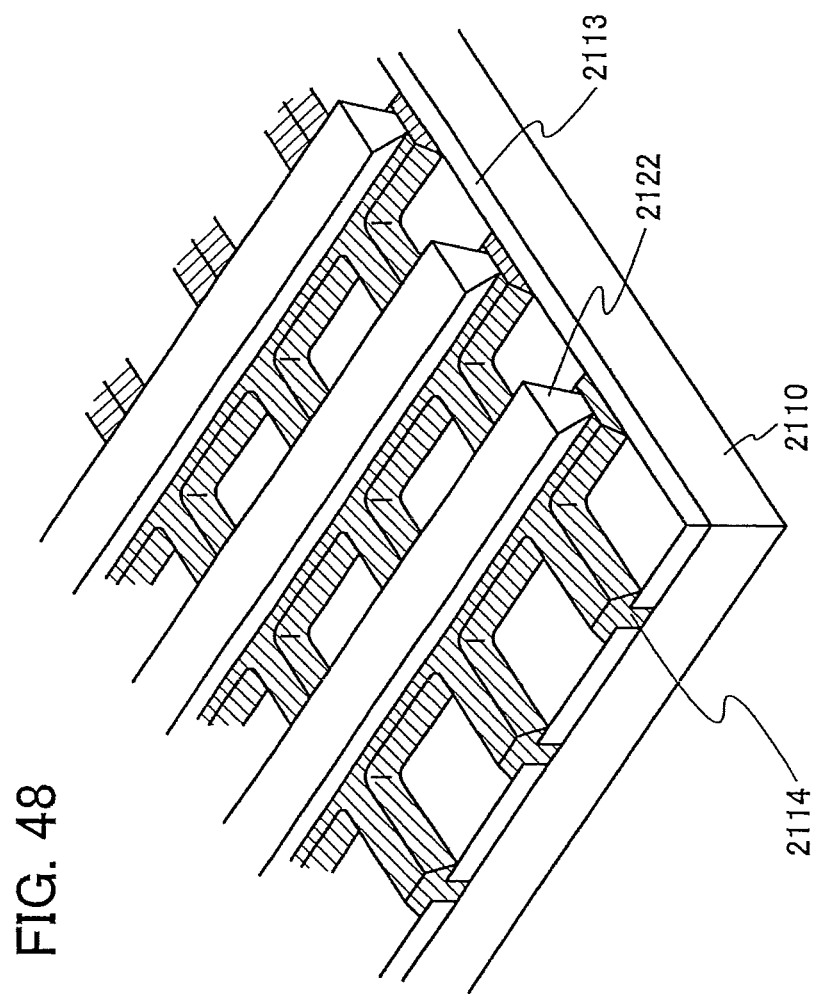
FIG. 48 is a cross-sectional view of a display device in the invention.

FIG. 48 shows a perspective view immediately after forming the plurality of parallel partition walls 2122 with inversely tapered shapes. Note that common portions to FIGS. 48 and 47A to 47C are denoted by common reference numerals.

The height of the inversely tapered partition walls 2122 is set to be higher than the thickness of a film containing an organic compound and a conductive film. When a film containing an organic compound and a conductive film are stacked over the first substrate having the structure shown in FIG. 48, they are separated into a plurality of regions which are electrically insulated from each other, thereby light-emitting layers and second electrodes 2116 are formed. The second electrodes 2116 are parallel striped electrodes which extend in the direction of crossing the first electrodes 2113. Note that the film containing an organic compound and the conductive film are also formed over the inversely tapered partition walls 2122; however, they are separated from light-emitting layers 2115R, 2115G, and 2115B, and the second electrodes 2116.

Note that in this embodiment mode, a first light-emitting element R1 of the invention corresponds to the light-emitting layer 2115R; a third light-emitting element G1 of the invention corresponds to the light-emitting layer 2115G; and a fifth light-emitting element B1 of the invention corresponds to the light-emitting layer 2115B. Note also that in this embodiment mode, the second light-emitting element R2 of the invention corresponds to a region below the light-emitting layer 2115R in FIG. 47A; the fourth light-emitting element G2 of the invention corresponds to a region below the light-emitting layer 2115G in FIG. 47A; and the sixth light-emitting element B2 of the invention corresponds to a region below the light-emitting layer 2115B in FIG. 47A. As a method of varying the emission spectrums of the light-emitting elements R1 and R2 from each other; varying the emission spectrums of the light-emitting elements G1 and G2 from each other; and varying the emission spectrums of the light-emitting elements B1 and B2 from each other, either a material or thickness of the respective light-emitting elements may be varied, or color filters or color conversion layers having different transmission properties may be used. In this embodiment mode, description is made of the light-emitting layers 2115R, 2115G, and 2115B, and not the whole pixels will be described.

An example shown herein is a case where the light-emitting layers 2115R, 2115G, and 2115B are selectively formed to form a light-emitting device capable of a full color display with which three kinds of light emission (R, G, and B) are obtained. The light-emitting layers 2115R, 2115G, and 2115B are formed in stripe patterns which are parallel with each other.

Sealing of the light-emitting elements is carried out by attaching a second substrate to the first substrate with a sealant. A protective film for covering the second electrodes 2116 may also be formed if necessary. Note that the second substrate is preferably a substrate having a high bather property against moisture. In addition, a drying agent may be disposed in a region surrounded by a sealant if necessary.

Figure 50:
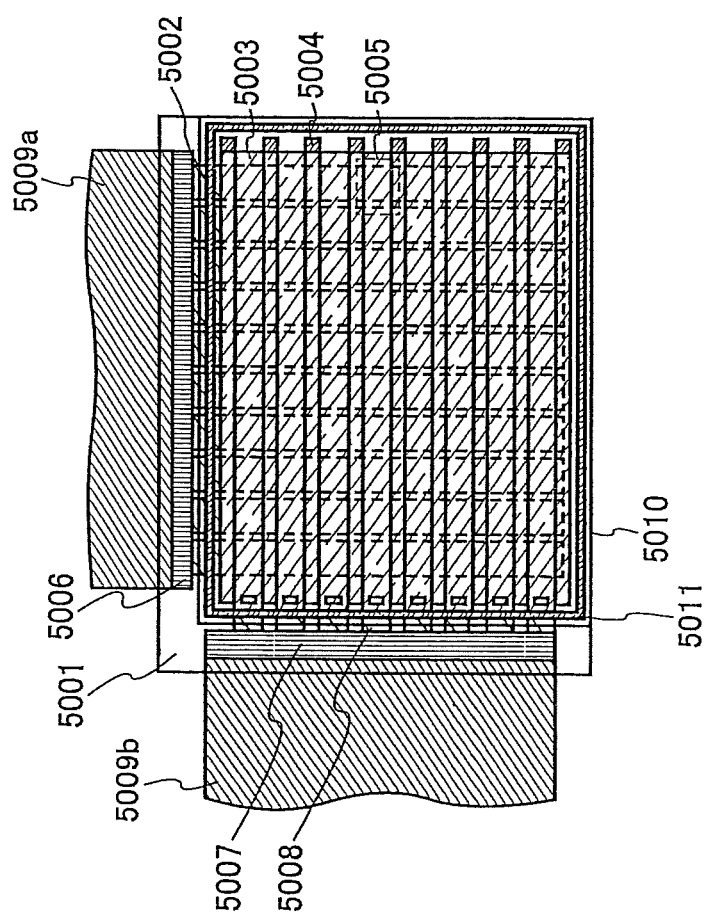
FIG. 50 is a schematic view of a display device in the invention.

FIG. 50 shows a top view of a light-emitting module on which an FPC and the like are mounted after sealing.

Note that a light-emitting device in this specification means an image display device, a light-emitting device, or a light source (including an illuminating device). In addition, a light-emitting device includes a module to which a connector such as an FPC (Flexible Printed Circuit), a TAB (Tape Automated Bonding) tape, or a TCP (Tape Carrier Package) is attached, a module where an end of the TAB tape or the TCP is provided with a printed wiring board, or a module where an IC (Integrated Circuit) is directly mounted on light-emitting elements by COG (Chip On Glass).

A first substrate 5001 and a second substrate 5010 are attached with a sealant 5011 so as to face each other. The sealant 5011 may be a photo-curing resin, and is preferably a material with few degasification and a low hygroscopic property. In addition, in order to keep a constant gap between the substrates, fillers (spacers in stick or fiber forms) or spherical spacers may be added to the sealant 5011. Note that the second substrate 5010 is preferably formed of a material having the same thermal expansion coefficient as the first substrate 5001, and glass (including quartz glass) or plastic can be used.

In a pixel portion where an image display is performed as shown in FIG. 50, column signal lines and row signal lines cross at right angles with each other.

The first electrode 2113 in FIGS. 47A to 47C corresponds to a column signal line 5002 in FIG. 5; the second electrode 2116 in FIGS. 47A to 47C corresponds to a row signal line 5003; and the inversely tapered partition wall 2122 in FIG. 47C corresponds to a partition wall 5004. A light-emitting layer is sandwiched between the column signal line 5002 and the row signal line 5003, and one intersection 5005 corresponds to one pixel.

Note that the row signal line 5003 is electrically connected on its end to a connecting wire 5008, and the connecting wire 5008 is connected to an FPC 5009b through an input terminal 5007. The column signal line 5002 is connected to an FPC 5009a through an input terminal 5006.

In addition, an optical film such as a polarizing plate, a circularly polarizing light plate (including an elliptically polarizing plate), a retardation plate (a $\lambda/4$ plate or a $\lambda/2$ plate), or a color filter may be provided as appropriate on the light-emission surface. In addition, the polarizing plate or the circularly polarizing plate may be provided with an anti-reflection film. For example, anti-glare treatment may be applied to the polarizing plate or the circularly polarizing plate by forming irregularities on the surface in order to diffuse reflected light and reduce glare. In addition, anti-reflection treatment by thermal treatment may be applied to the polarizing pate or the circularly polarizing plate. After that, hard-coat treatment may be further applied for protection against external shocks. However, when a polarizing plate or a circularly polarizing plate is used, the light extraction efficiency is decreased. In addition, the polarizing plate or the circularly polarizing plate itself is expensive and easily deteriorates.

In this embodiment mode, stray light from the light-emitting elements is absorbed or shielded by providing black partition walls (also called banks or partitions) which serve as a black matrix (BM) between pixels on the side of the substrate where light-emitting elements are provided, thereby the contrast of a display can be improved.

Note that this embodiment mode can be freely combined with the other embodiment modes or embodiments in this specification.

Embodiment Mode 10

In this embodiment mode, description is made of another structure of a light-emitting element in the invention.

Although the light-emitting elements described in the aforementioned embodiment modes are mainly organic electroluminescence (EL: Electro Luminescence) elements, the invention is not limited to these.

For example, it may be a DMD (Digital Micromirror Device), a PDP (Plasma Display Panel), an FED (Field Emission Display), an SED (Surface-conduction Electron-emitter Display) which is one of the FEDs, an electrophoretic display device (electronic paper), or a piezoelectric ceramic display.

Among the aforementioned light-emitting elements, elements whose colors can be recognized with light traveling therethrough can perform a display through color filters as described in Embodiment Mode 3. The emission spectrums of the light-emitting elements R1 and R2 in the first and second pixels are varied from each other; the emission spectrums of the light-emitting elements G1 and G2 in the third and fourth pixels are varied from each other; and the emission spectrums of the light-emitting elements B1 and B2 in the fifth and sixth pixels are varied from each other. As a result, when represented by a CIE-XY chromaticity diagram, coordinates on the chromaticity diagram may be varied between the light-emitting elements R1 and R2 in the first and second pixels; between the light-emitting elements G1 and G2 in the third and fourth pixels; and between the light-emitting elements B1 and B2 in the fifth and sixth pixels, respectively.

Among the aforementioned light-emitting elements, elements of a self-luminous type can perform display by converting colors with a fluorescent material and the like. The emission spectrums of the light-emitting elements R1 and R2 in the first and second pixels are varied from each other; the emission spectrums of the light-emitting elements G1 and G2 in the third and fourth pixels are varied from each other; and the emission spectrums of the light-emitting elements B1 and B2 in the fifth and sixth pixels are be varied from each other. As a result, when represented by a CIE-XY chromaticity diagram, coordinates on the chromaticity diagram may be varied between the light-emitting elements R1 and R2 in the first and second pixels; between the light-emitting elements G1 and G2 in the third and fourth pixels; and between the light-emitting elements B1 and B2 in the fifth and sixth pixels, respectively.

Note that this embodiment mode can be freely combined with the other embodiment modes or embodiments in this specification.

Embodiment 1

The display device of the invention can be applied to various electronic devices. Specifically, it can be applied to a display portion of an electronic device. Such electronic devices include a video camera, a digital camera, a goggle display, a navigation system, an audio reproducing device (e.g., a car audio, an audio component set, or the like), a computer, a game machine, a portable information terminal (e.g., a mobile computer, a mobile phone, a portable game machine, an electronic book, or the like), an image reproducing device provided with a recording medium (specifically, a device for reproducing a recording medium such as a digital versatile disc (DVD) and having a display for displaying the reproduced image), and the like.

Figure 38A:
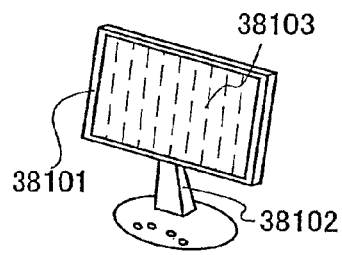
FIGS. 38A to 38H are views of electronic devices to which a display device of the invention can be applied.

FIG. 38A shows a display which includes a housing 38101, a supporting base 38102, a display portion 38103, and the like. A display device having the pixel configuration of the invention can be used for the display portion 38103. Note that the display includes all of information display devices such as those for personal computers, television broadcast reception, and advertisement display. The display which uses the display device of the invention for the display portion 38103 can express bright colors.

In recent years, need for a high added value of displays has been growing. Accordingly, to reduce the manufacturing cost and to express bright colors are the primary subjects to be addressed.

For example, by using the pixel configuration in FIG. 2 or the like for a pixel portion of a display panel, a display panel which can express bright colors can be provided.

In addition, by forming the pixel portion and its peripheral driver circuits over the same substrate as shown in FIG. 30A, a display panel with reduced manufacturing cost can be formed.

In addition, by using an amorphous semiconductor (e.g., amorphous silicon (a-Si:H)) for a semiconductor layer of a transistor in a circuit which partially constitutes a pixel portion, a manufacturing process can be simplified and further cost reduction can be achieved. In this case, the driver circuit on the periphery of the pixel portion may be formed in an IC chip so that it is mounted on the display panel by COG or the like as shown in FIG. 31B and FIG. 32B. In this manner, using an amorphous semiconductor makes it easier to increase the size of a display.

Figure 38B:
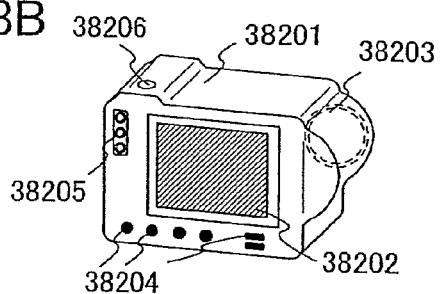

FIG. 38B shows a camera which includes a main body 38201, a display portion 38202, an image receiving portion 38203, operating keys 38204, an external connecting port 38205, a shutter 38206, and the like.

In recent years, competitive manufacturing of digital cameras has been intensified in accordance with the higher performance. Therefore, to suppress the cost of a high-performance product is the primary subject to be addressed. A digital camera which uses the display device of the invention for the display portion 38202 can express bright colors.

For example, by forming a signal line driver circuit which operates at a high speed in an IC chip while forming a scan line driver circuit which operates at a relatively low speed on the same substrate as a pixel portion by using transistors of single conductivity type, high performance and cost reduction can be achieved. In addition, by using an amorphous semiconductor, for example amorphous silicon for a semiconductor layer of a transistor used for the scan line driver circuit which is formed over the same substrate as the pixel portion, further cost reduction can be achieved.

Figure 38C:
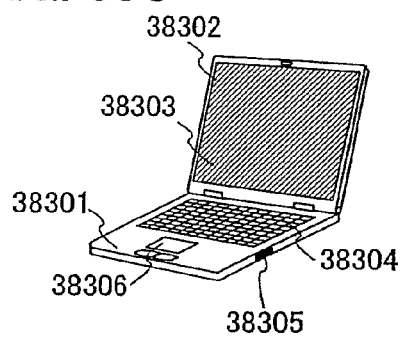

FIG. 38C shows a computer which includes a main body 38301, a housing 38302, a display portion 38303, a keyboard 38304, an external connecting port 38305, a pointing device 38306, and the like. A computer which uses the display device of the invention for the display portion 38303 can express bright colors.

Figure 38D:
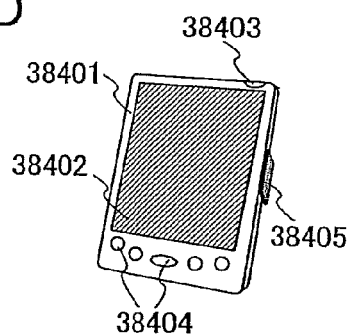

FIG. 38D shows a mobile computer which includes a main body 38401, a display portion 38402, a switch 38403, operating keys 38404, an infrared port 38405, and the like. A mobile computer which uses the display device of the invention for the display portion 38402 can express bright colors.

Figure 38E:
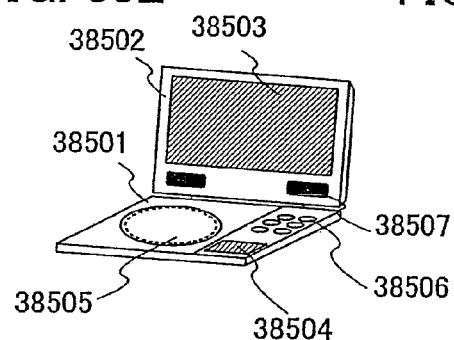

FIG. 38E shows a portable image reproducing device provided with a recording medium (specifically, a DVD player), which includes a main body 38501, a housing 38502, a display portion A38503, a display portion B38504, a recording medium (e.g., DVD) reading portion 38505, operating keys 38506, a speaker portion 38507, and the like. The display portion A38503 can mainly display image data, while the display portion B38504 can mainly display textual data. An image reproducing device which uses the display device of the invention for the display portions A38503 and B38504 can express bright colors.

Figure 38F:
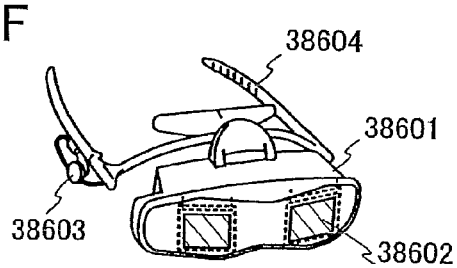

FIG. 38F shows a goggle display which includes a main body 38601, a display portion 38602, an earphone 38603, a temple 38604, and the like. A goggle display which uses the display device of the invention for the display portion 38602 can express bright colors.

Figure 38G:
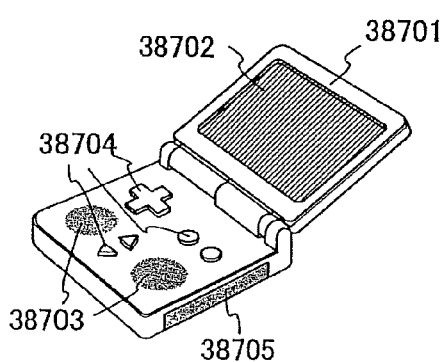

FIG. 38G shows a portable game machine which includes a housing 38701, a display portion 38702, speaker portions 38703, operating keys 38704, a recording medium insert portion 38705, and the like. A portable game machine which uses the display device of the invention for the display portion 38702 can express bright colors.

Figure 38H:
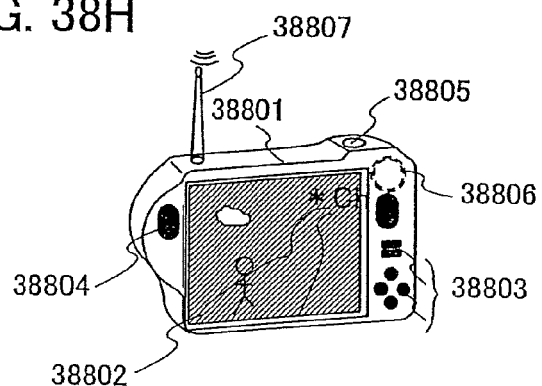

FIG. 38H shows a digital camera having a television receiving function, which includes a main body 38801, a display portion 38802, operating keys 38803, a speaker 38804, a shutter 38805, an image receiving portion 38806, an antenna 38807, and the like. A digital camera having a television receiving function which uses the display device of the invention for the display portion 38802 can express bright colors.

Such a multi-functional digital camera having a television receiving function is more frequently used for television reception and the like nowadays, and longer operating hours per charge is required.

For example, low power consumption can be achieved by forming a peripheral driver circuit in an IC chip using a CMOS and the like as shown in FIG. 31B or FIG. 32A.

In this manner, the invention can be applied to various electronic devices.

Note that this embodiment can be freely combined with the other embodiment modes or embodiments in this specification.

Embodiment 2

Figure 37:
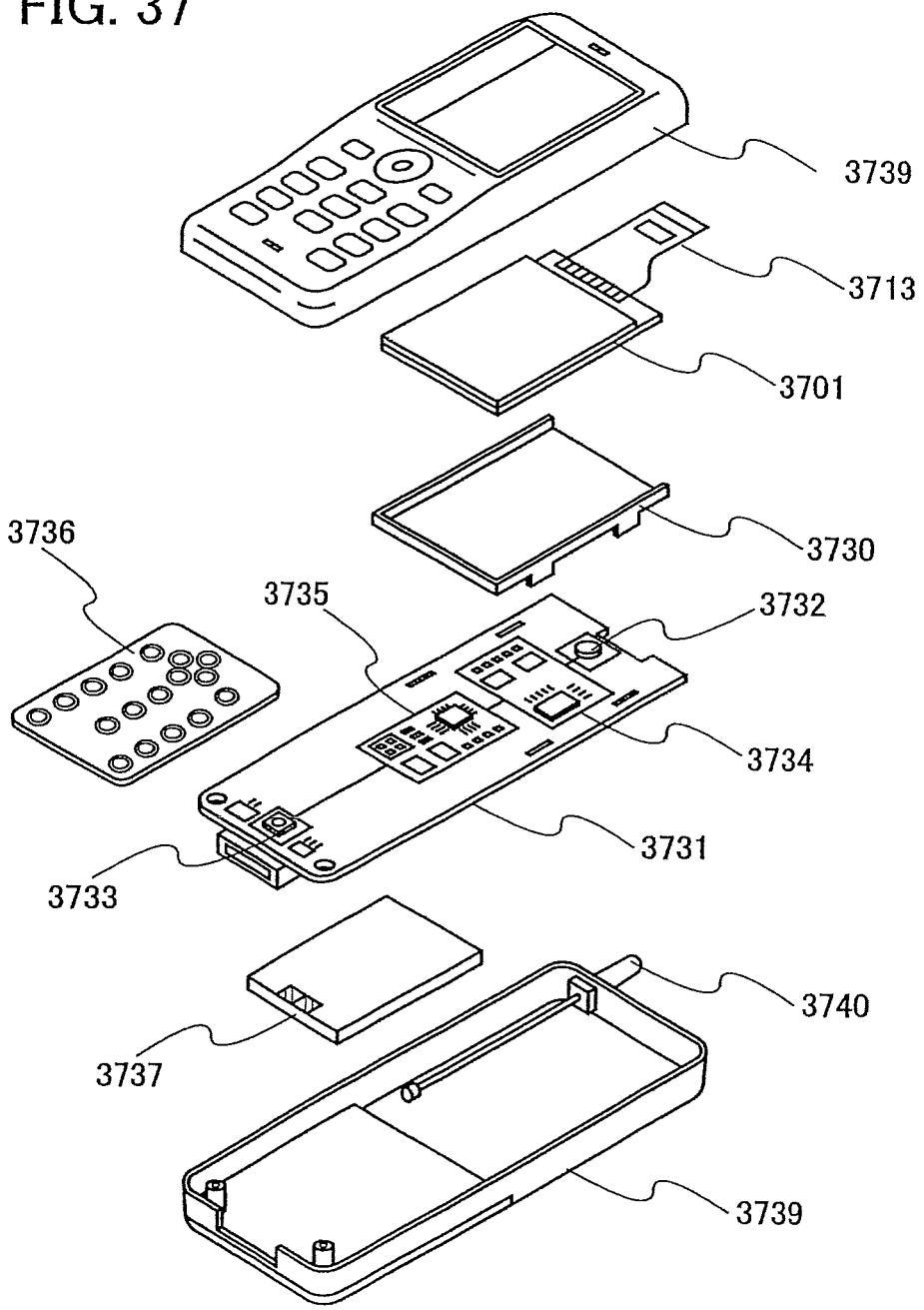
FIG. 37 is a view of an electronic device to which a display device of the invention applied.

In this embodiment, description is made of an exemplary structure of a mobile phone which has a display portion formed by using a display device with the pixel configuration of the invention, with reference to FIG. 37.

A display panel 3701 is incorporated into a housing 3730 in a freely attachable/detachable manner. The shape and size of the housing 3730 can be changed as appropriate in accordance with the size of the display panel 3710. The housing 3730 to which the display panel 3710 is fixed is fit into a printed wiring board 3731 so as to be assembled as a module.

The display panel 3701 is connected to the printed wiring board 3731 through an FPC 3713. A speaker 3732, a microphone 3733, a transmission/reception circuit 3734, and a signal processing circuit 3735 including a CPU, a controller, and the like are formed on the printed wiring board 3731. Such a module is combined with an input means 3736 and a battery 3737, and then incorporated into housings 3739. A pixel portion of the display panel 3701 is disposed so that it can be seen from an open window formed in the housing 3739.

The display panel 3701 may be constructed such that a part of peripheral driver circuits (e.g., a driver circuit having a low operating frequency among a plurality of driver circuits) is formed over the same substrate as a pixel portion by using TFTs, while another part of the peripheral driver circuits (a driver circuit having a high operating frequency among the plurality of driver circuits) is formed in an IC chip. Then, the IC chip may be mounted on the display panel 3701 by COG (Chip On Glass). Alternatively, the IC chip may be connected to a glass substrate by TAB (Tape Automated Bonding) or a printed wiring board. By employing such a structure, power consumption of a display device can be reduced and operating hours per charge of a mobile phone can be lengthened. Further, cost reduction of the mobile phone can be achieved.

In addition, the display device shown in the aforementioned embodiment can be applied to the pixel portion as appropriate.

For example, in order to further reduce power consumption, a structure as shown in FIG. 31B or FIG. 32A may be used, where a pixel portion is found over a substrate with TFTs, and all of the peripheral driver circuits are formed in IC chips to be mounted on the display panel by COG (Chip On Glass) or the like.

Note that the structure shown in this embodiment is only an exemplary mobile phone, and therefore, the display device of the invention can be applied to not only the mobile phone with the aforementioned structure but also mobile phones with various structures. In addition, by using the display device of the invention, bright colors can be expressed.

Embodiment 3

In this embodiment, description is made of an exemplary structure of an electronic device which has a display portion formed by using a display device with the pixel configuration of the invention, specifically a television receiver having an EL module.

Figure 33:
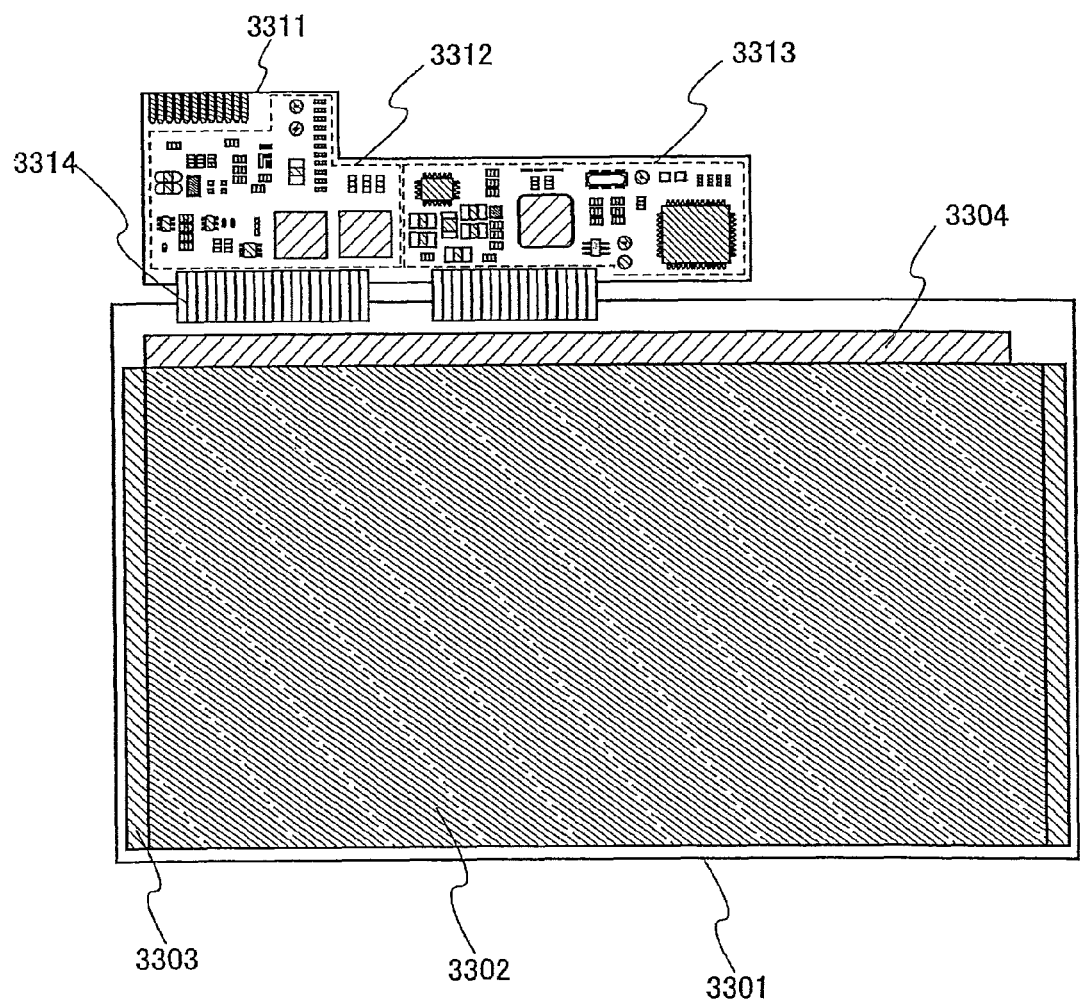
FIG. 33 is a view of an electronic device to which a display device of the invention can be applied.

FIG. 33 shows an EL module combining a display panel 3301 and a circuit board 3311. The display panel 3301 includes a pixel portion 3302, a scan line driver circuit 3303, and a signal line driver circuit 3304. A control circuit 3312, a signal dividing circuit 3313, and the like are formed over the circuit board 3311, for example. The display panel 3301 and the circuit board 3311 are connected with a connecting wire 3314. The connecting wire 3314 can be an FPC or the like.

The display panel 3301 may be constructed such that a part of peripheral driver circuits (e.g., a driver circuit having a low operating frequency among a plurality of driver circuits) is formed over the same substrate as a pixel portion by using TFTs, while another part of the peripheral driver circuits (a driver circuit having a high operating frequency among the plurality of driver circuits) is formed in an IC chip, so that the IC chip is mounted on the display panel 3301 by COG (Chip On Glass) or the like. Alternatively, the IC chip may be mounted on the display panel 3301 by TAB (Tape Automated Bonding) or a printed wiring board. Note that FIG. 30A shows an exemplary structure where a part of the peripheral driver circuits is formed over the same substrate as the pixel portion, while another part of the peripheral driver circuits is formed in an IC chip, so that the IC chip is mounted on the substrate by COG or the like.

In addition, the display device shown in the aforementioned embodiment modes can be employed as appropriate.

For example, in order to reduce power consumption, a pixel portion may be formed over a glass substrate with TFTs, while all of the peripheral driver circuits may be formed in IC chips to be mounted on the display panel by COG (Chip On Glass) or the like.

Figure 34:
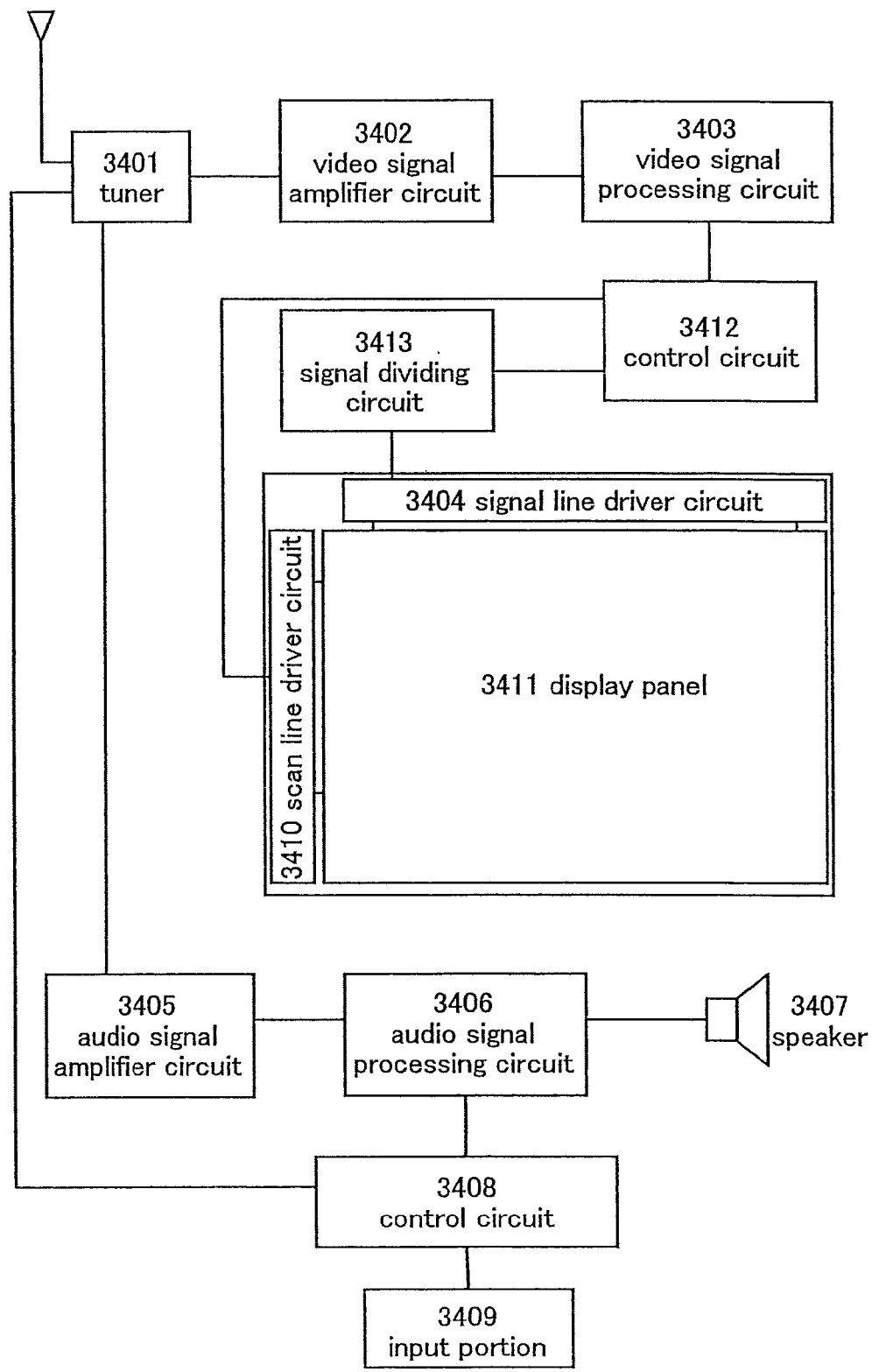
FIG. 34 is a view of an electronic device to which a display device of the invention can be applied.

With such an EL module, an EL television receiver can be completed. FIG. 34 is a block diagram showing the main configuration of an EL television receiver. A tuner 3401 receives video signals and audio signals. The video signals are processed by a video signal amplifier circuit 3402, a video signal processing circuit 3403 which converts a signal output from the video signal amplifier circuit 3402 into a color signal corresponding to each color of red, green, and blue, and a control circuit 3412 for converting the video signal to be input into a driver circuit. The control circuit 3412 outputs signals to each of a scan line driver circuit 3410 and a signal line driver circuit 3404. In the case of performing digital drive, a signal dividing circuit 3413 may be provided between the control circuit 3412 and the signal line driver circuit 3404, so that an input digital signal can be divided into m signals before being output to a display panel 3411.

Among the signals received at the tuner 3401, audio signals are transmitted to an audio signal amplifier circuit 3405, and an output thereof is supplied to a speaker 3407 through an audio signal processing circuit 3406. A control circuit 3408 receives control data on a receiving station (reception frequency) or sound volume from an input portion 3409 and transmits signals to the tuner 3401 as well as the audio signal processing circuit 3406.

Figure 35A:
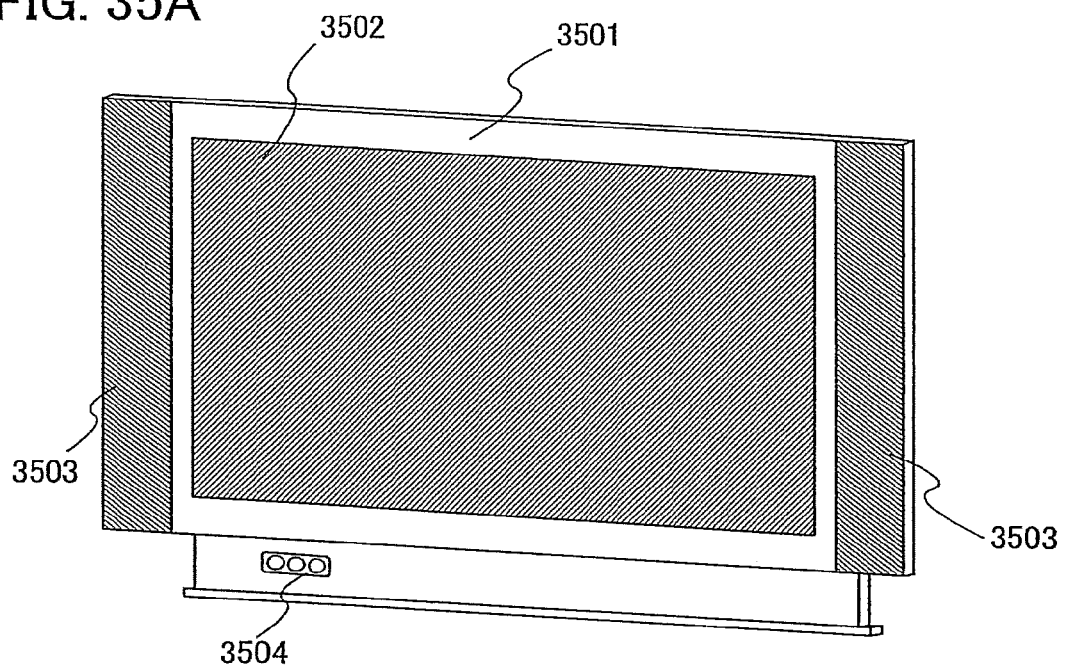
FIGS. 35A and 35B are views of electronic devices to which a display device of the invention can be applied.

FIG. 35A shows a television receiver incorporating an EL module of a different mode from FIG. 34. In FIG. 35A, a display screen 3502 is formed from an EL module. A housing 3501 is provided with a speaker 3503, operating switches 3504, and the like as appropriate.

Figure 35B:
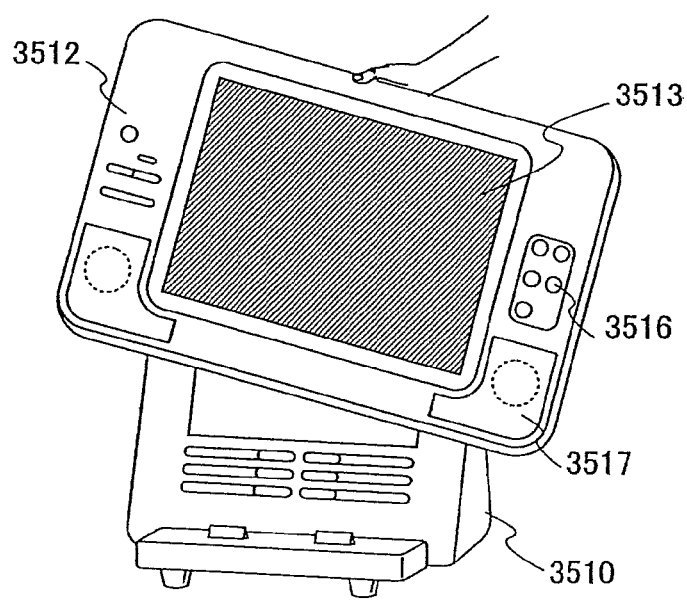

FIG. 35B shows a television receiver having a wireless and portable display. A housing 3512 incorporates a battery and a signal receiver, and the battery drives a display portion 3513 and a speaker portion 3517. The battery can be repeatedly charged with a battery charger 3510. In addition, the battery charger 3510 can transmit/receive video signals, and the video signals from the battery charger 3510 can be delivered to the signal receiver in the display. The housing 3512 is controlled with operating keys 3516. The device shown in FIG. 35B can also transmit signals from the housing 3512 to the battery charger 3510 by operating the operating key 3516; therefore, it can also be called a video/audio two-way communication device. Further, the device can also control communication with another electronic device by operating the operating keys 3516 such that signals are transmitted from the housing 3512 to the battery charger 3510, and another electronic device receives the signals that the battery charger 3510 can transmit. Therefore, the device can also be called a general-purpose remote control device. The invention can be applied to the display portion 3513.

Figure 36A:
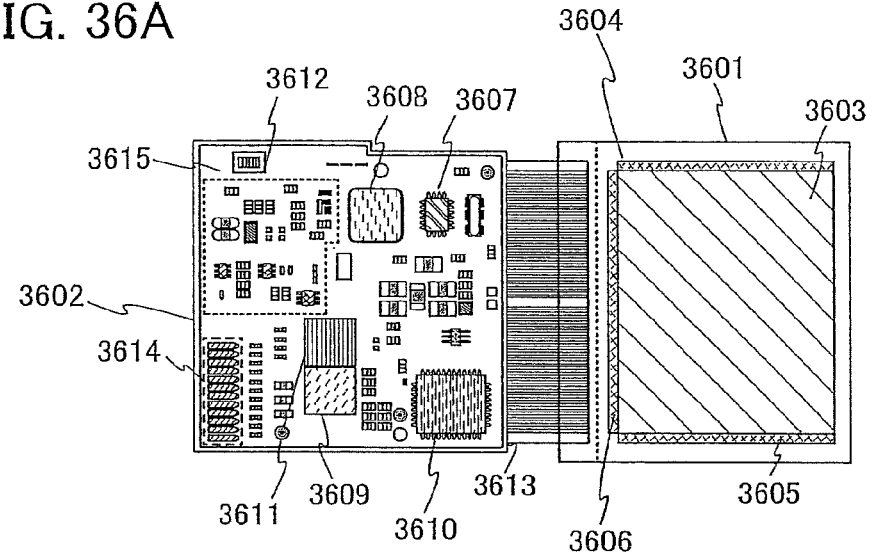
FIGS. 36A and 36B are views of electronic devices to which a display device of the invention applied.

FIG. 36A shows a module combining a display panel 3601 and a printed wiring board 3602. The display panel 3601 has a pixel portion 3603 where a plurality of pixels are provided, a first scan line driver circuit 3604, a second scan line driver circuit 3605, and a signal line driver circuit 3606 for supplying a video signal to a selected pixel.

The printed wiring board 3602 is provided with a controller 3607, a central processing unit (CPU) 3608, a memory 3609, a power supply circuit 3610, an audio processing circuit 3611, a transmission/reception circuit 3612, and the like. The printed wiring board 3602 and the display panel 3601 are connected through a flexible printed wiring board (FPC) 3613. The printed wiring board 3613 may be provided with a storage capacitor, a buffer circuit, and the like in order to prevent noise interruption on the power supply voltage or signals and also prevent dull signal rising. In addition, the controller 3607, the audio processing circuit 3611, the memory 3609, the CPU 3608, the power supply circuit 3610, and the like can be mounted on the display panel 3601 by COG (Chip On Glass). By using COG, a scale of the printed wiring board 3602 can be reduced.

Various control signals are input/output through an I/F portion 3614 (interface) provided on the printed wiring board 3602. In addition, an antenna port 3615 for transmitting/receiving signals to/from an antenna is provided on the printed wiring board 3602.

Figure 36B:
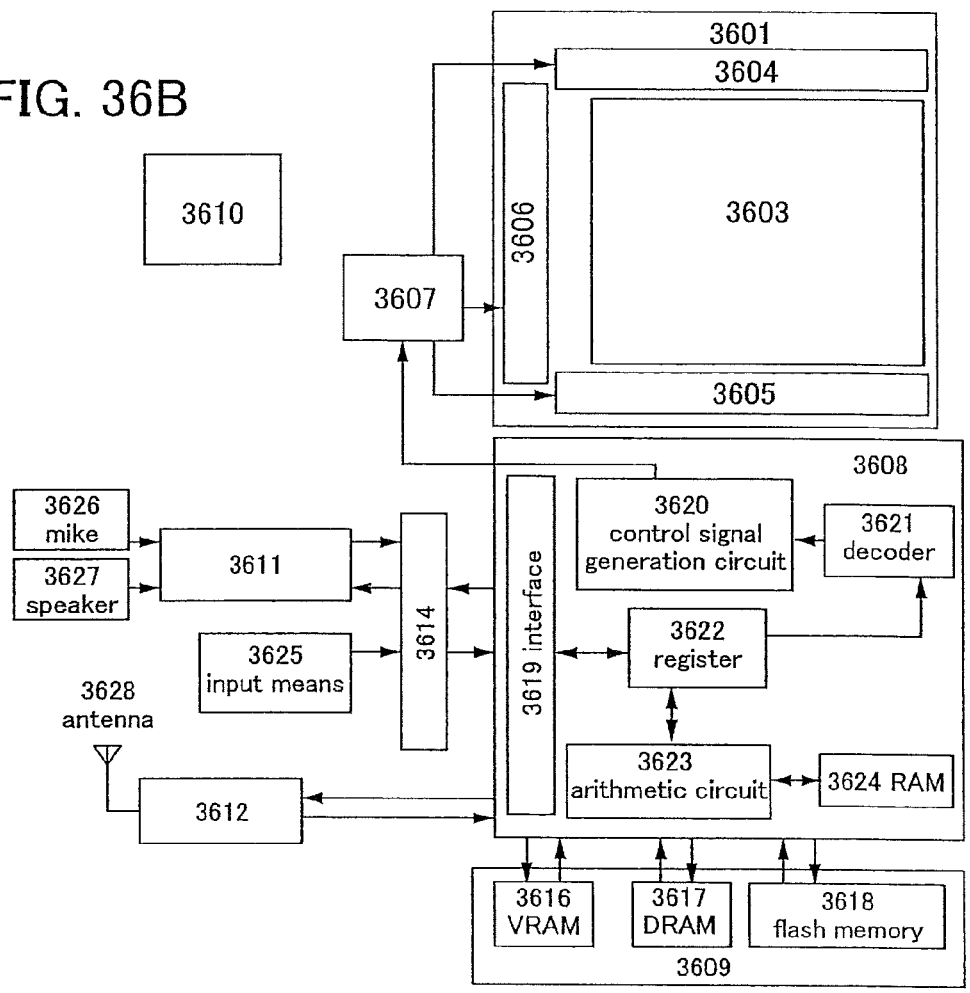

FIG. 36B is a block diagram of the module shown in FIG. 36A. This module includes a VRAM 3616, a DRAM 3617, a flash memory 3618, and the like as the memory 3609. The VRAM 3616 stores image data to be displayed on the panel; the DRAM 3617 stores image data or audio data, and the flash memory 3618 stores various programs.

The power supply circuit 3610 supplies power to operate the display panel 3601, the controller 3607, the CPU 3608, the audio processing circuit 3611, the memory 3609, and the transmission/reception circuit 3612. Depending on the specification of the panel, the power supply circuit 3610 may be provided with a current source.

The CPU 3608 includes a control signal generation circuit 3620, a decoder 3621, a register 3622, an arithmetic circuit 3623, a RAM 3624, an interface 3619 for the CPU 3608, and the like. Various signals input to the CPU 3608 through the interface 3619 are once stored in the register 3622 before being input to the arithmetic circuit 3623, the decoder 3621, and the like. The arithmetic circuit 3623 performs operation based on the signals input, and specifies an address for sending various instructions. On the other hand, signals input to the decoder 3621 are decoded, and then input to the control signal generation circuit 3620. The control signal generation circuit 3620 generates signals containing various instructions based on the signals input, and transmits the signals to an address specified by the arithmetic circuit 3623, specifically to the memory 3609, the transmission/reception circuit 3612, the audio processing circuit 3611, the controller 3607, and the like.

The memory 3609, the transmission/reception circuit 3612, the audio processing circuit 3611, and the controller 3607 operate in accordance with the respective instructions received. The operation is briefly described below.

Signals input from an input means 3625 are transmitted to the CPU 3608 mounted on the printed wiring board 3602 through the I/F portion 3614. The control signal generation circuit 3620 converts image data stored in the VRAM 3616 into a predetermined format in accordance with the signals transmitted from the input means 3625 which is a pointing device, a keyboard, or the like, and then transmits the data to the controller 3607.

The controller 3607 processes signals containing image data which are transmitted from the CPU 3608 in accordance with the specification of the panel, and then supplies the data to the display panel 3601. In addition, the controller 3607 generates Hsync signals, Vsync signals, clock signals CLK, AC voltage (AC Cont), and switching signals L/R based on the power supply voltage input from the power supply circuit 3610 and the various signals input from the CPU 3608, and supplies the signals to the display panel 3601.

The transmission/reception circuit 3612 processes signals which have been transmitted/received as electromagnetic waves at an antenna 3628, and specifically includes high frequency circuits such as an isolator, a bandpass filter, a VCO (Voltage Controlled Oscillator), an LPF (Low Pass Filter), a coupler, and a balun. Among signals transmitted/received to/from the transmission/reception circuit 3612, signals containing audio data are transmitted to the audio processing circuit 3611 in accordance with the instruction from the CPU 3608.

The signals containing audio data which are transmitted in accordance with the instruction from the CPU 3608 are demodulated into audio signals in the audio processing circuit 3611 and then transmitted to a speaker 3627. Audio signals transmitted from a microphone 3626 are modulated in the audio processing circuit 3611, and then transmitted to the transmission/reception circuit 3612 in accordance with the instruction from the CPU 3608.

The controller 3607, the CPU 3608, the power supply circuit 3610, the audio processing circuit 3611, and the memory 3609 can be integrated as a package of this embodiment.

Needless to say, the invention is not limited to a television receiver, and can be used for various applications such as a monitor of a personal computer, an information display board at the train station or airport, or a particularly large display medium such as an advertisement display board on the street. By using the display device of the invention, bright colors can be expressed.

Note that this embodiment can be freely combined with the other embodiment modes or embodiments in this specification.

Embodiment 4

In this embodiment, description is made of application examples of a display panel which has the display device of the invention as a display portion, with reference to the drawings. A display panel which has the display device of the invention as a display portion can be incorporated in a moving object, a building, or the like.

Figure 55A:
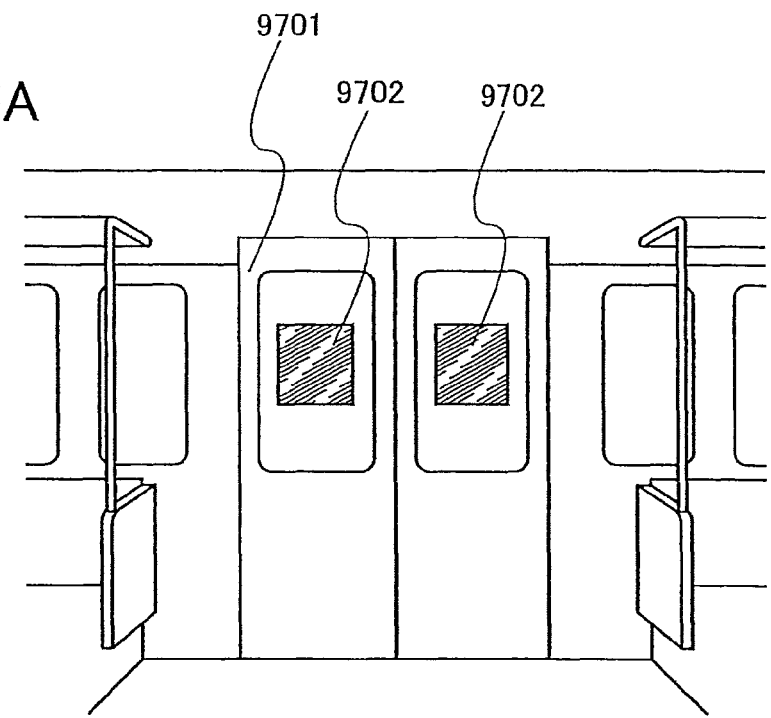
FIGS. 55A and 55B are views showing application examples of an electronic device in the invention.
Figure 55B:
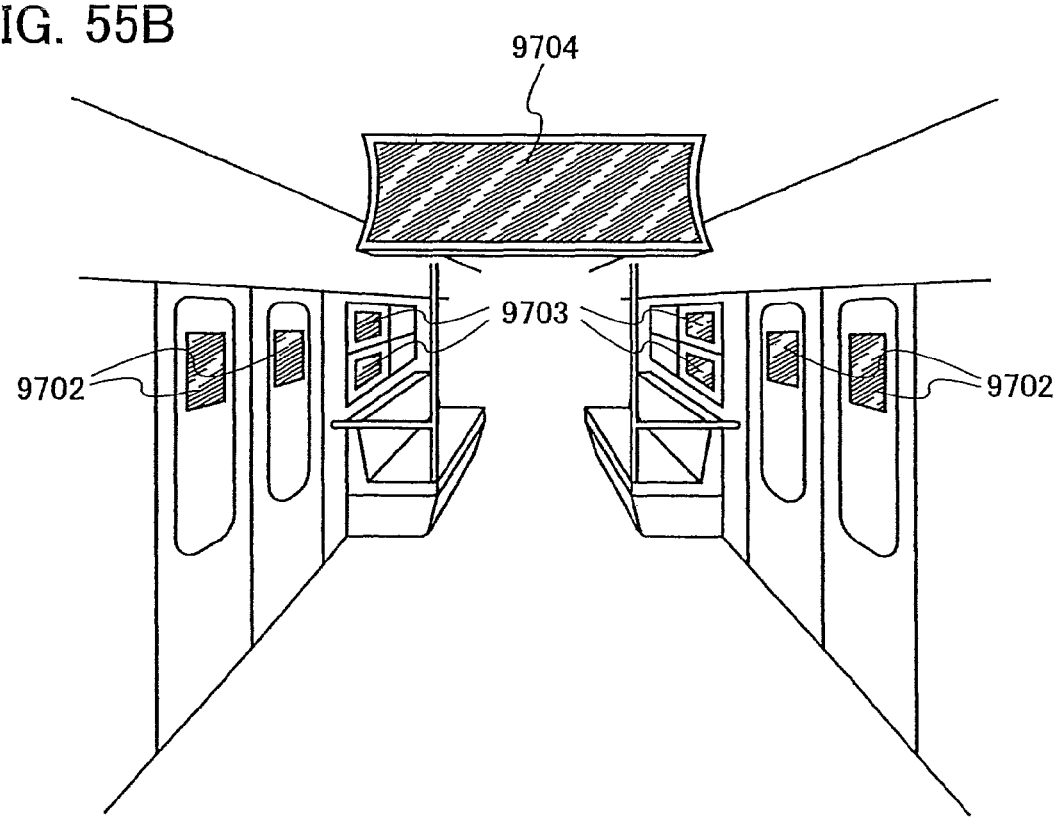

FIGS. 55A and 55B each show a moving object incorporating a display device, as an exemplary display panel which has the display device of the invention as a display portion. FIG. 55A shows a display panel 9702 which is attached to a glass door in a train car body 9701, as an exemplary moving object incorporating a display device. The display panel 9702 shown in FIG. 55A which has the display device of the invention as a display portion can easily switch images displayed on the display portion in response to external signals. Therefore, images on the display panel can be periodically switched in accordance with the time cycle through which passengers' ages or sex vary, thereby more efficient advertising effect can be expected.

Note that the position for setting a display panel which has the display device of the invention as a display portion is not limited to a glass door of a train car body as shown in FIG. 55A, and thus a display panel can be applied to anywhere by changing the shape of the display panel. FIG. 55B shows an example thereof.

FIG. 55B shows an interior view of a train car body. In FIG. 55B, display panels 9703 attached to glass windows and a display panel 9704 hung on the ceiling are shown in addition to the display panels 9702 attached to the glass doors shown in FIG. 55A. The display panels 9703 each having the display device of the invention as a display portion has self-luminous display elements. Therefore, by displaying images for advertisement in rush hours, while displaying no images in off-peak hours, outside views can be seen from the train windows. In addition, the display panel 9704 having the display device of the invention as a display portion can be flexibly bent by providing switching elements such as organic transistors over a substrate in a film form, and images can be displayed on the display panel 9704 by driving self-luminous display elements.

Another example where a display panel having the display device of the invention as a display portion is applied to a moving object incorporating a display device is described with reference to FIG. 56.

Figure 56:
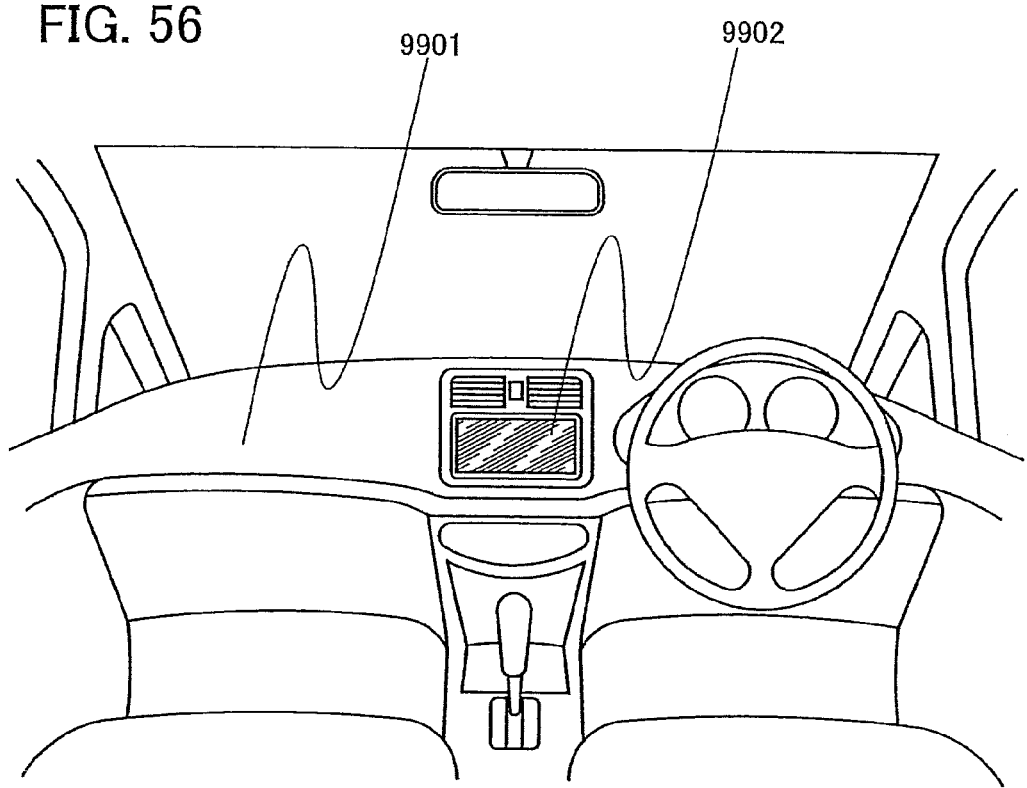
FIG. 56 is a view showing an application example of an electronic device in the invention.

FIG. 56 shows a moving object incorporating a display device, as an exemplary display panel which has the display device of the invention as a display portion. FIG. 56 shows a display panel 9901 which is incorporated in a body 9902 of a car, as an exemplary moving object incorporating a display device. The display panel 9901 having the display device of the invention as a display portion shown in FIG. 56 is incorporated in a body of a car, and displays information on the operation of the car or information input from outside of the car on an on-demand basis. Further, it has a navigation function to a destination of the car.

Note that the position for setting a display panel which has the display device of the invention as a display portion is not limited to a front portion of a car body as shown in FIG. 56, and thus a display panel can be applied to anywhere such as glass windows or doors by changing the shape of the display panel.

Another example where a display panel having the display device of the invention as a display portion is applied to a moving object incorporating a display device is described with reference to FIGS. 57A and 57B.

Figure 57A:
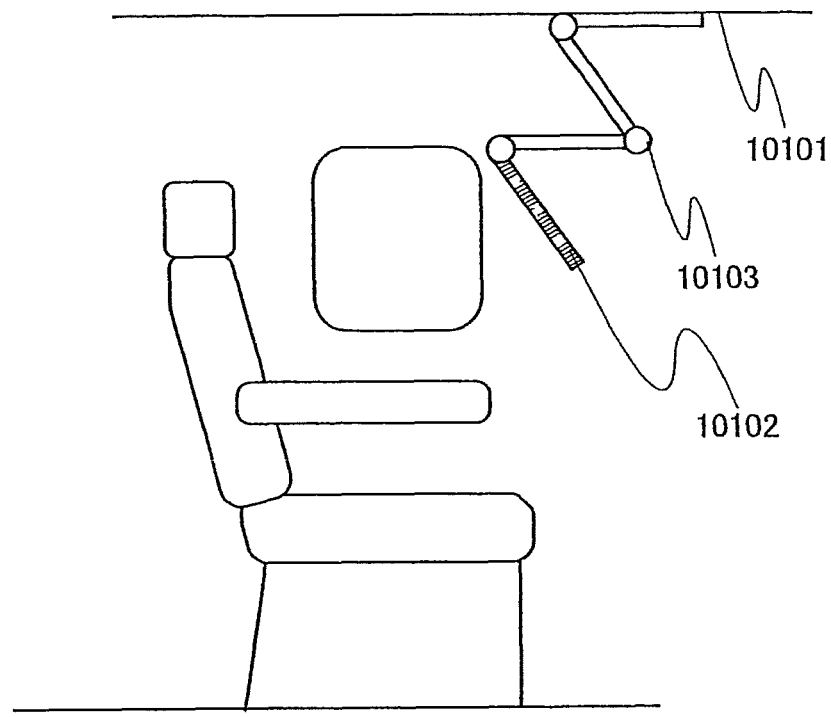
FIGS. 57A and 57B are views showing application examples of an electronic device in the invention.
Figure 57B:
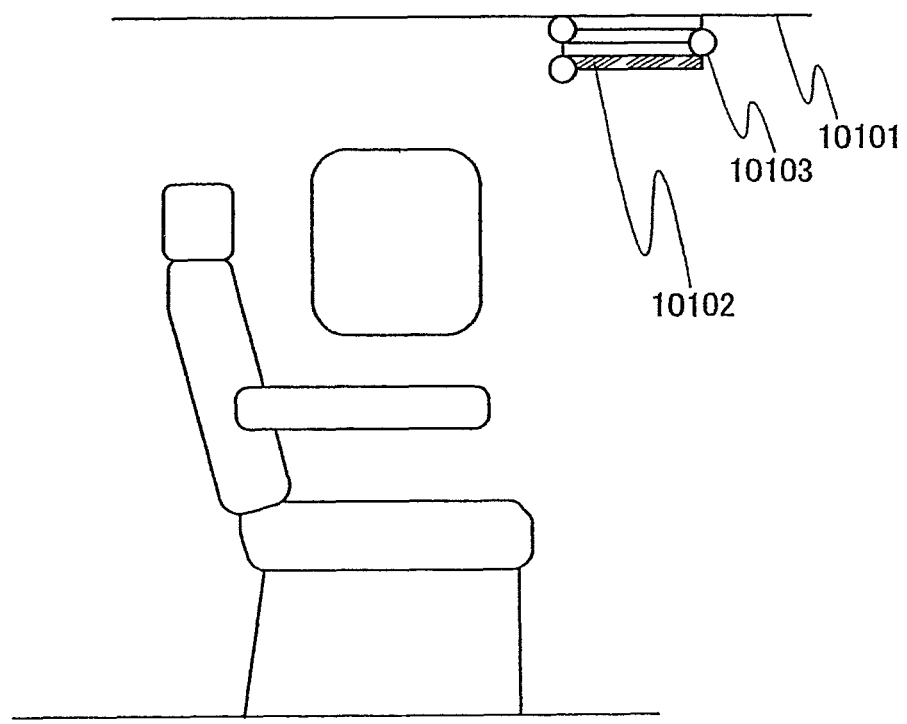

FIGS. 57A and 57B each show a moving object incorporating a display device, as an exemplary display panel which has the display device of the invention as a display portion. FIG. 57A shows a display panel 10102 which is incorporated in a part of the ceiling above the passenger's seat inside an airplane body 10101, as an exemplary moving object incorporating a display device. The display panel 10102 shown in FIG. 57A which has the display device of the invention as a display portion is fixed on the airplane body 10101 with a binge portion 10103, so that passengers can see the display panel 10102 with the help of a telescopic motion of the hinge portion 10103. The display panel 10102 has a function of displaying information as well as a function of an advertisement or amusement means with the operation of passengers. In addition, by storing the display panel 10102 in the airplane body 10101 by folding the hinge portion 10103 as shown in FIG. 57B, safety during the airplane's takeoff and landing can be secured. Note that by lighting display elements of the display panel in an emergency, the display panel can be also utilized as a guide light.

Note that the position for setting a display panel which has the display device of the invention as a display portion is not limited to the ceiling of the airplane body 10101, and thus a display panel can be applied to anywhere such as seats or doors by changing the shape of the display panel. For example, the display panel may be set on the backside of a seat so that a passenger on the rear seat can operate and view the display panel.

Although this embodiment has illustrated a train car body, a car body, and an airplane body as exemplary moving objects, the invention is not limited to these, and can be applied to motorbikes, four-wheeled vehicles (including cars, buses, and the like), trains (including monorails, railroads, and the like), ships and vessels, and the like. By employing a display panel having the display device of the invention, downsizing and power saving of a display panel can be achieved, as well as a moving object having a display medium with an excellent operation can be provided. In addition, since images displayed on a plurality of display panels incorporated in a moving object can be switched all at once, in particular, the invention is quite advantageous to be applied to advertising media for unspecified number of customers, or information display boards in an emergency.

An example where a display panel having the display device of the invention as a display portion is applied to a structure is described with reference to FIG. 58.

Figure 58:
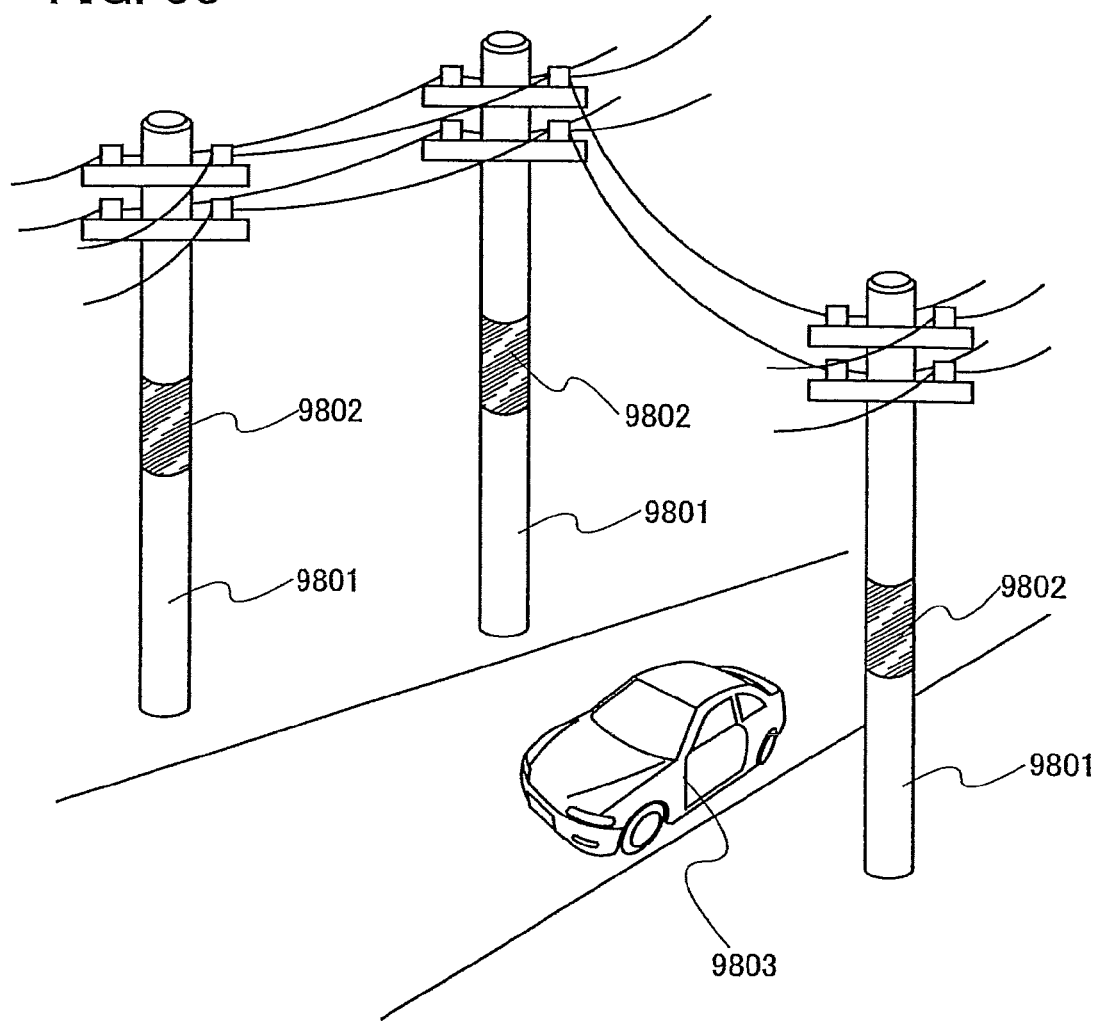
FIG. 58 is a view showing an application example of an electronic device in the invention.

FIG. 58 illustrates an example where a flexible display panel capable of displaying images is realized by providing switching elements such as organic transistors over a substrate in a film form, and driving self-luminous display elements, as an exemplary display panel having the display device of the invention as a display portion. In FIG. 58, a display panel is provided on a curved surface of an outside columnar object such as a telephone pole as a structure, and specifically, shown here is a structure where display panels 9802 are attached to telephone poles 9801 which are columnar objects.

The display panels 9802 shown in FIG. 58 are positioned at about a half height of the telephone poles, so as to be higher than the eye level of humans. When the display panels are viewed from a moving object 9803, images on the display panels 9802 can be recognized. By displaying the same images on the display panels 9802 provided on the telephone poles standing together in large numbers, such as outside telephone poles, viewers can recognize the displayed information or advertisement. The display panels 9802 provided on the telephone poles 9801 in FIG. 58 can easily display the same images by using external signals; therefore, quite effective information display and advertising effects can be expected. In addition, since self-luminous display elements are provided as display elements in the display panel of the invention, it can be effectively used as a highly visible display medium even at night.

Another example where a display panel having the display device of the invention as a display portion is applied to a structure is described with reference to FIG. 59, which differs from FIG. 58.

Figure 59:
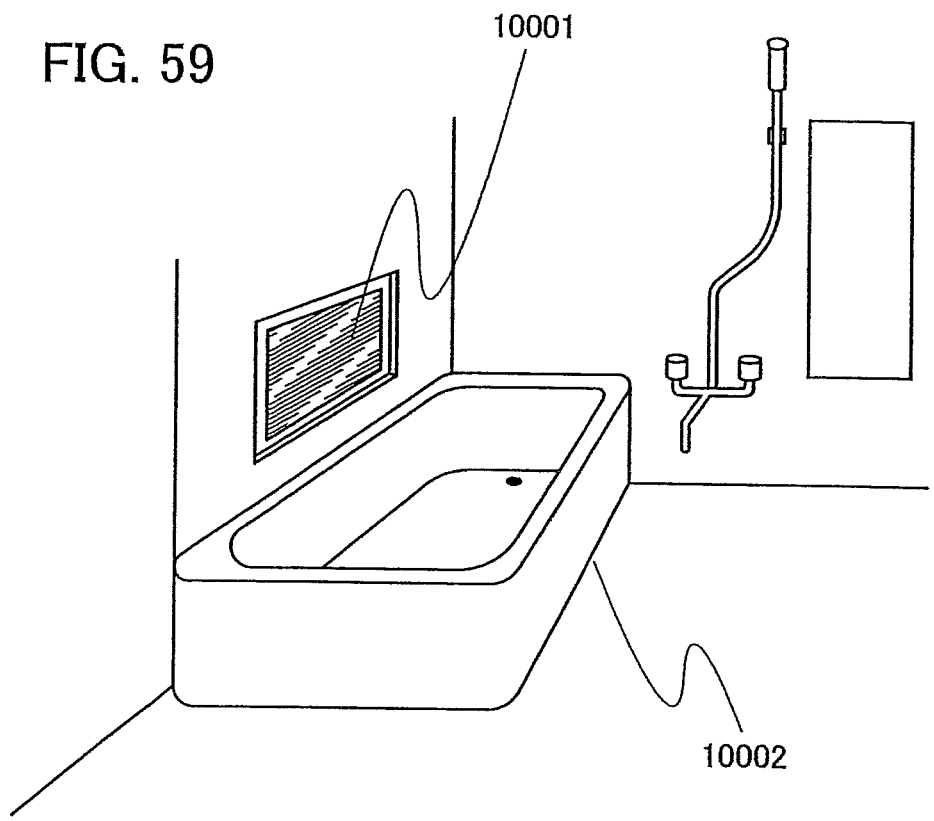
FIG. 59 is a view showing an application example of an electronic device in the invention.

FIG. 59 shows another application example of a display panel which has the display device of the invention as a display portion. In FIG. 59, an example of a display panel 10001 which is incorporated in the sidewall of a prefabricated bath unit 10002 is shown. The display panel 10001 shown in FIG. 59 which has the display device of the invention as a display portion is incorporated in the prefabricated bath unit 10002, so that a bather can view the display panel 10001. The display panel 10001 has a function of displaying information as well as a function of an advertisement or amusement means with the operation of a bather.

The position for setting a display panel which has the display device of the invention as a display portion is not limited to the sidewall of the prefabricated bath unit 10002 shown in FIG. 59, and thus a display panel can be applied to anywhere by changing the shape of the display panel, such that it can be incorporated in a part of a mirror or a bathtub.

Figure 60:
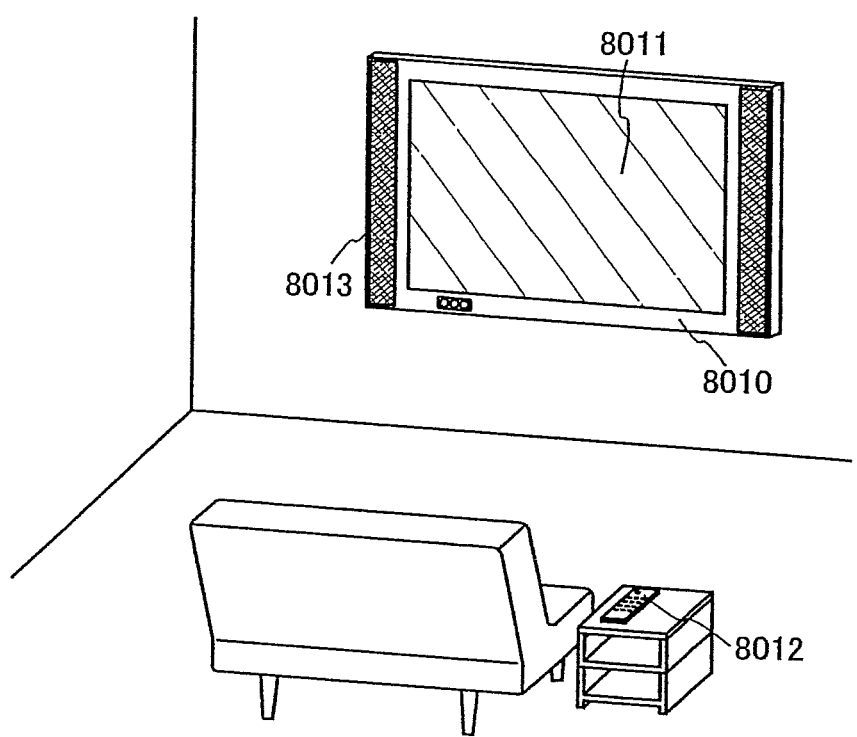
FIG. 60 is a view showing an application example of an electronic device in the invention.

FIG. 60 shows an example where a television set having a large display portion is provided in a building. FIG. 60 includes a housing 8010, a display portion 8011, a remote controlling device 8012 which is an operating portion, a speaker portion 8013, and the like. A display panel having the display device of the invention as a display portion is applied to the manufacturing of the display portion 8011. The television set in FIG. 60 is incorporated in a building as a wall-hanging television set, and can be set without requiring a large space.

Although this embodiment has illustrated a telephone pole, a prefabricated bath unit, an inner side of a building, and the like as exemplary structures, this embodiment is not limited to these, and can be applied to any structures which can incorporate a display device. By using the display device of the invention for a display panel, a structure having a display medium which can express bright colors can be provided.

Note that this embodiment can be freely combined with the other embodiment modes or embodiments in this specification.

The present application is based on Japanese Priority application No. 2005-288373 filed on Sep. 30, 2005 with the Japanese Patent Office, the entire contents of which are hereby incorporated by reference.

What is claimed is:

1. A display device comprising:
   a substrate; and
   a plurality of pixels over the substrate, the plurality of pixels comprising:
      a first pixel comprising a transistor and a light-emitting element, the light-emitting element having a chromaticity whose x-coordinate in a CIE-XY chromaticity diagram is 0.50 or more;
      a second pixel and a third pixel each comprising a transistor and a light-emitting element, the light-emitting element having a chromaticity whose y-coordinate in the CIE-XY chromaticity diagram is 0.55 or more;
      a fourth pixel and a fifth pixel each comprising a transistor and a light-emitting element, the light-emitting element having a chromaticity whose x-coordinate and y-coordinate in the CIE-XY chromaticity diagram are 0.20 or less and 0.25 or less, respectively; and
      a sixth pixel configured to emit white light,
   wherein the transistor in each of the first to sixth pixels comprises an oxide semiconductor,
   wherein the first pixel, the second pixel and the fourth pixel are arranged in a first row,
   wherein the sixth pixel is arranged in a second row,
   wherein the third pixel and the fifth pixel are arranged in a third row,
   wherein the first row is adjacent to the second row,
   wherein the second row is adjacent to the third row,
   wherein the light-emitting elements provided in the fourth pixel and the fifth pixel have different thickness from each other,
   wherein the fourth pixel and the fifth pixel have different emission spectrums, and
   wherein a shape of each of the first to fifth pixels comprises a curvature.

2. The display device according to claim 1, wherein the fourth pixel and the fifth pixel emit light with colors of different coordinates in the CIE-XY chromaticity diagram.

3. The display device according to claim 1, wherein the fourth pixel and the fifth pixel have light-emitting regions with different area dimensions from each other.

4. The display device according to claim 1, wherein the light-emitting element is an electroluminescence element.

5. The display device according to claim 1, wherein the substrate is a flexible substrate.

6. An electronic device comprising the display device according to claim 1, wherein the electronic device is selected from the group consisting of a video camera, a digital camera, a goggle display, a navigation system, an audio reproducing device, a computer, a game machine, a mobile computer, a mobile phone, a portable game machine, an electronic book, and an image reproducing device.

7. A display module comprising the display device according to claim 1, comprising at least one of an FPC and a housing.

8. An electronic device comprising the display module according to claim 7, comprising at least one of a display portion, a battery, an antenna, a speaker and an operating key.

9. A display device comprising:
   a substrate; and
   a plurality of pixels over the substrate, the plurality of pixels comprising:
      a first pixel comprising a transistor and a light-emitting element, the light-emitting element having a chromaticity whose x-coordinate and y-coordinate in a CIE-XY chromaticity diagram are 0.6 or more and 0.35 or less, respectively;
      a second pixel comprising a transistor and a light-emitting element, the light-emitting element having a chromaticity whose x-coordinate and y-coordinate in the CIE-XY chromaticity diagram are 0.3 or less and 0.6 or more, respectively;
      a third pixel and a fourth pixel each comprising a transistor and a light-emitting element, the light-emitting element having a chromaticity whose x-coordinate and y-coordinate in the CIE-XY chromaticity diagram are 0.15 or less and 0.2 or less, respectively; and
      a fifth pixel configured to emit white light,
   wherein the transistor in each of the first to fifth pixels comprises an oxide semiconductor,
   wherein the first pixel, the second pixel and the third pixel are arranged in a first row,
   wherein the fifth pixel is arranged in a second row,
   wherein the fourth pixel is arranged in a third row,
   wherein the first row is adjacent to the second row,
   wherein the second row is adjacent to the third row,
   wherein the light-emitting elements provided in the third pixel and the fourth pixel have different thickness from each other,
   wherein the third pixel and the fourth pixel have different emission spectrums, and
   wherein a shape of each of the first to fourth pixels comprises a curvature.

10. The display device according to claim 9, wherein the third pixel and the fourth pixel emit light with colors of different coordinates in the CIE-XY chromaticity diagram.

11. The display device according to claim 9, wherein the third pixel and the fourth pixel have light-emitting regions with different area dimensions from each other.

12. The display device according to claim 9, wherein the light-emitting element is an electroluminescence element.

13. The display device according to claim 9, wherein the substrate is a flexible substrate.

14. An electronic device comprising the display device according to claim 9, wherein the electronic device is selected from the group consisting of a video camera, a digital camera, a goggle display, a navigation system, an audio reproducing device, a computer, a game machine, a mobile computer, a mobile phone, a portable game machine, an electronic book, and an image reproducing device.

15. A display module comprising the display device according to claim 9, comprising at least one of an FPC and a housing.

16. An electronic device comprising the display module according to claim 15, comprising at least one of a display portion, a battery, an antenna, a speaker and an operating key.

\* \* \* \* \*